US012142630B2

(12) United States Patent
Hsieh et al.

(10) Patent No.: US 12,142,630 B2
(45) Date of Patent: Nov. 12, 2024

(54) VERTICALLY ARRANGED SEMICONDUCTOR PIXEL SENSOR

(71) Applicant: Taiwan Semiconductor Manufacturing Company Limited, Hsinchu (TW)

(72) Inventors: Feng-Chien Hsieh, Pingtung (TW); Yun-Wei Cheng, Taipei (TW); Kuo-Cheng Lee, Tainan (TW); Cheng-Ming Wu, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 289 days.

(21) Appl. No.: 17/249,485

(22) Filed: Mar. 3, 2021

(65) Prior Publication Data
US 2022/0285424 A1    Sep. 8, 2022

(51) Int. Cl.
*H01L 27/148*    (2006.01)
*H01L 27/146*    (2006.01)

(52) U.S. Cl.
CPC .. *H01L 27/14831* (2013.01); *H01L 27/14612* (2013.01); *H01L 27/1463* (2013.01); *H01L 27/14643* (2013.01); *H01L 27/14689* (2013.01)

(58) Field of Classification Search
CPC ......... H01L 27/14831; H01L 27/14612; H01L 27/1463; H01L 27/14643; H01L 27/14689
See application file for complete search history.

(56) References Cited

U.S. PATENT DOCUMENTS

| | | | | |
|---|---|---|---|---|
| 2018/0220086 A1* | 8/2018 | Hynecek | ............... | H04N 25/75 |
| 2019/0371845 A1* | 12/2019 | Chen | ................... | H01L 27/1461 |
| 2021/0327932 A1* | 10/2021 | Hsieh | ................ | H01L 27/14627 |

FOREIGN PATENT DOCUMENTS

CN    101609837 A  *  12/2009  .......... H01L 27/146

* cited by examiner

*Primary Examiner* — Jay C Kim
*Assistant Examiner* — Woo K Lee
(74) *Attorney, Agent, or Firm* — Harrity & Harrity, LLP

(57) ABSTRACT

A pixel sensor may include a vertically arranged (or vertically stacked) photodiode region and floating diffusion region. The vertical arrangement permits the photodiode region to occupy a larger area of a pixel sensor of a given size relative to a horizontal arrangement, which increases the area in which the photodiode region can collect photons. This increases performance of the pixel sensor and permits the overall size of the pixel sensor to be reduced. Moreover, the transfer gate may surround at least a portion of the floating diffusion region and the photodiode region, which provides a larger gate switching area relative to a horizontal arrangement. The increased gate switching area may provide greater control over the transfer of the photocurrent and/or may reduce switching delay for the pixel sensor.

20 Claims, 39 Drawing Sheets

VERTICALLY ARRANGED SEMICONDUCTOR PIXEL SENSOR

BACKGROUND

A complementary metal oxide semiconductor (CMOS) image sensor may include a plurality of pixel sensors. A pixel sensor of the CMOS image sensor may include a photodiode region configured to convert photons of incident light into a photocurrent of electrons, a transfer gate configured to control the flow of the photocurrent between the photodiode region and a floating diffusion region, and a drain region in the floating diffusion region configured to receive the photocurrent such that the photocurrent can be measured and/or transferred to other areas of the CMOS image sensor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
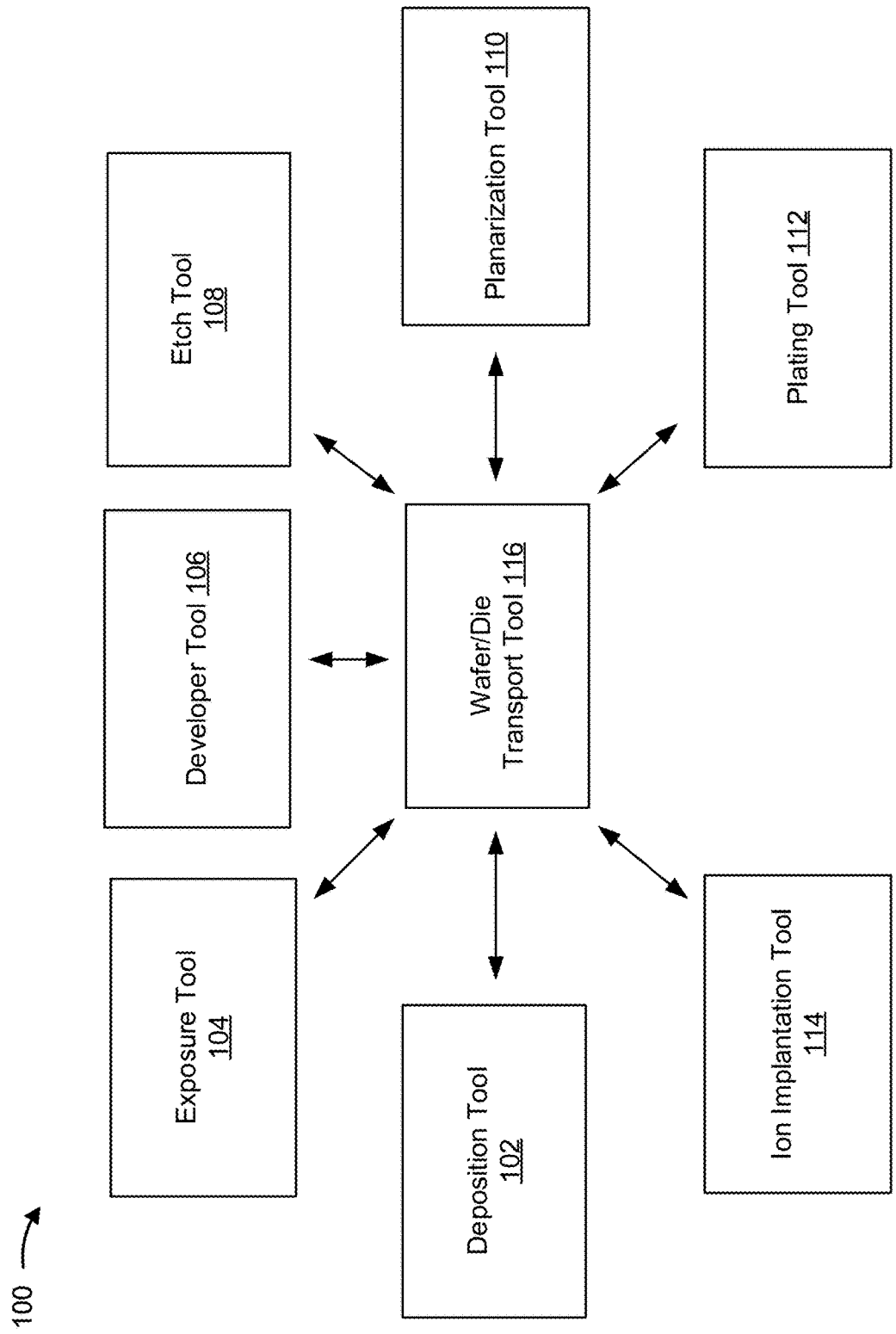
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "cupper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a photodiode region and a floating diffusion region of a pixel sensor may be arranged in a horizontal manner, in which the photodiode region and the floating diffusion region are horizontally adjacent. The photodiode region and the floating diffusion region may be separated by a region in a doped substrate (e.g., p-doped substrate) through which a transfer gate may control the transfer of a photocurrent from the photodiode region to the floating diffusion region. As pixel sensor sizes continue to shrink, the horizontal arrangement of the photodiode region and the floating diffusion region may result in a reduction in the size of the photodiode region. This can result in fewer photons being collected by the photodiode and thus, reduced light sensitivity.

Some implementations described herein provide pixel sensors that include a vertically arranged (or vertically stacked) photodiode region and floating diffusion region. The vertical arrangement permits the photodiode region to occupy a larger area of a pixel sensor of a given size (e.g., a 2-micron pixel sensor) relative to a horizontal arrangement, which increases the area in which the photodiode region can collect photons. This increases performance of the pixel sensor and permits the overall size of the pixel sensor to be reduced. Moreover, the transfer gate may surround at least a portion of the floating diffusion region and the photodiode region, which provides a larger gate switching area relative to a horizontal arrangement. The increased gate switching area may provide greater control over the transfer of the photocurrent and/or may reduce switching delay for the pixel sensor.

FIG. 1 is a diagram of an example environment 100 in which systems and/or methods described herein may be implemented. As shown in FIG. 1, environment 100 may include a plurality of semiconductor processing tools 102-114 and a wafer/die transport tool 116. The plurality of semiconductor processing tools 102-114 may include a deposition tool 102, an exposure tool 104, a developer tool 106, an etch tool 108, a planarization tool 110, a plating tool 112, an ion implantation tool 114, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch technique or a plasma-assisted etch technique, which may involve using an ionized gas to isotropically or directionally etch the one or more portions.

The planarization tool 110 is a semiconductor processing tool that is capable of polishing or planarizing various layers of a wafer or semiconductor device. For example, the planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The ion implantation tool 114 is a semiconductor processing tool that is capable of implanting ions into a substrate. The ion implantation tool 114 may generate ions in an arc chamber from a source material such as a gas or a solid. The source material may be provided into the arc chamber, and an arc voltage is discharged between a cathode and an anode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

Wafer/die transport tool 116 includes a mobile robot, a robot arm, a tram or rail car, and/or another type of device that is used to transport wafers and/or dies between semiconductor processing tools 102-114 and/or to and from other locations such as a wafer rack, a storage room, and/or the like. In some implementations, wafer/die transport tool 116 may be a programmed device that is configured to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
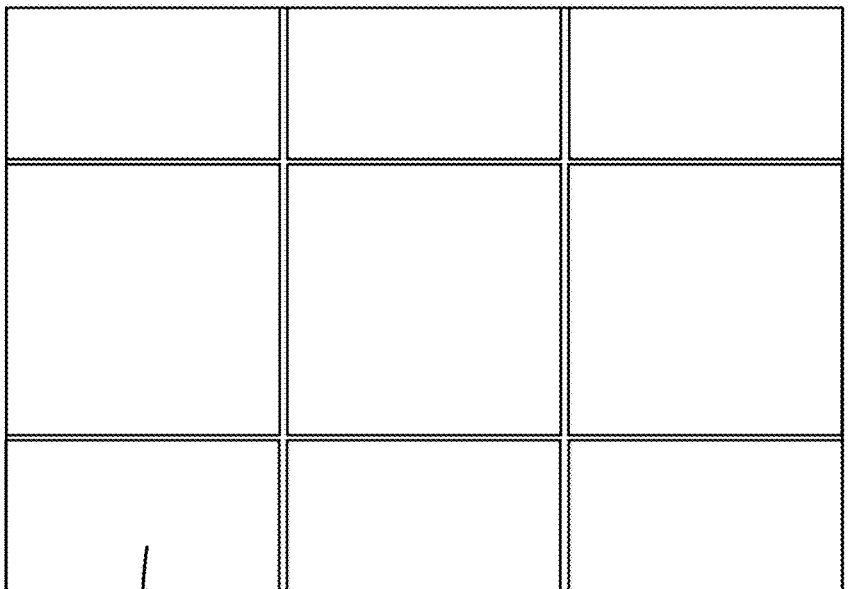
FIGS. 2 and 3 are diagrams of example pixel arrays described herein.

FIG. 2 is a diagram of an example pixel array 200 (or a portion thereof) described herein. The pixel array 200 may be included in an image sensor, such as a complementary metal oxide semiconductor (CMOS) image sensor, a back side illuminated (BSI) CMOS image sensor, or another type of image sensor.

FIG. 2 shows a top-down view of the pixel array 200. As shown in FIG. 2, the pixel array 200 may include a plurality of pixel sensors 202. As further shown in FIG. 2, the pixel sensors 202 may be arranged in a grid. In some implementations, the pixel sensors 202 are square-shaped (as shown in the example in FIG. 2). In some implementations, the pixel sensors 202 include other shapes such as circle shapes, octagon shapes, diamond shapes, and/or other shapes.

The pixel sensors 202 may be configured to sense and/or accumulate incident light (e.g., light directed toward the pixel array 200). For example, a pixel sensor 202 may absorb and accumulate photons of the incident light in a photodiode. The accumulation of photons in the photodiode may generate a charge representing the intensity or brightness of the incident light (e.g., a greater amount of charge may correspond to a greater intensity or brightness, and a lower amount of charge may correspond to a lower intensity or brightness).

The pixel array 200 may be electrically connected to a back-end-of-line (BEOL) metallization stack (not shown) of the image sensor. The BEOL metallization stack may electrically connect the pixel array 200 to control circuitry that may be used to measure the accumulation of incident light in the pixel sensors 202 and convert the measurements to an electrical signal.

As indicated above, FIG. 2 is provided as an example. Other examples may differ from what is described with regard to FIG. 2.

Figure 3:
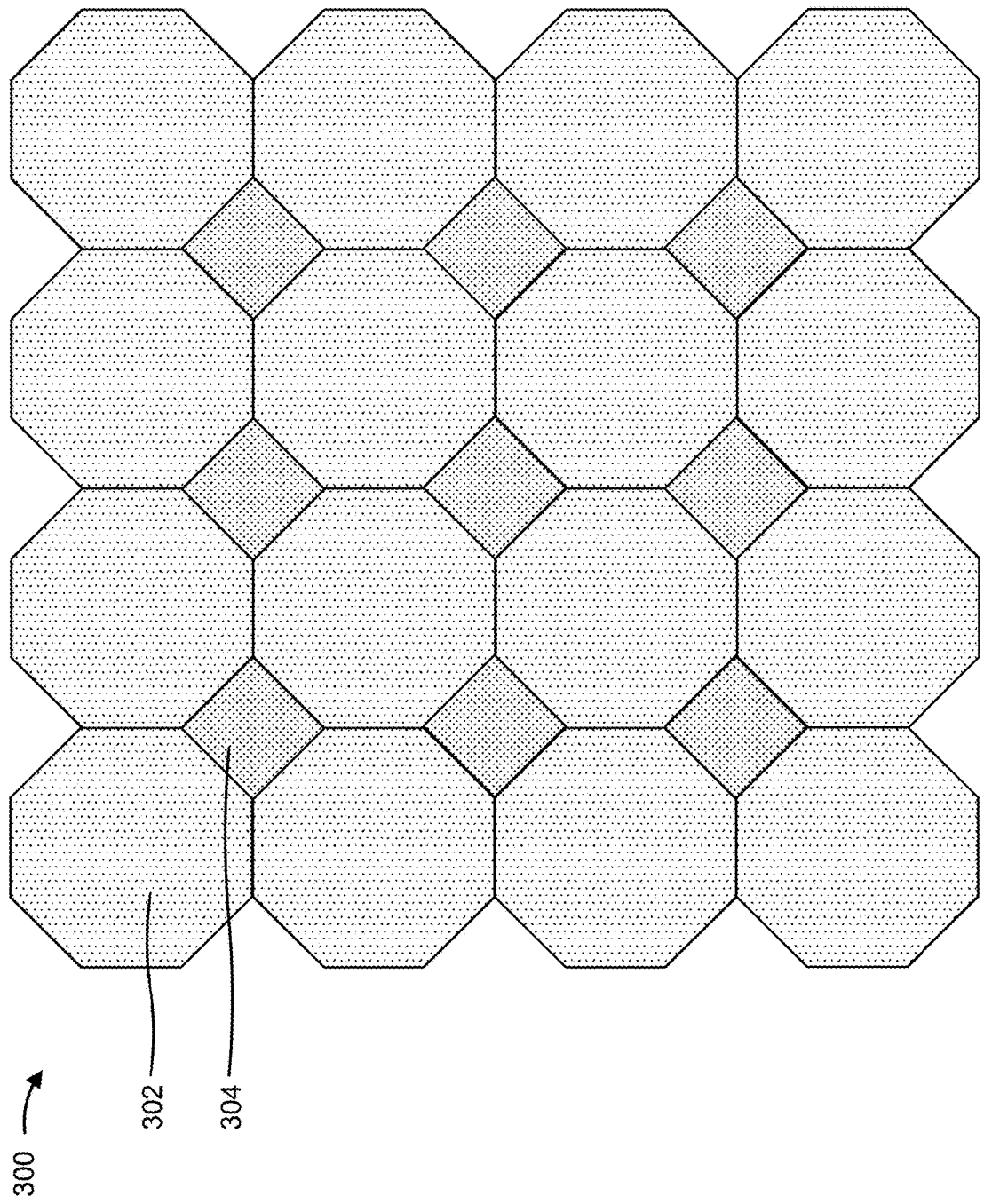

FIG. 3 is a diagram of an example pixel array 300 described herein. In some implementations, the pixel array 300 may be included in an image sensor. The image sensor may be a CMOS image sensor, a BSI CMOS image sensor, or another type of image sensor. As shown in FIG. 3, the pixel array 300 may include a plurality of octagon-shaped pixel sensors 302 and a plurality of square-shaped pixel sensors 304. The octagon-shaped pixel sensors 302 and the square-shaped pixel sensors 304 may be interspersed, intermixed, and/or distributed throughout the pixel array 300.

As shown in FIG. 3, a square-shaped pixel sensor 304 may be disposed between and/or surrounded by a subset of octagon-shaped pixel sensors 302 (e.g., 4 octagon-shaped pixel sensors 302) such that the sides of the octagon-shaped pixel sensors 302 align with the sides of the square-shaped pixel sensors 304. This reduces and/or minimizes unused gaps or portions between the pixel sensors of the pixel array 300, which increases the pixel sensor density of the pixel array 300 and increases spatial utilization in the pixel array 300.

Moreover, this particular arrangement permits the length of the sides of the octagon-shaped pixel sensors 302 to be adjusted to increase or decrease the size of the square-shaped pixel sensors 304 while maintaining the tight grouping of pixel sensors in the pixel array 300. For example, the length of the sides of octagon-shaped pixel sensors 302 facing a square-shaped pixel sensor 304 may be decreased to correspondingly decrease the size of the square-shaped pixel sensor 304. As another example, the length of the sides of octagon-shaped pixel sensors 302 facing a square-shaped pixel sensor 304 may be increased to correspondingly increase the size of the square-shaped pixel sensor 304. In addition, this particular arrangement permits the square-shaped pixel sensors 304 to be used with regular octagon-shaped pixel sensors (e.g., octagon-shaped pixel sensors having all sides the same length) and/or irregular octagon-shaped pixel sensors (e.g., octagon-shaped pixel sensors having two or more sides of different lengths).

As indicated above, FIG. 3 is provided as an example. Other examples may differ from what is described with regard to FIG. 3.

Figure 4A:
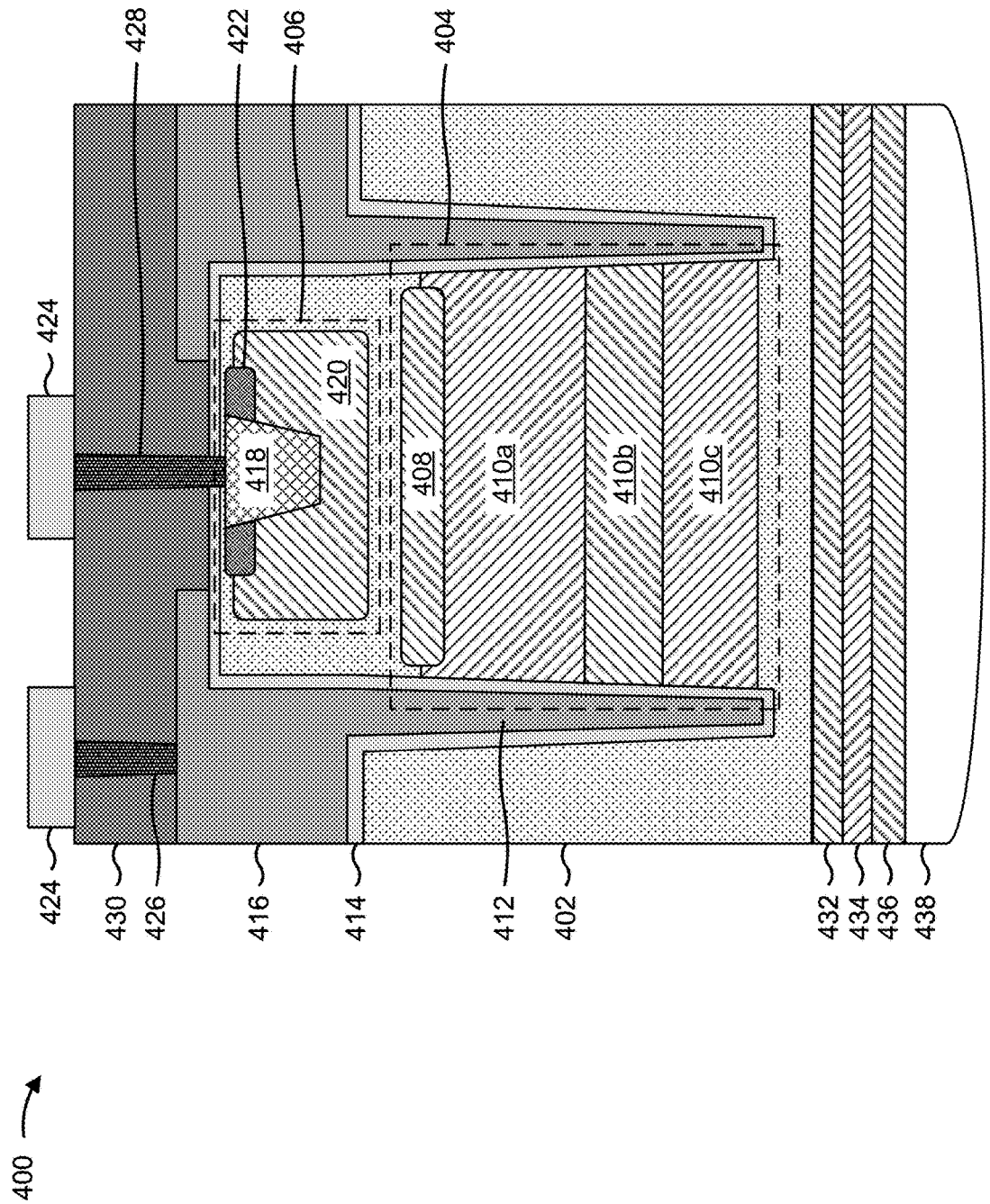
FIGS. 4A-4C are diagrams of an example pixel sensor described herein.
Figure 4B:
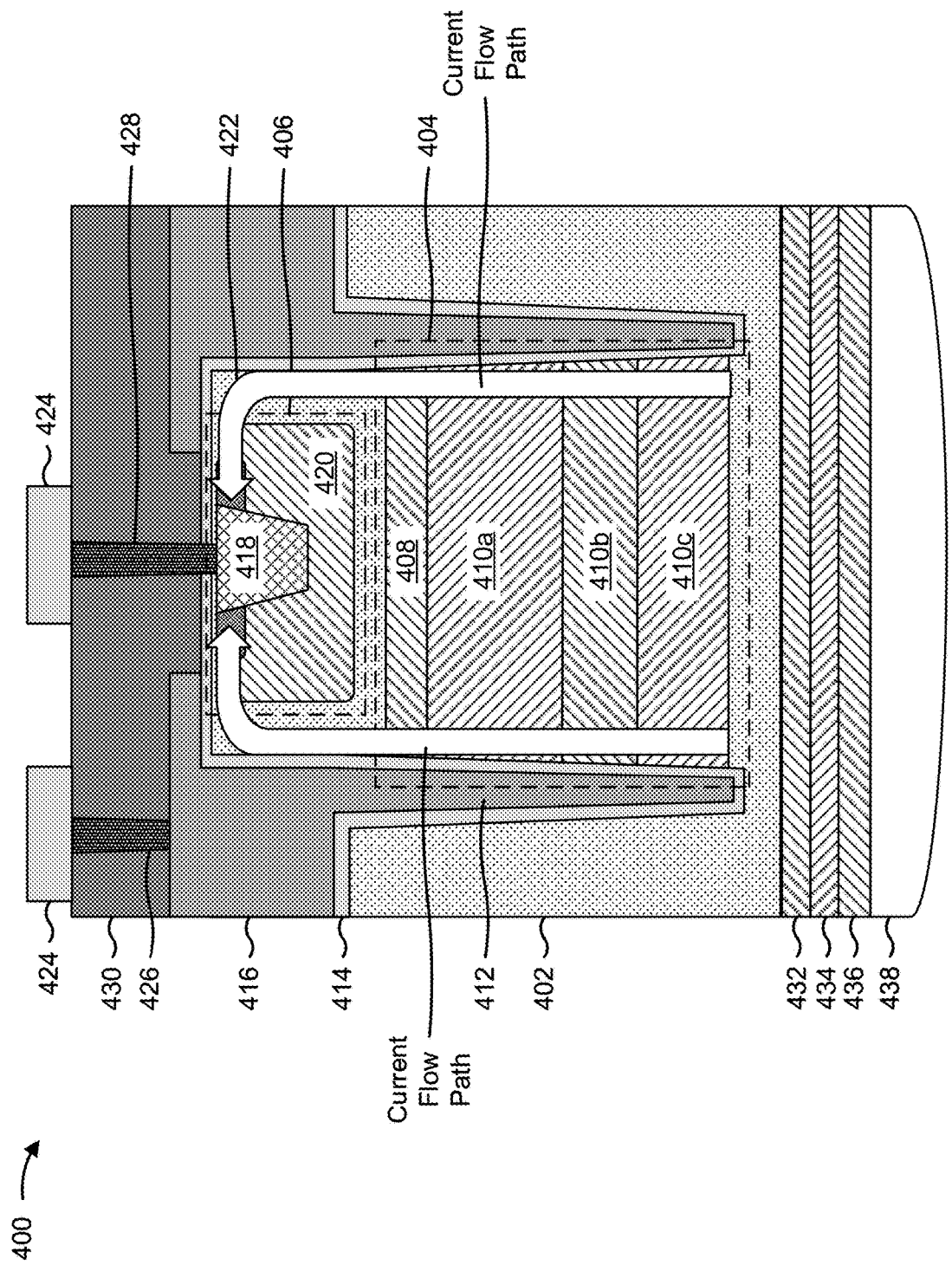
Figure 4C:
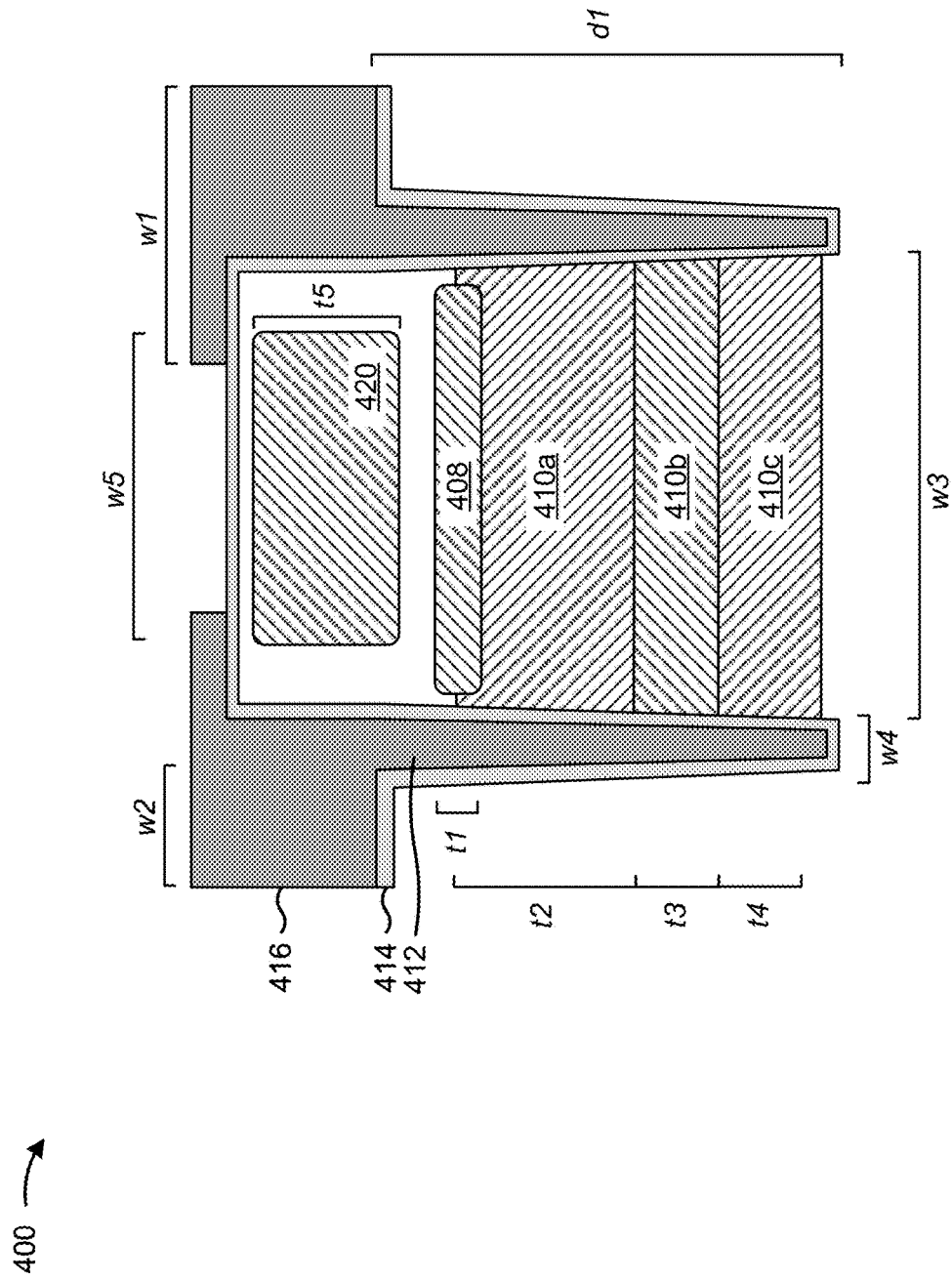

FIGS. 4A-4C are diagrams of an example pixel sensor 400 described herein. FIGS. 4A-4C may include cross-section views of the pixel sensor 400. In some implementations, the pixel sensor 400 may be configured as a square-shaped pixel sensor 202 and included in the pixel array 200. In some implementations, the pixel sensor 400 may be configured as an octagon-shaped pixel sensor 302 or a square-shaped pixel sensor 304 and included in the pixel array 300. In some implementations, the pixel sensor 400 may be included in an image sensor. The image sensor may be a CMOS image sensor, a BSI CMOS image sensor, or another type of image sensor.

The pixel sensor 400 may include a substrate 402, which may include a semiconductor die substrate, a semiconductor wafer, or another type of substrate in which semiconductor pixels may be formed. In some implementations, the substrate 402 is formed of silicon (Si), a material including silicon, a III-V compound semiconductor material such as gallium arsenide (GaAs), a silicon on insulator (SOI), or another type of semiconductor material that is capable of generating a charge from photons of incident light. In some implementations, the substrate 402 is formed of a doped material (e.g., a p-doped material or an n-doped material) such as a doped silicon.

The pixel sensor 400 may include a photodiode region 404 and a floating diffusion region 406, each included in the substrate 402. The floating diffusion region 406 may be included above and over the photodiode region 404 such that the floating diffusion region 406 and the photodiode region 404 are stacked and/or vertically arranged. This may permit the horizontal size or width of the pixel sensor 400 to be reduced while maintaining similar performance characteristics, or may permit the horizontal size or width of the photodiode region 404 to be increased without increasing the overall horizontal size or width of the pixel sensor 400. Increasing the horizontal size or width of the photodiode region 404 provides a larger area in which the photodiode region 404 may collect and absorb photons of incident light. This may increase the light sensitivity of the pixel sensor 400 and/or may increase the quantum efficiency of the pixel sensor 400. Moreover, stacking the floating diffusion region 406 over the photodiode region 404 permits the floating diffusion region 406 to shield the photodiode region 404 from noise and/or light leakage above the top surface of the substrate 402, which may further increase the performance of the pixel sensor 400.

The photodiode region 404 may include a plurality of regions that are doped with various types of ions to form a p-n junction or a PIN junction (e.g., a junction between a p-type portion, an intrinsic (or undoped) type portion, and an n-type portion). For example, the substrate 402 may be doped with a p-type dopant to form a p-type region 408 of the photodiode region 404, and the substrate 402 may be doped with an n-type dopant to form one or more n-type regions 410. The photodiode region 404 may be configured to absorb photons of incident light. The absorption of photons causes the photodiode region 404 to accumulate a charge (referred to as a photocurrent) due to the photoelectric effect. Photons may bombard the photodiode region 404, which causes emission of electrons in the photodiode region 404.

The regions included in the photodiode region 404 may be stacked and/or vertically arranged. For example, the p-type region 408 may be included over the one or more n-type regions 410. The p-type region 408 may provide noise isolation for the one or more n-type regions 410 and may facilitate photocurrent generation in the photodiode region 404.

The one or more n-type regions 410 may include an n-type region 410a, an n-type region 410b, and an n-type region 410c. The n-type region 410b may be located on and/or over the n-type region 410c, and the n-type region 410a may be located on and/or over the n-type region 410b. The n-type region 410b and the n-type region 410c may be referred to as deep n-type regions or deep n-wells and may extend the n-type region 410 of the photodiode region 404. This may provide an increased area for photon absorption in the photodiode region 404. Moreover, at least a subset of the one or more n-type regions 410 may have different doping concentrations. For example, the n-type region 410a may include a greater n-type dopant concentration relative to the n-type region 410b and the n-type region 410c, and the n-type region 410b may include a greater n-type dopant concentration relative to the n-type region 410c. As a result, an n-type dopant gradient is formed, which may increase the migration of electrons upward in the photodiode region 404.

The photodiode region 404 may be electrically and optically isolated from adjacent pixel sensors by a deep trench isolation (DTI) structure 412. The DTI structure 412 may surround the photodiode region 404 and, thus, the p-type region 408 and the n-type regions 410 included therein. The DTI structure 412 may be lined with a gate oxide layer 414 that includes a silicon oxide ($SiO_x$) or another type of dielectric material, and a gate material may fill the DTI structure 412 over the gate oxide layer 414. The gate material may further be formed above the DTI structure 412 and over a portion of the substrate 402 to form a poly gate region 416 of the pixel sensor 400. The gate material may further be formed such that the poly gate region 416 surrounds the floating diffusion region 406. The gate material may include a conductive material such as a polysilicon or a metal. In some implementations, the transfer gate of the pixel sensor 400 includes the poly gate region 416 and the DTI structure 412. Accordingly, the DTI structure 412 may function as a part of the transfer gate of the pixel sensor 400 and may provide electrical and optical isolation for the pixel sensor 400.

The floating diffusion region 406 may be surrounded, and electrically isolated from the photodiode region 404, by the substrate 402. The poly gate region 416 may be energized to cause a conductive channel to form in the substrate 402 between the photodiode region 404 and the floating diffusion region 406. As described above, the photodiode region 404 and the floating diffusion region 406 are stacked and/or vertically arranged. Accordingly, a vertical conductive channel may form around the floating diffusion region 406 such that a photocurrent is permitted to transfer upward from the photodiode region 404 to the floating diffusion region 406 around the floating diffusion region 406 (e.g., approximately 360 degrees around the floating diffusion region 406). This increases the size of the conductive channel and also increases the surface area of the conductive channel controlled by the poly gate region 416, which may increase the switching speed of the pixel sensor 400, may decrease switching lag of the pixel sensor 400, and/or may reduce photocurrent leakage of the pixel sensor 400, among other examples. Moreover, the gate material in the DTI structure 412 may be used to isolate the photodiode region 404 from the photodiode regions of adjacent pixel sensors, which may reduce the manufacturing complexity of isolating the photodiode region 404 relative to forming multiple isolation regions around the photodiode region 404.

The floating diffusion region 406 may include a drain region 418 included in and/or adjacent to a p-type region 420 included in the substrate 402 and in the floating diffusion region 406. The drain region 418 may include a highly-doped n-type region (e.g., an $n^+$ doped region). The one or more extension regions 422 may include n-type lightly-doped region(s) that facilitate the transfer of photocurrent from the conductive channel to the drain region 418.

The poly gate region 416 and the drain region 418 may be electrically connected with a metallization layer 424 above the substrate 402. The metallization layer 424 may be electrically connected to the poly gate region 416 by a contact plug 426, and to the drain region 418 by a contact plug 428. The contact plug 426 and the contact plug 428 may be included in a dielectric layer 430. The dielectric layer 430 may include an inter-metal dielectric (IMD) formed of an oxide material such as a silicon oxide ($SiO_x$) (e.g., silicon dioxide ($SiO_2$)), a silicon nitride ($SiN_x$), a silicon carbide ($SiC_x$), a titanium nitride ($TiN_x$), a tantalum nitride ($TaN_x$), a hafnium oxide ($HfO_x$), a tantalum oxide ($TaO_x$), an aluminum oxide ($AlO_x$), or another type of dielectric material. The contact plug 426 and the contact plug 428 may each be filled with a conductive material, such as tungsten, cobalt, ruthenium, and/or another type of conductive material.

As described above, the pixel sensor 400 may be included in a BSI CMOS image sensor. Accordingly, the pixel sensor 400 may include one or more layers on a back side or a bottom side of the substrate 402. Relative to the back side or the bottom side of the substrate 402, dielectric layer 432 may be included on the substrate 402 to increase photon-electron conversion. An antireflective coating (ARC) layer 434 may be included over and/or on the dielectric layer 432. The ARC 434 may include a suitable material for reducing a reflection of incident light projected toward the photodiode region 404. For example, the ARC 434 may include nitrogen-containing material.

A color filter layer 436 may be included above and/or on the ARC 434. In some implementations, the color filter layer 436 includes a visible light color filter configured to filter a particular wavelength or a particular wavelength range of visible light (e.g., red light, blue light, or green light). In some implementations, the color filter layer 436 includes a near infrared (NIR) filter (e.g., a NIR bandpass filter) configured to permit wavelengths associated with NIR light to pass through the color filter layer 436 and to block other wavelengths of light. In some implementations, the color filter layer 436 includes a NIR cut filter configured to block NIR light from passing through the color filter layer 436. In some implementations, the color filter layer 436 is omitted from the pixel sensor 400 to permit all wavelengths of light to pass through to the photodiode region 404. In these examples, the pixel sensor 400 may be configured as a white pixel sensor.

A micro-lens layer 438 may be included above and/or on the color filter layer 436. The micro-lens layer 438 may include a micro-lens for the pixel sensor 400 configured to focus incident light toward the photodiode region 404 and/or to reduce optical crosstalk between the pixel sensor 400 and adjacent pixel sensors.

FIG. 4B illustrates example current flow paths (e.g., photocurrent flow paths) through the pixel sensor 400. As shown in FIG. 4B, photocurrent generated by photons of incident light absorbed in the photodiode region 404 may originate in the one or more n-type regions 410. A current (or voltage) may be applied to the poly gate region 416 from the metallization layer 424 through the contact plug 426. The current (or voltage) may cause an electric field to form a conductive channel between the photodiode region 404 and the floating diffusion region 406 in the substrate 402. The photocurrent may travel along the conductive channel from the photodiode region 404 to one or more extension regions 422 in the floating diffusion region 406. The photocurrent may travel from the one or more extension regions 422 to the drain region 418. The photocurrent may be measured through the contact plug 428 at the metallization layer 424.

FIG. 4C illustrates various example dimensional parameters of the pixel sensor 400. As shown in FIG. 4C, an example dimensional parameter may include a width w1 of the poly gate region 416. The width w1 of the poly gate region 416 may be a width at approximately the widest portion of the poly gate region 416. The width w1 may be in a range of approximately 0.1 microns (e.g., to provide sufficient isolation performance for the pixel sensor 400) to approximately 6 microns (e.g., to minimize transfer lag of the pixel sensor 400).

As further shown in FIG. 4C, an example dimensional parameter may include a width w2 of the poly gate region 416. The width w2 of the poly gate region 416 may be a width between an outer edge of the poly gate region 416 and an edge of the DTI structure 412. The width w2 may be in a range of approximately 0.05 microns (e.g., to provide sufficient photon/electron leakage isolation performance for the pixel sensor 400) to approximately 0.5 microns (e.g., to minimize the leakage current of the pixel sensor 400 that might otherwise result from silicon damage).

As further shown in FIG. 4C, an example dimensional parameter may include a width w3 of the photodiode region 404. The width w3 may be in a range of approximately 0.3 microns (e.g., to achieve a sufficient amount of light intake for the pixel sensor 400) to approximately 11 microns (e.g., to minimize transfer lag of the pixel sensor 400).

As further shown in FIG. 4C, an example dimensional parameter may include a thickness t1 of the p-type region 408. The thickness t1 of the p-type region 408 may be in a range of approximately 1 micron (e.g., such that the p-type region 408 is spaced apart and not touching the p-type region 420) to approximately 3 microns (e.g., to minimize transfer lag of the pixel sensor 400). As further shown in FIG. 4C, an example dimensional parameter may include a thickness t2 of the n-type region 410a. The thickness t2 of the n-type region 410a may be in a range of approximately 2 microns (e.g., such that the n-type region 410a is adjacent to the p-type region 408) to approximately 3 microns (e.g., to minimize transfer lag of the pixel sensor 400). As further shown in FIG. 4C, an example dimensional parameter may include a thickness t3 of the n-type region 410b. The thickness t3 of the n-type region 410b may be in a range of approximately 0.8 microns (e.g., such that the n-type region 410b is adjacent to the n-type region 410a) to approximately 2 microns (e.g., to minimize transfer lag of the pixel sensor 400). As further shown in FIG. 4C, an example dimensional parameter may include a thickness t4 of the n-type region 410c. The thickness t4 of the n-type region 410c may be in a range of approximately 2 microns (e.g., such that the n-type region 410c is adjacent to the n-type region 410b) to approximately 4 microns (e.g., to minimize transfer lag of the pixel sensor 400).

As further shown in FIG. 4C, an example dimensional parameter may include a width w4 of the DTI structure 412. The width w4 of the DTI structure 412 may be in a range of approximately 50 nanometers (e.g., to provide sufficient light isolation performance and provide sufficient filling area in the DTI structure 412 to minimize gaps) to approximately 500 nanometers (e.g., to minimize the leakage current of the pixel sensor 400 that might otherwise result from silicon damage).

As further shown in FIG. 4C, an example dimensional parameter may include a depth (or height) dl of the DTI structure 412. The depth dl of the DTI structure 412 may be in a range of approximately 0.1 microns (e.g., to provide sufficient light isolation performance) to approximately 6 microns (e.g., to minimize the leakage current of the pixel sensor 400 that might otherwise result from silicon damage).

As further shown in FIG. 4C, an example dimensional parameter may include a width w5 of the p-type region 420. The width w5 of the p-type region 420 may be in a range of approximately 0.5 microns (e.g., to provide sufficient isolation for the photodiode region 404) to approximately 2 microns (e.g., depending on the pixel sensor 400 design and overall size).

As further shown in FIG. 4C, an example dimensional parameter may include a thickness t5 of the p-type region 420. The thickness t5 of the p-type region 420 may be greater than 0 microns (e.g., to provide sufficient isolation for the photodiode region 404 and to facilitate the transfer of a photocurrent from the photodiode region 404 to the floating diffusion region 406) to approximately 2 microns (e.g., such that the p-type region 408 is spaced apart and not touching the p-type region 420).

As indicated above, FIGS. 4A-4C are provided as one or more examples. Other examples may differ from what is described with regard to FIGS. 4A-4C.

Figure 5A:
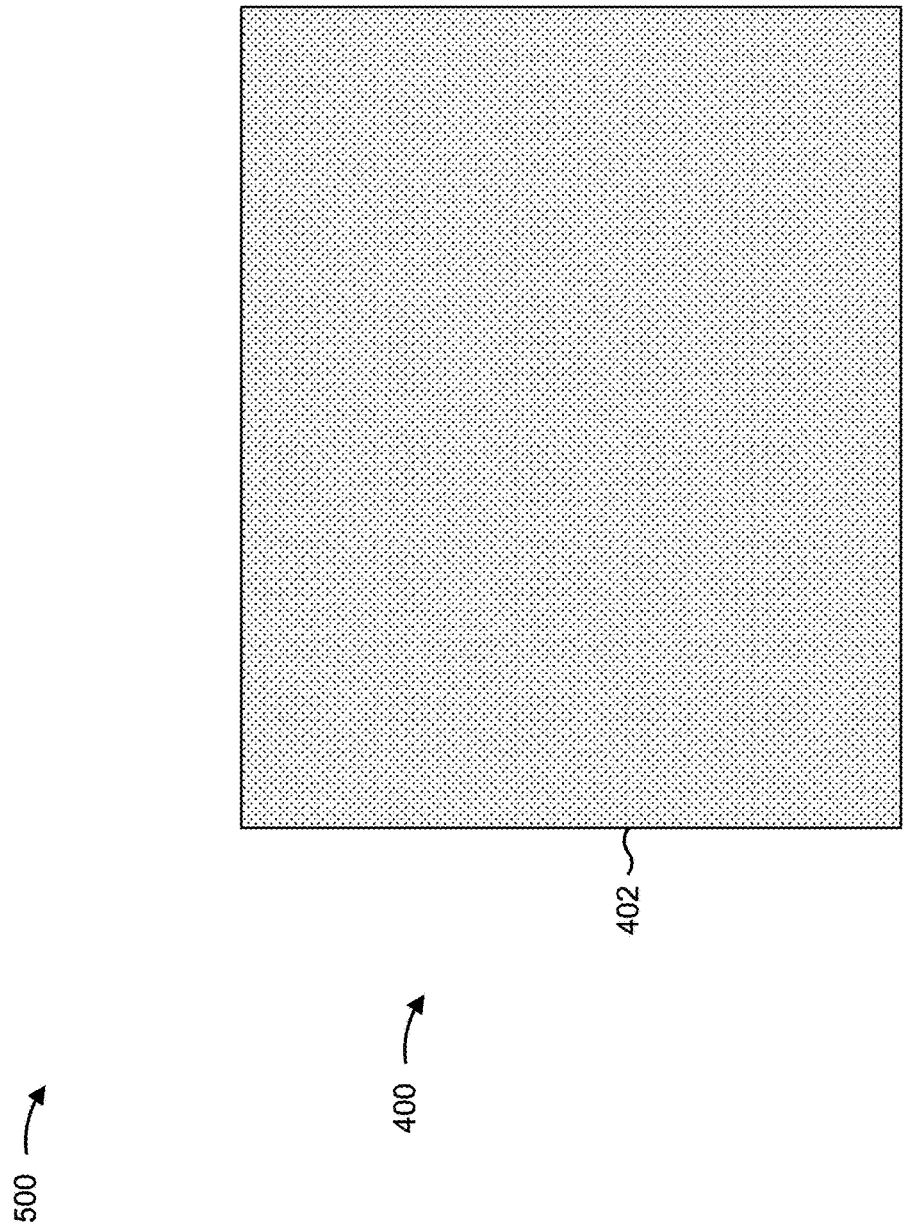
FIGS. 5A-5J are diagrams of an example implementation described herein.

FIGS. 5A-5J are diagrams of an example implementation 500 described herein. Example implementation 500 may be an example process for forming the pixel sensor 400. In some implementations, the example techniques and procedures described in connection with FIGS. 5A-5J may be used in connection with other pixel sensors described herein. As shown in FIG. 5A, the example process for forming the pixel sensor 400 may be performed in connection with the substrate 402.

Figure 5B:
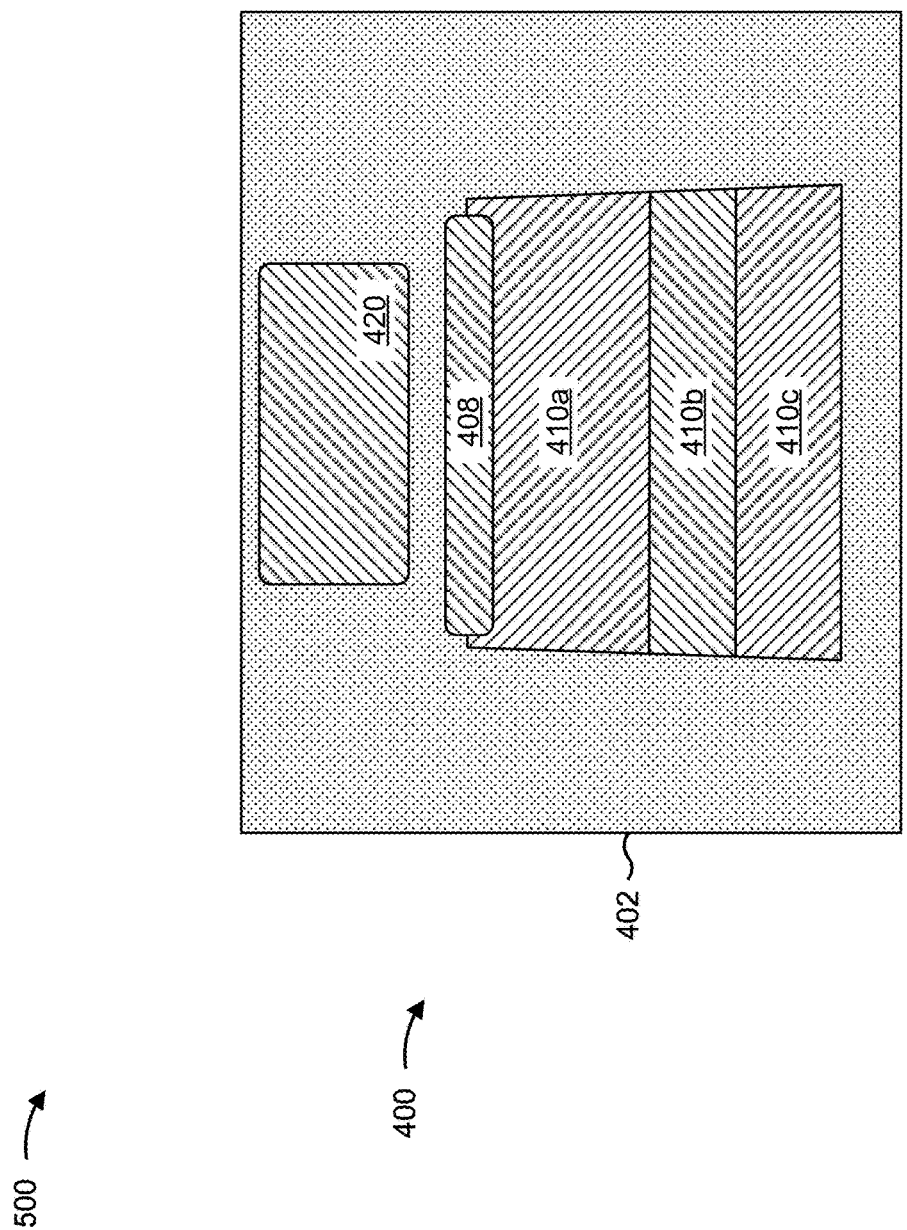

As shown in FIG. 5B, a plurality of regions of the substrate 402 may be doped to form the one or more n-type regions 410, the p-type region 408, and the p-type region 420. In some implementations, the ion implantation tool 114 dopes the plurality of regions of the substrate 402 by one or more ion implantation operations. For example, the ion implantation tool 114 may implant $n^+$ ions in the substrate 402 to form the n-type region 410c, may implant $n^+$ ions in the substrate 402 to form the n-type region 410b above and/or over the n-type region 410c, may implant $n^+$ ions in the substrate 402 to form the n-type region 410a above and/or over the n-type region 410b, may implant $p^+$ ions in the substrate 402 to form the p-type region 408 above and/or over the n-type region 410a, and may implant $p^+$ ions in the substrate 402 to form the p-type region 420 above and/or over the p-type region 408. In some implementations, one or more regions of the substrate 402 may be doped by another doping technique such as diffusion. In some implementations, two or more of the n-type region 410a, the n-type region 410b, or the n-type region 410c may be doped with different n-type dopant concentrations.

Figure 5C:
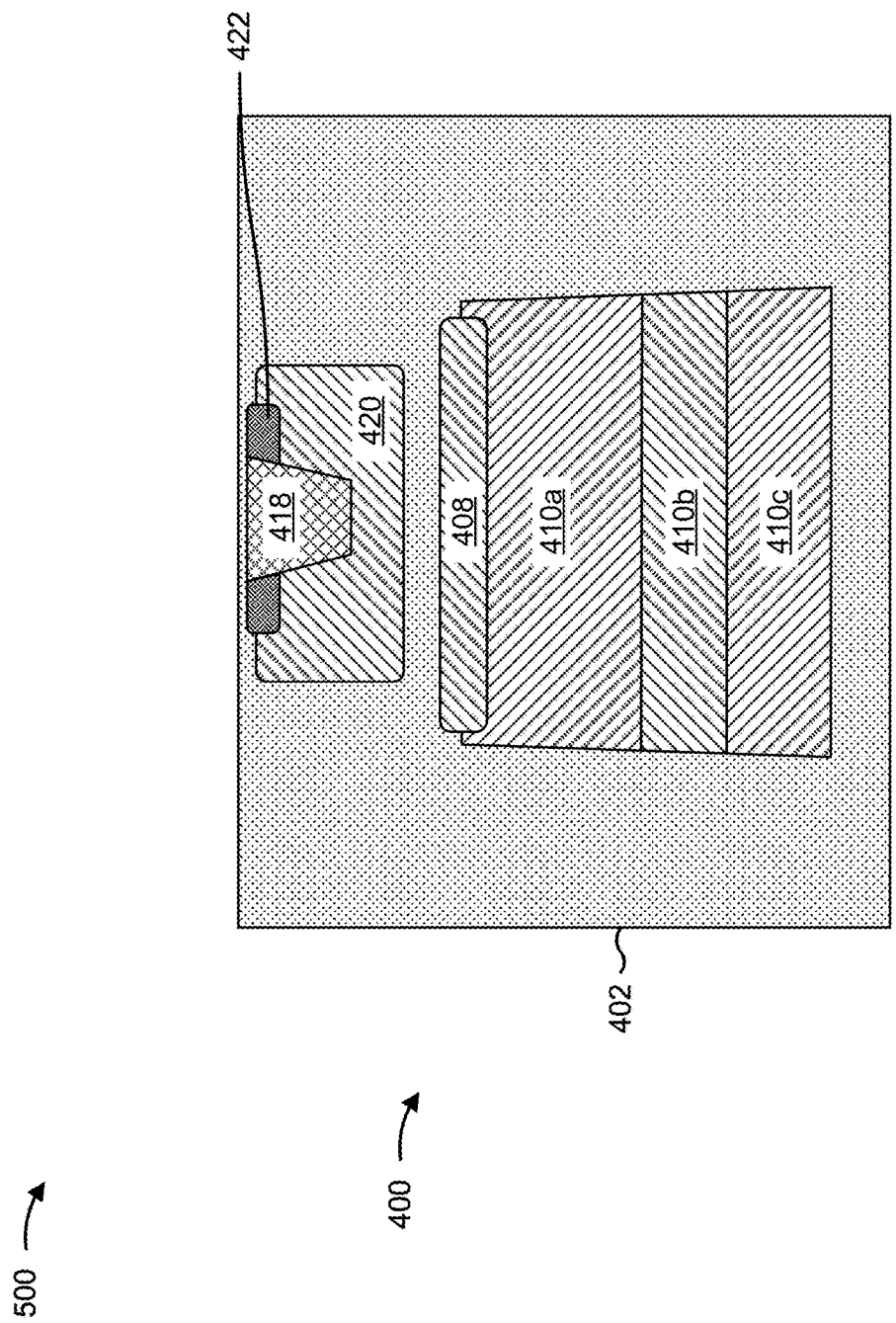

As shown in FIG. 5C, the drain region 418 and the one or more extension regions 422 may be formed in the substrate 402 in and/or adjacent to the p-type region 420. In some implementations, the ion implantation tool 114 dopes the substrate 402 by one or more ion implantation operations to form the drain region 418 and the one or more extension regions 422. For example, the ion implantation tool 114 may implant $n^+$ ions in the substrate 402 to form the drain region 418 and the one or more extension regions 422 adjacent to the drain region 418. In some implementations, the substrate 402 may be doped using another doping technique such as diffusion to form the drain region 418 and/or the one or more extension regions 422. In some implementations, the drain region 418 may be formed by epitaxial growth. In some implementations, the drain region 418 and the one or more extension regions 422 may be doped with different n-type dopant concentrations.

Figure 5D:
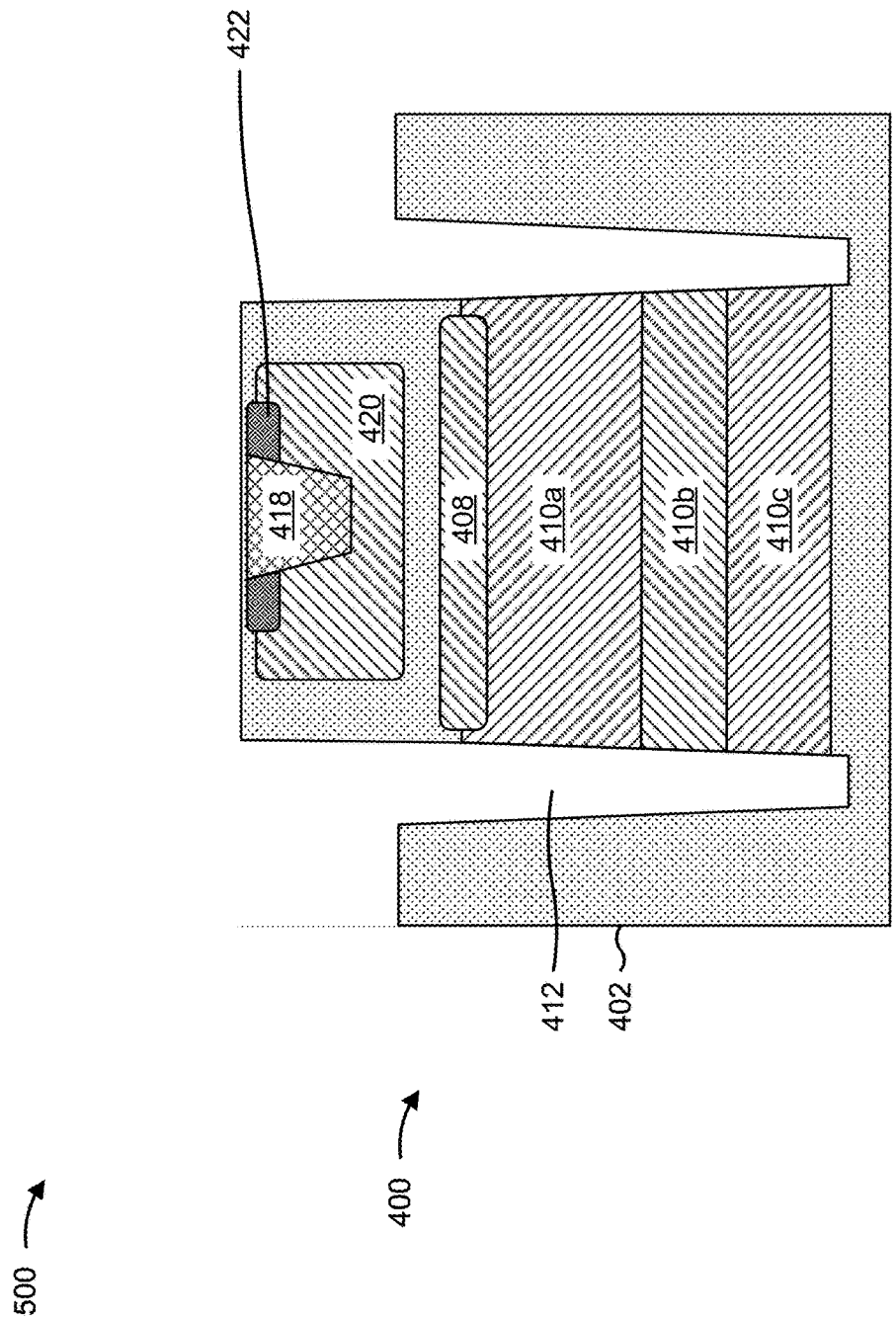

As shown in FIG. 5D, the substrate 402 may be etched to form the DTI structure 412 such that the DTI structure 412 surrounds the p-type region 408 and the one or more n-type regions 410. The substrate 402 may also be etched in preparation for formation of the poly gate region 416. The deposition tool 102 may form a photoresist layer on the substrate 402, the exposure tool 104 may expose the photoresist layer to a radiation source to pattern the photoresist layer, the developer tool 106 may develop and remove portions of the photoresist layer to expose the pattern, and the etch tool 108 may etch portions of the substrate 402 to form the DTI structure 412. In some implementations, a photoresist removal tool removes the remaining portions of the photoresist layer (e.g., using a chemical stripper, a plasma asher, and/or another technique) after the etch tool 108 etches the substrate 402.

Figure 5E:
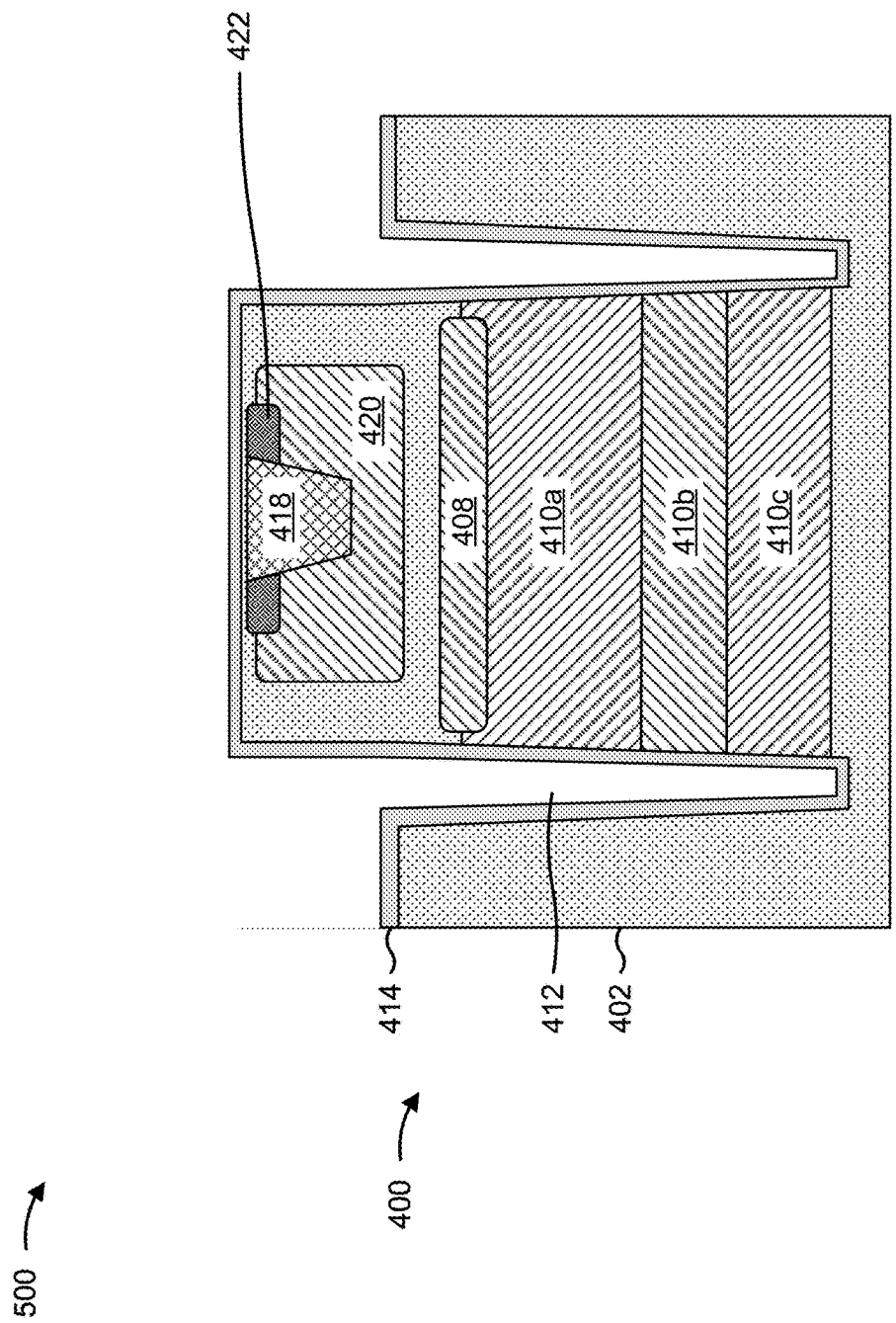

As shown in FIG. 5E, the gate oxide layer 414 may be formed over and/or on the substrate 402, including on the sidewalls and the bottom surface of the DTI structure 412. The deposition tool 102 may deposit the gate oxide layer 414 using a CVD technique, a PVD technique, an ALD technique, or another type of deposition technique.

Figure 5F:
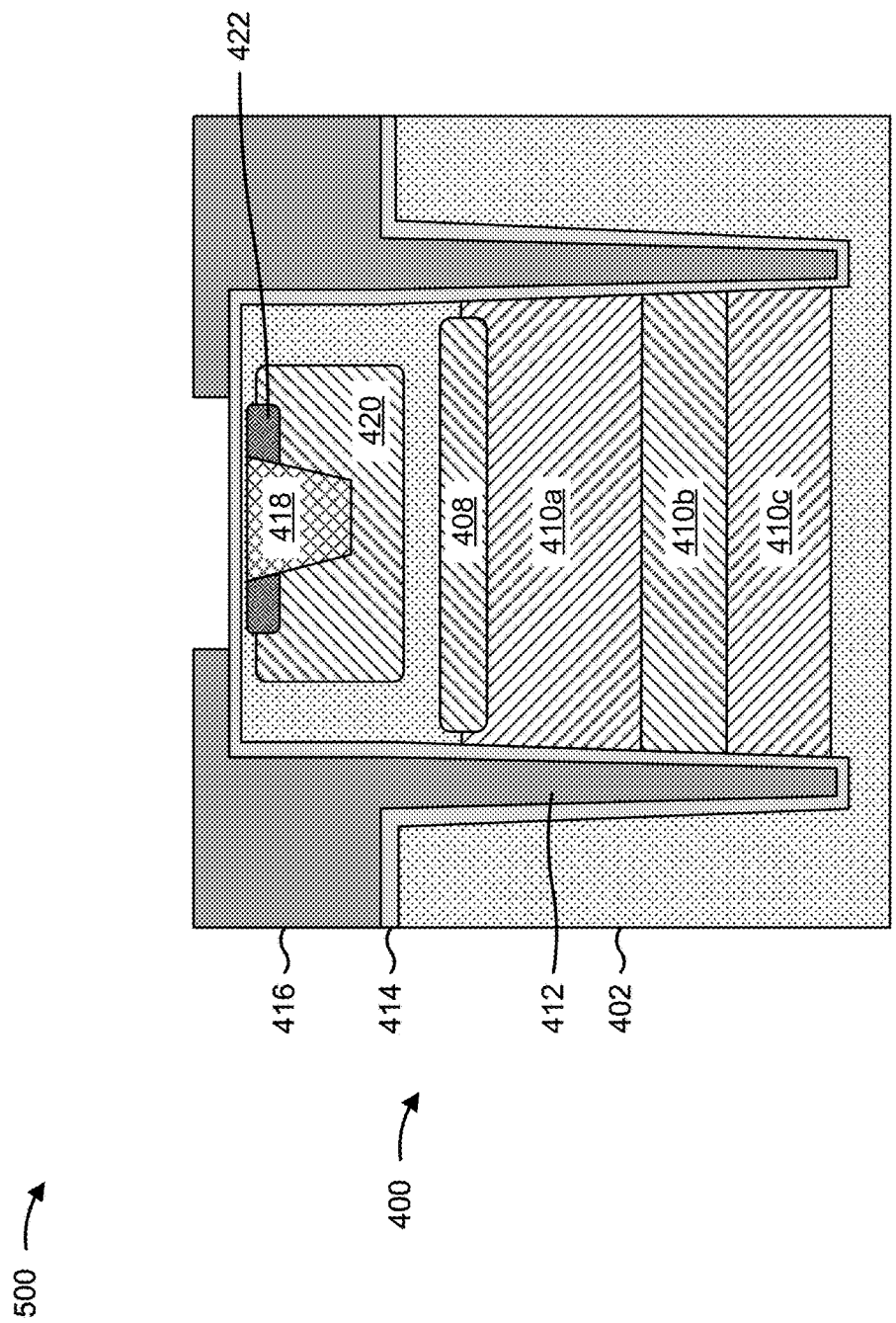

As shown in FIG. 5F, the poly gate region 416 may be formed over and/or on a portion of the gate oxide layer 414 such that the poly gate region 416 surrounds the drain region 418, the p-type region 420, and the one or more extension regions 422. The material of the poly gate region 416 may also fill in the DTI structure 412 over the gate oxide layer 414. The deposition tool 102 may deposit the poly gate region 416 using a CVD technique, a PVD technique, an ALD technique, or another type of deposition technique. The planarization tool 110 may planarize the poly gate region 416 after the poly gate region 416 is deposited.

Figure 5G:
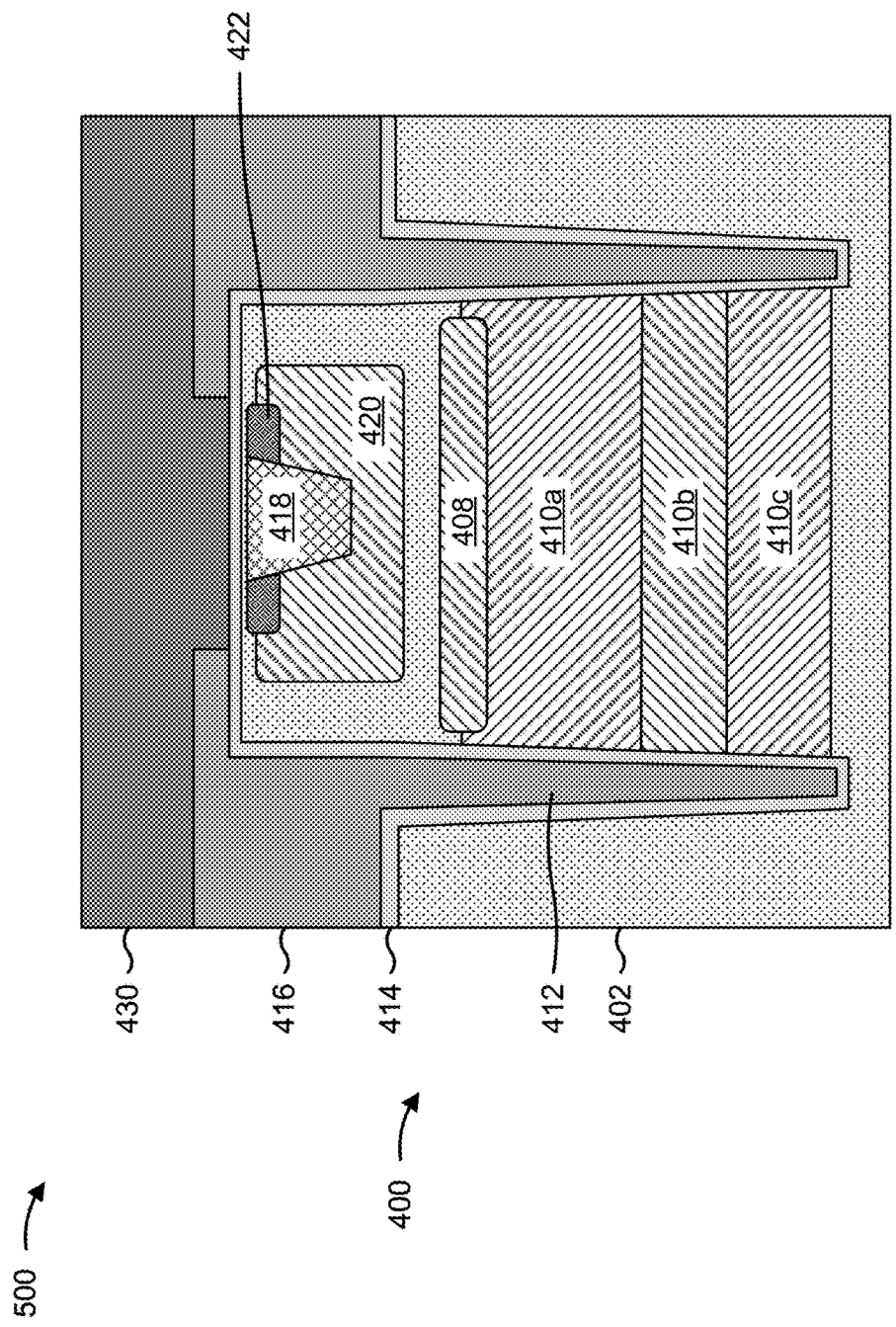

As shown in FIG. 5G, the dielectric layer 430 may be formed over and/or on the poly gate region 416 and over and/or on at least a portion of the gate oxide layer 414. The deposition tool 102 may deposit the dielectric layer 430 using a CVD technique, a PVD technique, an ALD technique, or another type of deposition technique. The planarization tool 110 may planarize the dielectric layer 430 after the dielectric layer 430 is deposited.

Figure 5H:
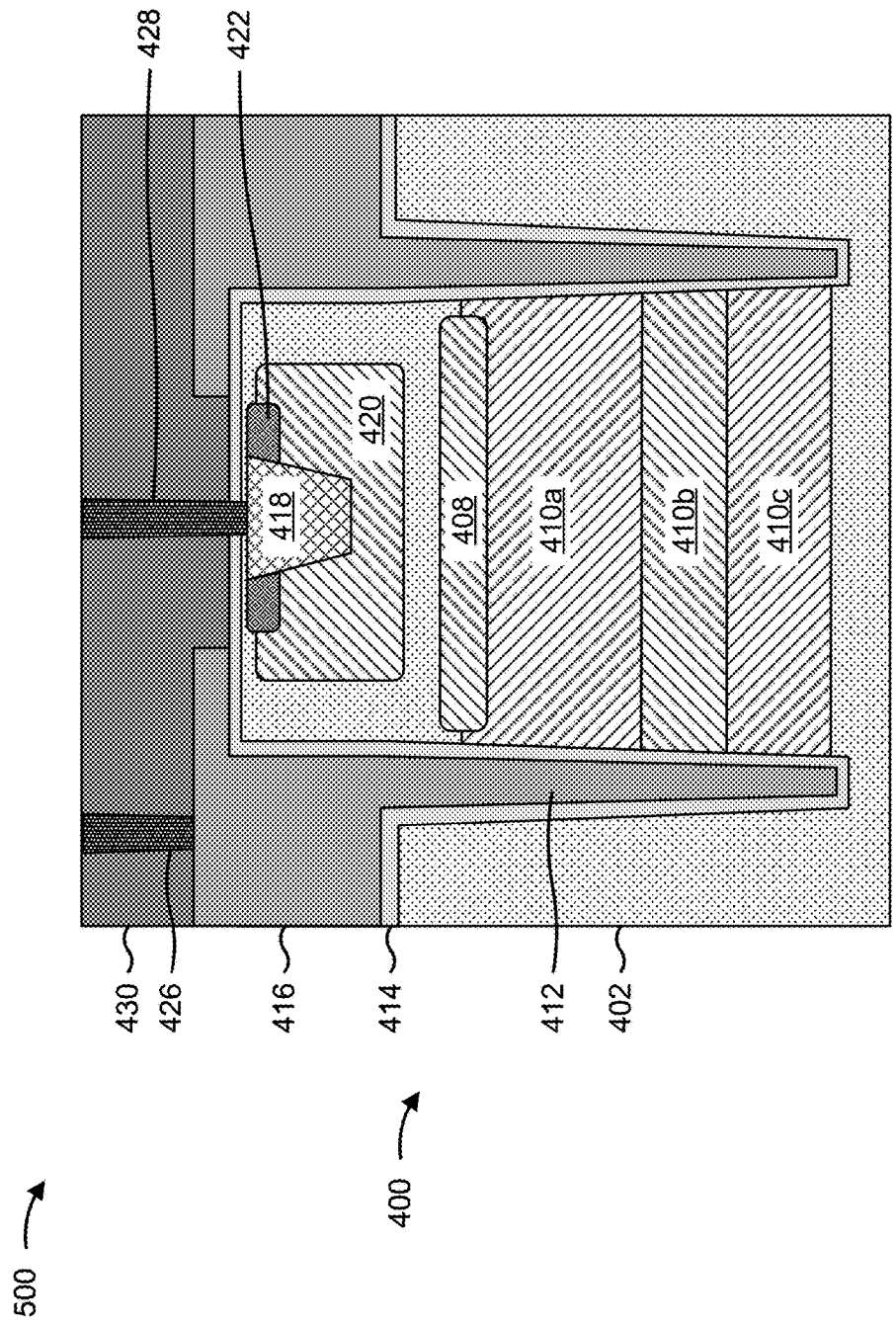

As shown in FIG. 5H, the contact plug 426 and the contact plug 428 may be formed in the dielectric layer 430. The contact plug 426 may be formed through the dielectric layer 430 such that the contact plug 426 contacts the poly gate region 416. The contact plug 428 may be formed through the dielectric layer 430 and the gate oxide layer 414 such that the contact plug 428 contacts the drain region 418. The deposition tool 102 may form a photoresist layer on the poly gate region 416 and the gate oxide layer 414, the exposure tool 104 may expose the photoresist layer to a radiation source to pattern the photoresist layer, the developer tool 106 may develop and remove portions of the photoresist layer to expose the pattern, and the etch tool 108 may etch portions of the poly gate region 416 and the gate oxide layer 414 to form openings in the poly gate region 416 and the gate oxide layer 414 for the contact plug 426 and the contact plug 428. The deposition tool 102 may deposit the material of the contact plug 426 and the contact plug 428 using a CVD technique, a PVD technique, an ALD technique, or another type of deposition technique, the plating tool 112 may deposit the material of the contact plug 426 and the contact plug 428 using an electroplating operation, or a combination thereof. The planarization tool 110 may planarize the contact plug 426 and the contact plug 428 after the contact plug 426 and the contact plug 428 are deposited.

Figure 5I:
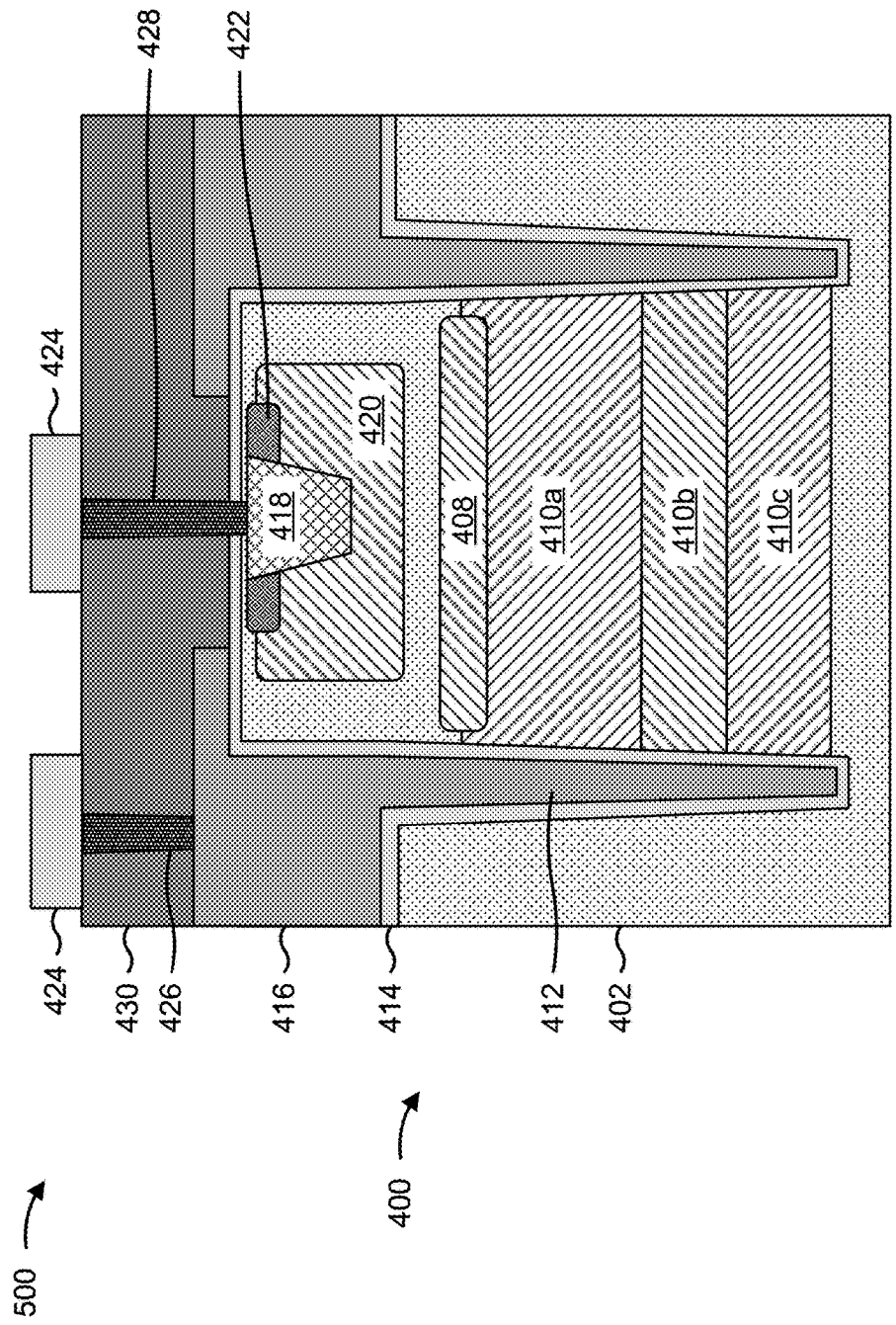

As shown in FIG. 5I, the metallization layer 424 may be formed over and/or on the dielectric layer 430 such that the metallization layer 424 contacts the contact plug 426 and the contact plug 428. The deposition tool 102 may deposit the material of the metallization layer 424 using a CVD technique, a PVD technique, an ALD technique, or another type of deposition technique, the plating tool 112 may deposit the material of the metallization layer 424 using an electroplating operation, or a combination thereof. The planarization tool 110 may planarize the metallization layer 424 after the metallization layer 424 is deposited.

Figure 5J:
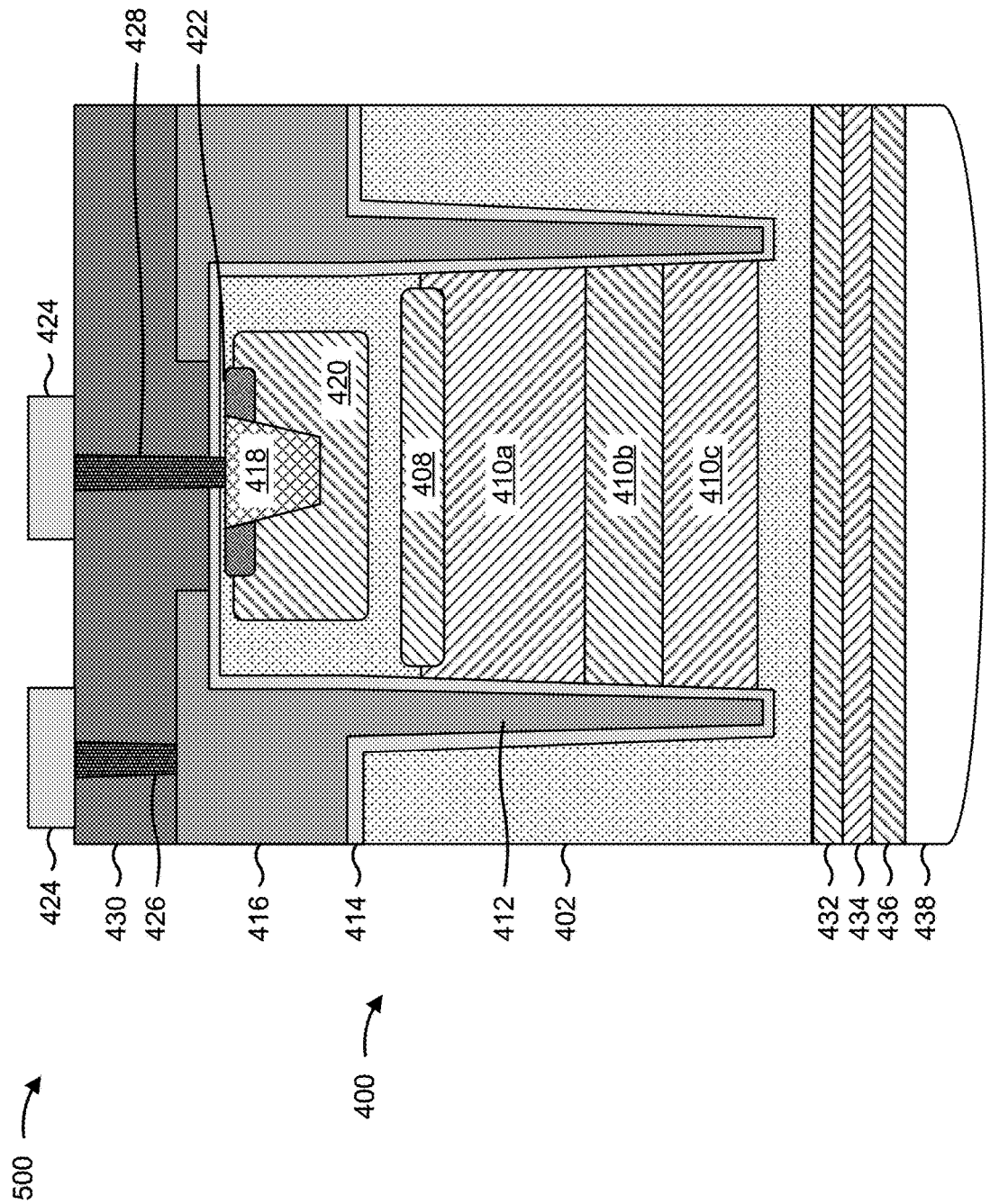

As shown in FIG. 5J, back side processing may be performed on the pixel sensor 400 to form the dielectric layer 432, the ARC 434, the color filter layer 436, and the micro-lens layer 438 over the back side or the bottom side of the substrate 402. The deposition tool 102 may deposit the dielectric layer 432, the ARC 434, the color filter layer 436, and the micro-lens layer 438 using a CVD technique, a PVD technique, an ALD technique, or another type of deposition technique. The dielectric layer 432 may be formed over and/or on the substrate 402. The ARC 434 may be formed over and/or on the dielectric layer 432. The color filter layer 436 may be formed over and/or on the ARC 434. The micro-lens layer 438 may be formed over and/or on the color filter layer 436. The planarization tool 110 may planarize the dielectric layer 432, the ARC 434, and the color filter layer 436.

As indicated above, FIGS. 5A-5J are provided as an example. Other examples may differ from what is described with regard to FIGS. 5A-5J.

Figure 6:
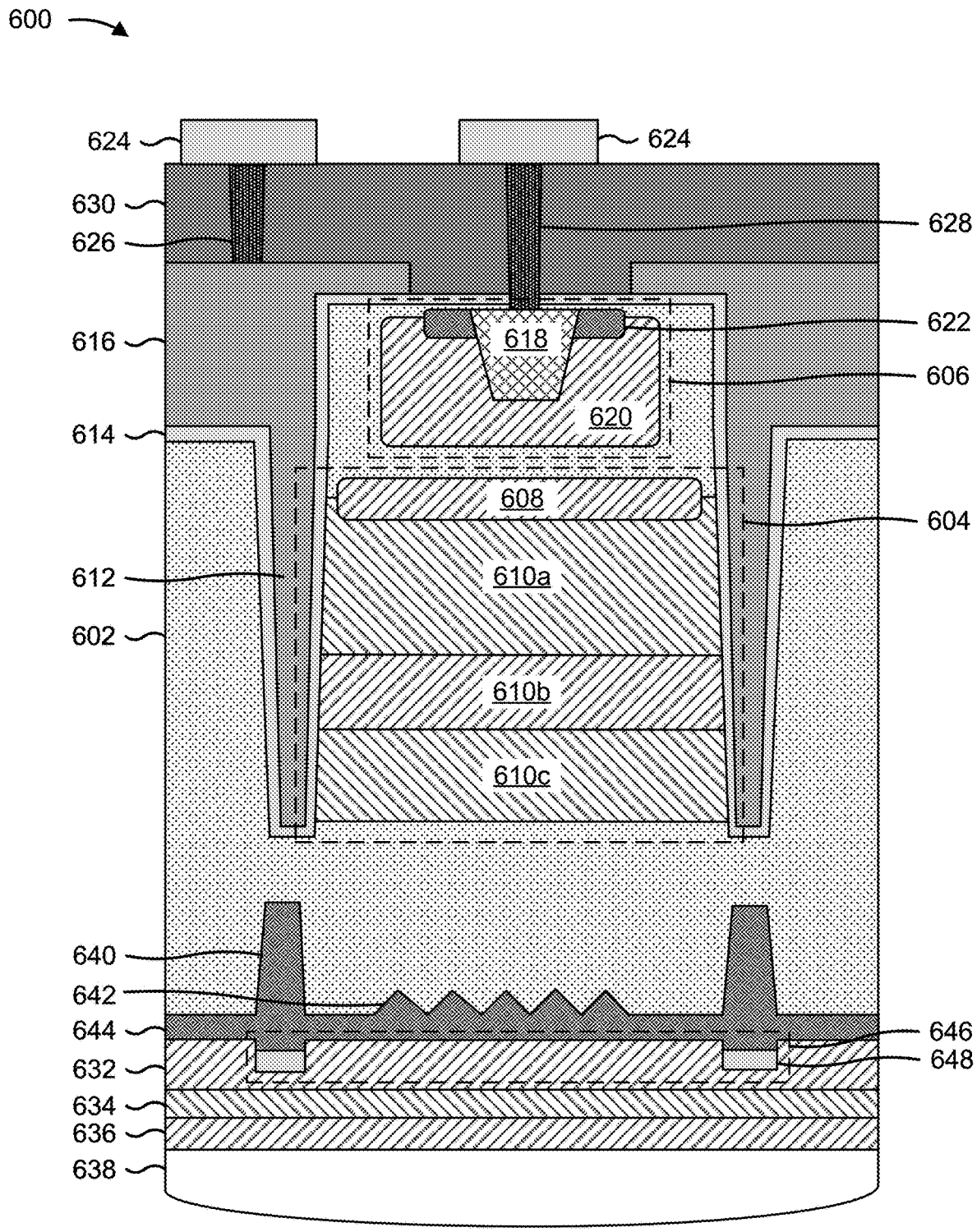
FIG. 6 is a diagram of an example pixel sensor described herein.

FIG. 6 is a diagram of an example pixel sensor 600 described herein. FIG. 6 may include a cross-section view of the pixel sensor 600. The pixel sensor 600 may include a similar arrangement of components and/or structures as the pixel sensor 400. The pixel sensor 600 may include additional back side components and/or structures, such as an isolation structure, one or more high absorption regions, and an isolation grid to increase the quantum efficiency of the pixel sensor 600 and to reduce crosstalk between the pixel sensor 600 and adjacent pixel sensors.

In some implementations, the pixel sensor 600 may be configured as a square-shaped pixel sensor 202 and included in the pixel array 200. In some implementations, the pixel sensor 600 may be configured as an octagon-shaped pixel sensor 302 or a square-shaped pixel sensor 304 and included in the pixel array 300. In some implementations, the pixel sensor 600 may be included in an image sensor. The image sensor may be a CMOS image sensor, a BSI CMOS image sensor, or another type of image sensor.

As shown in FIG. 6, the pixel sensor 600 may include a substrate 602, a photodiode region 604, and a floating diffusion region 606. The floating diffusion region 606 may be included above and over the photodiode region 604 such that the floating diffusion region 606 and the photodiode region 604 are stacked and/or vertically arranged. The photodiode region 604 may include a p-type region 608 and one or more n-type regions 610 (e.g., an n-type region 610a, an n-type region 610b, and an n-type region 610c). A DTI structure 612 may surround the photodiode region 604, and may be lined with a gate oxide layer 614. The DTI structure 612 may be filled with a gate material that also forms a poly gate region 616 around the floating diffusion region 606. The floating diffusion region 606 may include a drain region 618, a p-type region 620, and one or more extension regions 622. The poly gate region 616 and the drain region 618 may be electrically connected with a metallization layer 624 respectively by a contact plug 626 and a contact plug 628. The contact plug 626 and the contact plug 628 may be included in a dielectric layer 630. A dielectric layer 632 may be included over the back side of the substrate 602. An ARC 634 may be included over and/or on the dielectric layer 632. A color filter layer 636 may be included above and/or on the ARC 634. A micro-lens layer 638 may be included above and/or on the color filter layer 636.

An isolation structure 640 (e.g., a DTI structure, a shallow trench isolation (STI) structure) and one or more high absorption regions 642 may be included in the back side of the substrate 602 below the dielectric layer 632. The isolation structure 640 may include trenches that extend downward into the substrate 602 toward the photodiode region 604 and the DTI structure 612. The isolation structure 640 may provide optical isolation between the pixel sensor 600 adjacent pixel sensors to reduce the amount of optical crosstalk between adjacent pixel sensors. In particular, isolation structure 640 may absorb, refract, and/or reflect incident light, which may reduce the amount of incident light that travels through a pixel sensor 400 into an adjacent pixel sensor and is absorbed by the adjacent pixel sensor.

The one or more high absorption regions 642 may be located in the substrate 602 between the trenches of the isolation structure 640. Each high absorption region 642 may be defined by a shallow trench. A plurality of adjacent high absorption regions 642 may form a periodic or zig-zag structure in the substrate 602. The one or more high absorption region 642 may increase the absorption of incident light for the pixel sensor 600 (thereby increasing the quantum efficiency of the pixel sensor 600) by modifying or changing the orientation of the refractive interface between the substrate 602 and the photodiode region 604. The angled walls of the one or more high absorption regions 642 change the orientation of the interface between the substrate 602 and the photodiode region 604 by causing the interface to be diagonal relative to the orientation of the surface of the substrate 602. This change in orientation may result in a smaller angle of refraction relative to a flat surface of the substrate 602 for the same angle of incidence of incident light. As a result, the one or more high absorption regions 642 are capable of directing wider angles of incident light toward the center of the photodiode region 604 of the pixel sensor 600 than if no high absorption regions were included in the pixel sensor 600.

An oxide layer 644 may be included above the substrate 602, the isolation structure 640, and the one or more high absorption regions 642. Moreover, the material of the oxide layer 644 may fill the isolation structure 640 and the one or more high absorption regions 642. The oxide layer 644 may function as a passivation layer between the substrate 602 and the upper layers of the pixel sensor 600. In some implementations, the oxide layer 644 includes an oxide material such as a silicon oxide ($SiO_x$). In some implementations, a silicon nitride ($SiN_x$), a silicon carbide ($SiC_x$), or a mixture thereof, such as a silicon carbon nitride (SiCN), a silicon oxynitride (SiON), or another dielectric material is used in place of the oxide layer 644 as a passivation layer.

A grid structure 646 may be included over and/or above the isolation structure 640. The grid structure 646 may include a plurality of interconnected columns that surround the perimeter of the pixel sensor 600, and may be configured to provide additional crosstalk reduction and/or mitigation in combination with the isolation structure 640. The grid structure 646 may include portions of the oxide layer 644 and a metal shielding layer 648 on the portions of the oxide layer 644. The metal shielding layer 648 may include a metallic material such as tungsten (W), copper (Cu), aluminum (Al), cobalt (Co), nickel (Ni), titanium (Ti), tantalum (Ta), another type of conductive material, and/or an alloy including one or more of the foregoing. The metal shielding layer 648 may be configured to reflect a portion of incident light to reduce and/or prevent optical crosstalk.

As indicated above, FIG. 6 is provided as an example. Other examples may differ from what is described with regard to FIG. 6.

Figure 7A:
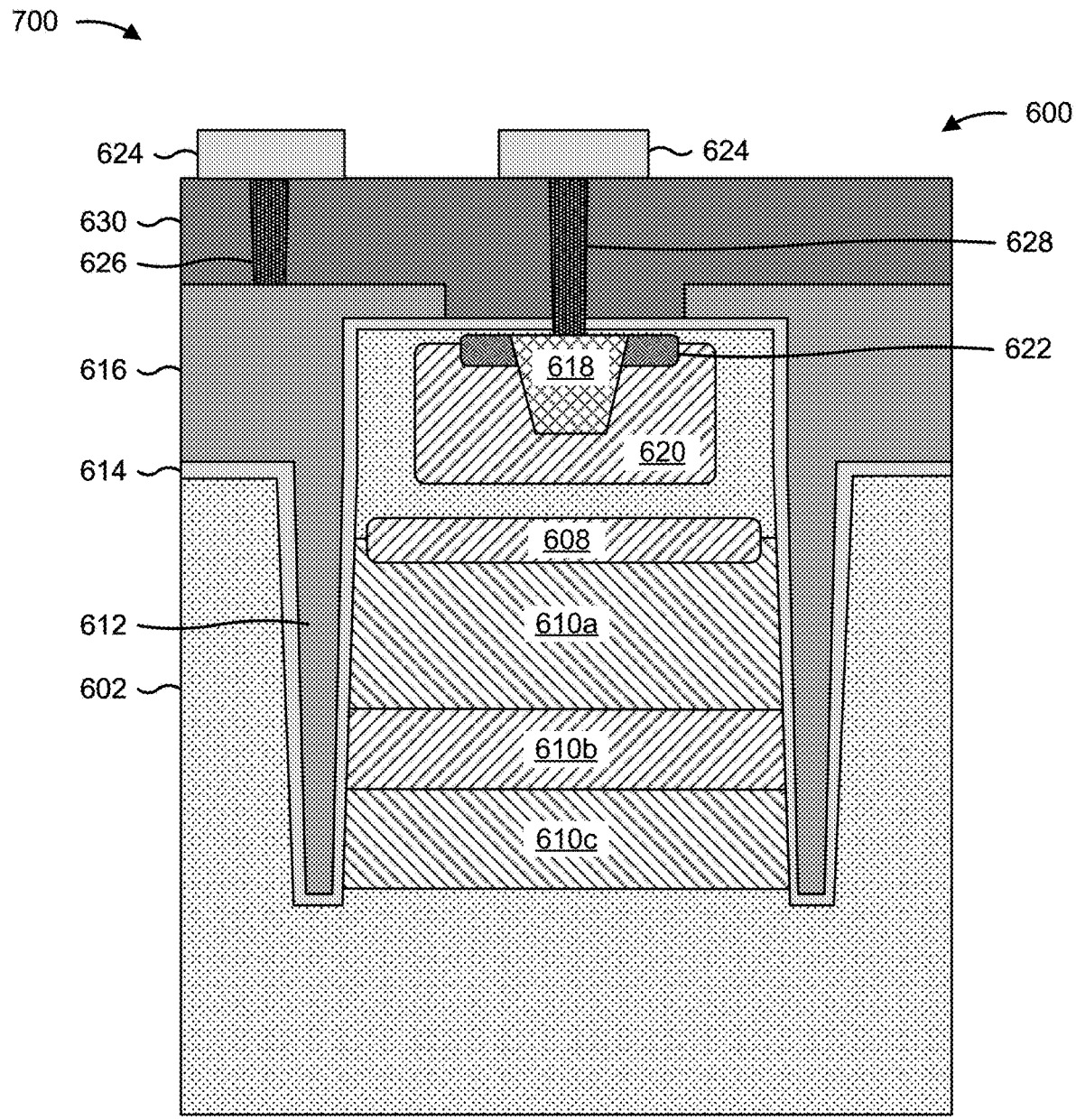
FIGS. 7A-7F are diagrams of an example implementation described herein.

FIGS. 7A-7F are diagrams of an example implementation 700 described herein. Example implementation 700 may be an example process for forming the pixel sensor 600. In some implementations, the example techniques and procedures described in connection with FIGS. 7A-7F may be used in connection with other pixel sensors described herein. As shown in FIG. 7A, the example process for forming the pixel sensor 600 may include one or more of the operations and/or techniques described above in connection with FIGS. 5A-5J to form a subset of the components and/or structures included in the pixel sensor 600.

Figure 7B:
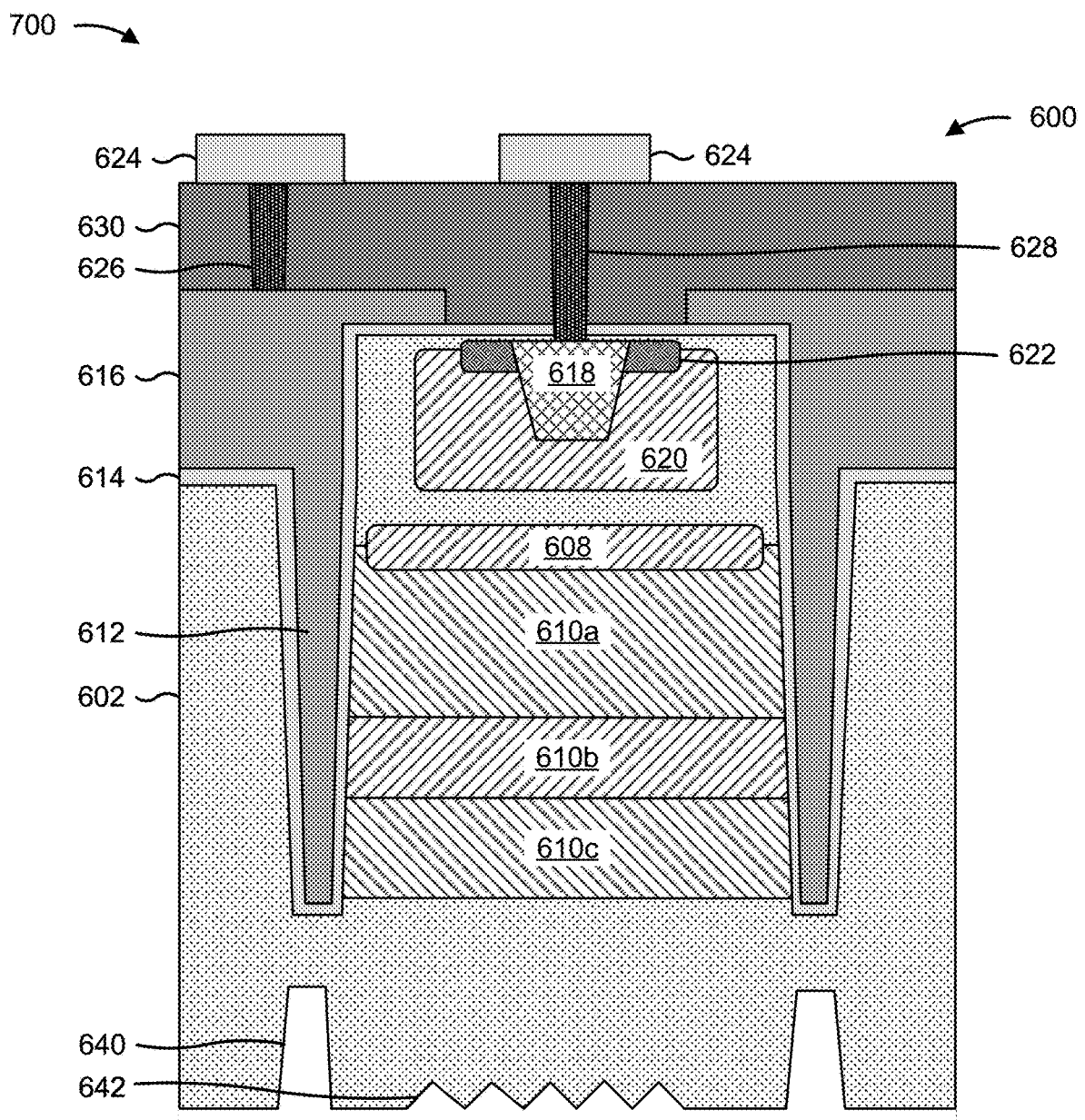

As shown in FIG. 7B, the isolation structure 640 may be formed in the substrate 602. In particular, the isolation structure 640 may be formed in the back side of the substrate 602. As further shown in FIG. 7B, the one or more high absorption regions 642 may be formed in the back side of the substrate 602 between the isolation structure 640. The deposition tool 102 may form a photoresist layer on the back side of the substrate 602, the exposure tool 104 may expose the photoresist layer to a radiation source to pattern the photoresist layer, the developer tool 106 may develop and remove portions of the photoresist layer to expose the pattern, and the etch tool 108 may etch the portions of substrate 602 to form the isolation structure 640 and the one or more high absorption regions 642 in the substrate 602. In some implementations, a photoresist removal tool removes the remaining portions of the photoresist layer (e.g., using a chemical stripper and/or another technique) after the etch tool 108 etches the substrate 602.

Figure 7C:
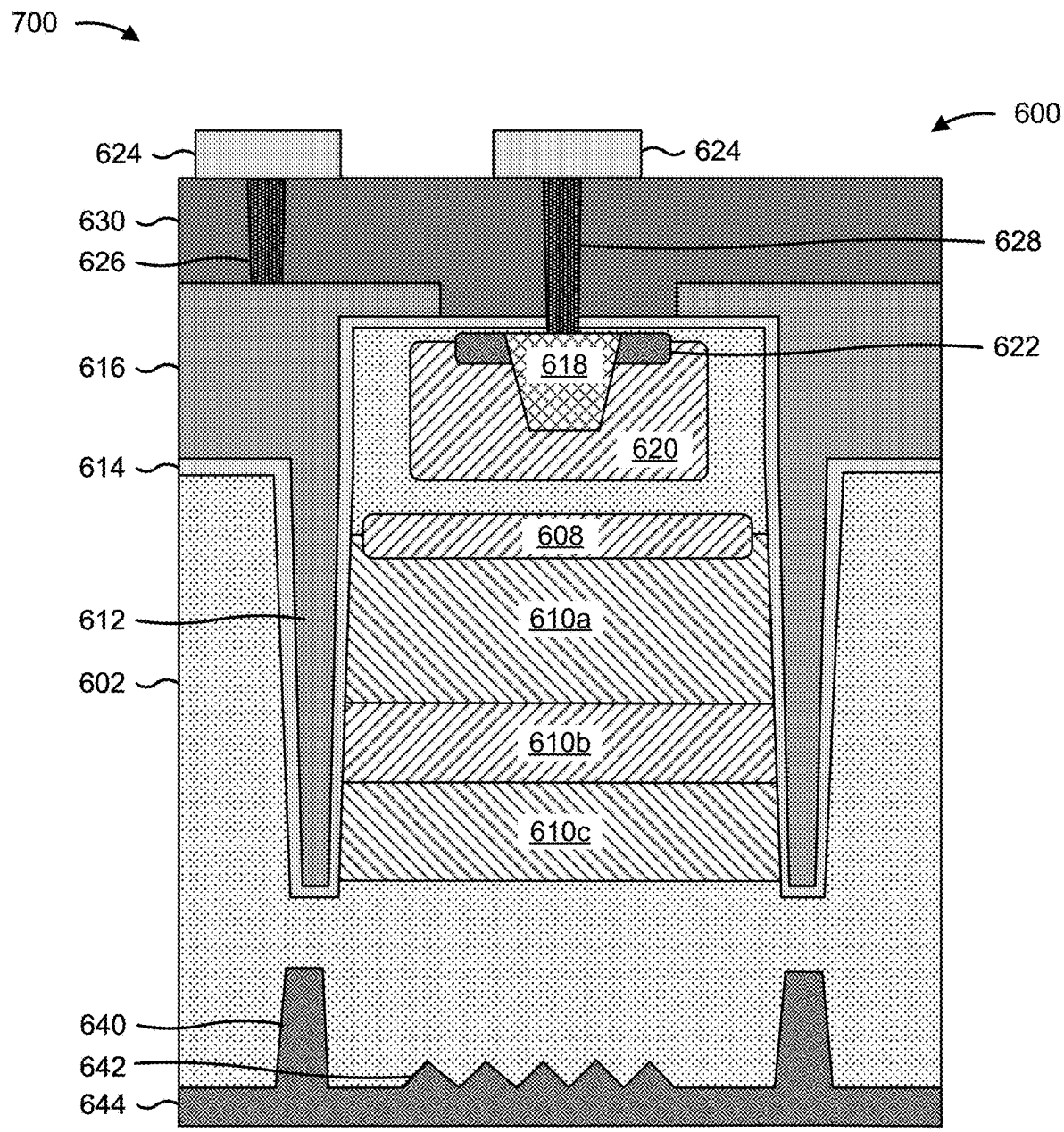

As shown in FIG. 7C, the isolation structure 640 and the one or more high absorption regions 642 may each be filled with an oxide material. In particular, the deposition tool 102 may deposit the oxide material in the isolation structure 640, in the one or more high absorption regions 642, and above the isolation structure 640 and the one or more high absorption regions 642 such that the oxide layer 644 is formed using a CVD technique, a PVD technique, an ALD technique, or another type of deposition technique. The planarization tool 110 may planarize the oxide layer 644 after the oxide layer 644 is deposited.

Figure 7D:
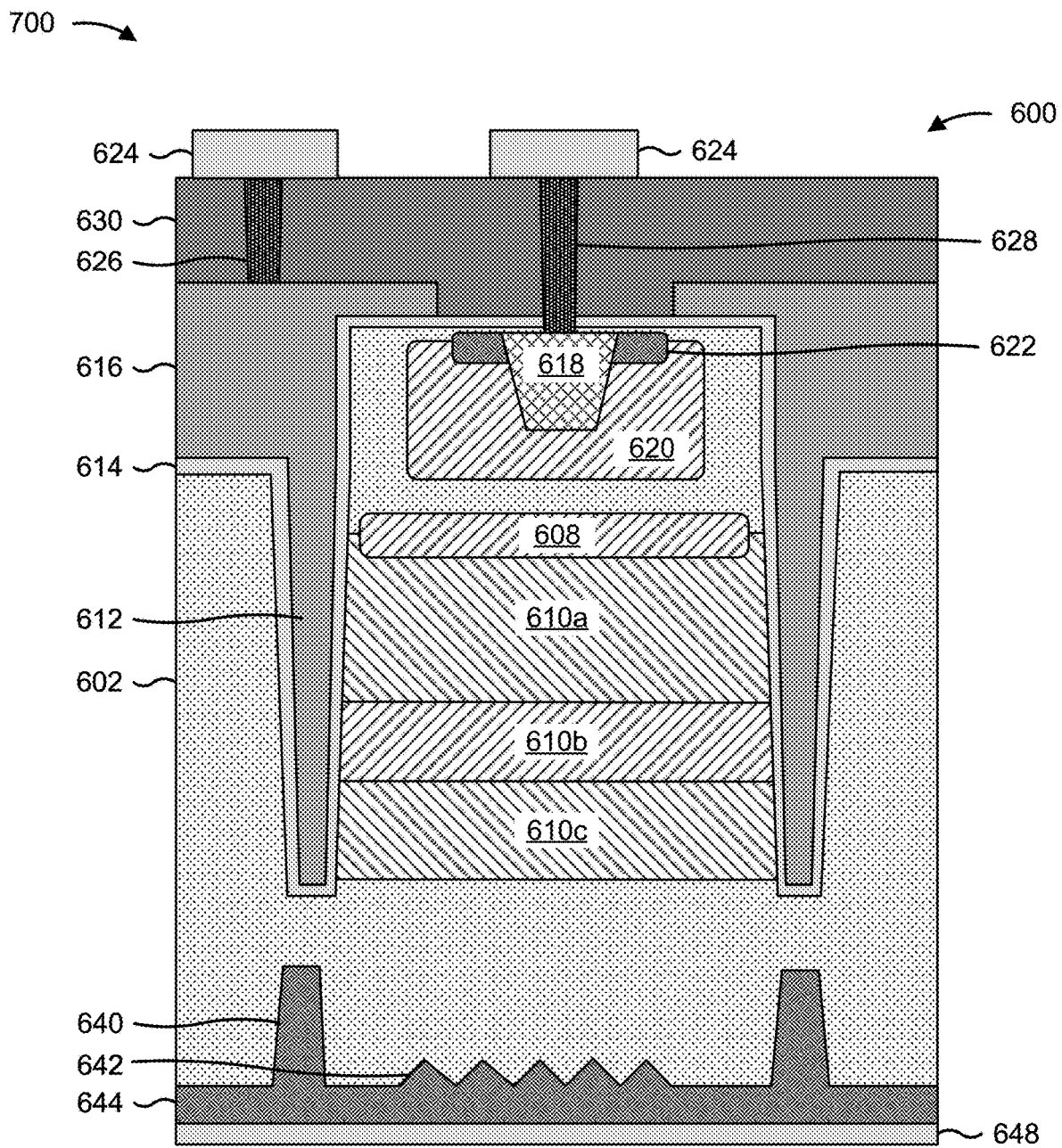

As shown in FIG. 7D, the metal shielding layer 648 may be formed over and/or on the oxide layer 644. The deposition tool 102 may form the metal shielding layer 648 using a CVD technique, a PVD technique, an ALD technique, or another type of deposition technique, the plating tool 112 may form the metal shielding layer 648 using a plating technique such as electroplating (or electro-chemical deposition), or a combination thereof.

Figure 7E:
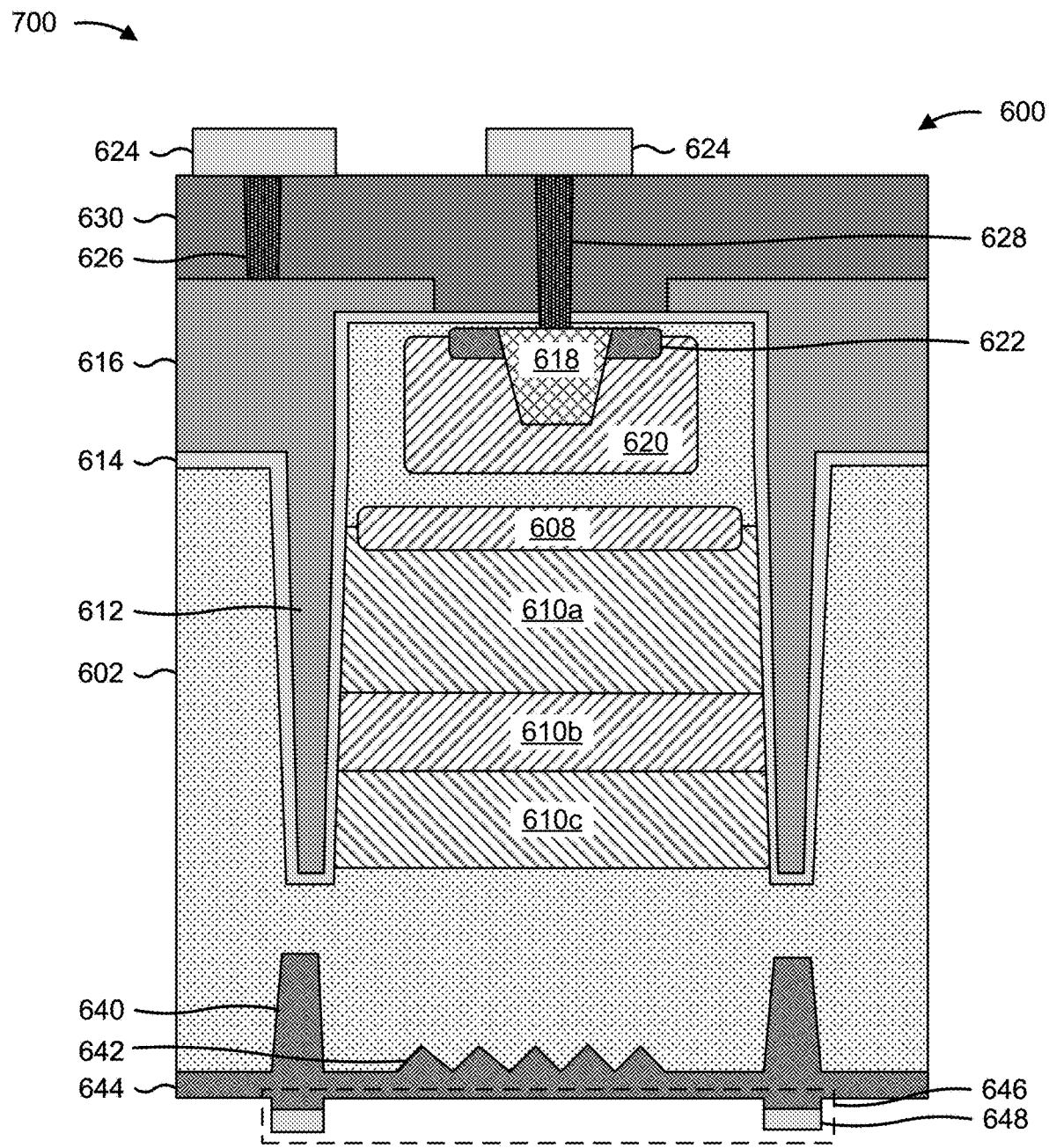

As shown in FIG. 7E, portions of the metal shielding layer 648 and portions of the oxide layer 644 may be removed to form the grid structure 646. The grid structure 646 may be formed by coating the metal shielding layer 648 with a photoresist (e.g., using the deposition tool 102), forming a pattern in the photoresist by exposing the photoresist to a radiation source (e.g., using the exposure tool 104), removing either the exposed portions or the non-exposed portions of the photoresist (e.g., using developer tool 106), and etching through the metal shielding layer 648 into a portion of the oxide layer 644 (e.g., using the etch tool 108) based on the pattern in the photoresist.

Figure 7F:
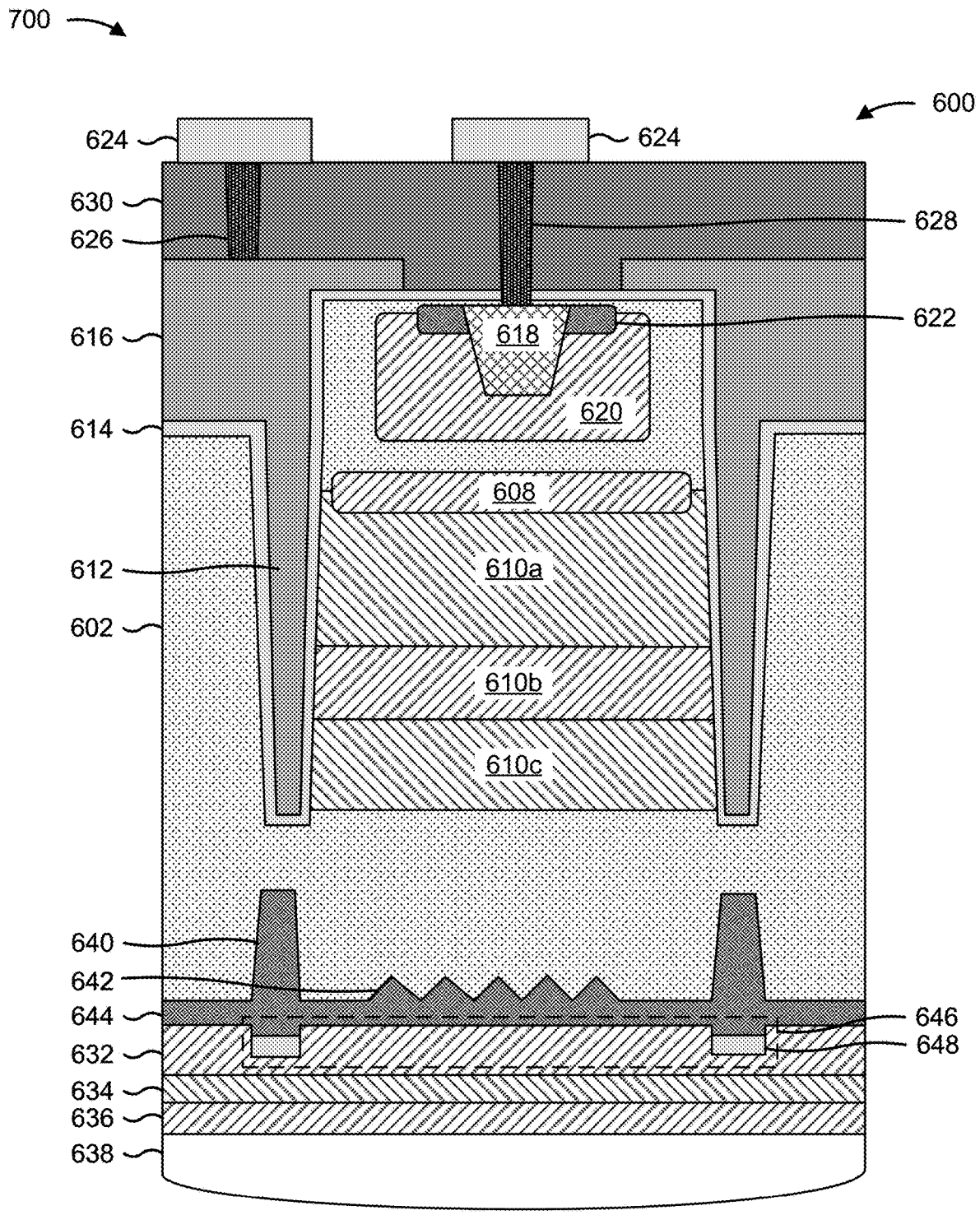

As shown in FIG. 7F, the dielectric layer 632, the ARC 634, the color filter layer 636, and the micro-lens layer 638 may be formed over the back side of the substrate 602. The deposition tool 102 may deposit the dielectric layer 632, the ARC 634, the color filter layer 636, and the micro-lens layer 638 using a CVD technique, a PVD technique, an ALD technique, or another type of deposition technique. The dielectric layer 632 may be formed over and/or on the oxide layer 644 and between the interconnected columns of the grid structure 646. The ARC 634 may be formed over and/or on the dielectric layer 632. The color filter layer 636 may be formed over and/or on the ARC 634. The micro-lens layer 638 may be formed over and/or on the color filter layer 636. The planarization tool 110 may planarize the dielectric layer 632, the ARC 634, and the color filter layer 636.

As indicated above, FIGS. 7A-7F are provided as an example. Other examples may differ from what is described with regard to FIGS. 7A-7F.

Figure 8:
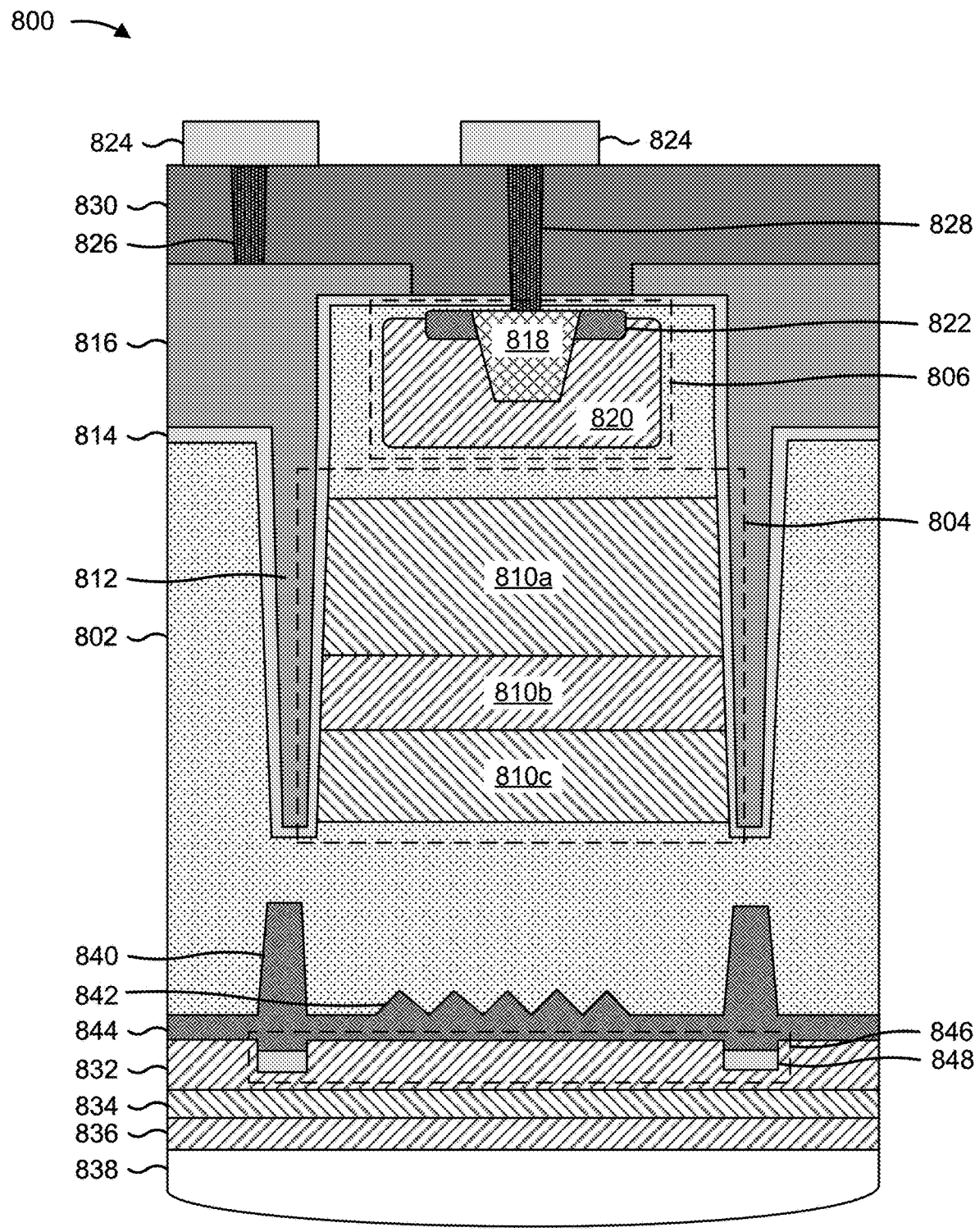
FIGS. 8-16 are diagrams of example pixel sensors described herein.

FIG. 8 is a diagram of an example pixel sensor 800 described herein. FIG. 8 may include a cross-section view of the pixel sensor 800. The pixel sensor 800 may include a similar arrangement of components and/or structures as the pixel sensor 600, except that the p-type region is omitted from the photodiode region. Since the floating diffusion region is stacked and/or vertically arranged over the photodiode region, the p-type region in the floating diffusion region may facilitate the generation of photocurrent in the photodiode region and may protect the one or more n-type regions in the photodiode region against noise from the layers above the substrate. Omitting the p-type region from the photodiode region may decrease the manufacturing complexity of the pixel sensor 800. The pixel sensor 800 may be formed by one or more techniques and/or operations described above in connection with FIGS. 5A-5J and/or FIGS. 7A-7F.

In some implementations, the pixel sensor 800 may be configured as a square-shaped pixel sensor 202 and included in the pixel array 200. In some implementations, the pixel sensor 800 may be configured as an octagon-shaped pixel sensor 302 or a square-shaped pixel sensor 304 and included in the pixel array 300. In some implementations, the pixel sensor 800 may be included in an image sensor. The image sensor may be a CMOS image sensor, a BSI CMOS image sensor, or another type of image sensor.

As shown in FIG. 8, the pixel sensor 800 may include a substrate 802, a photodiode region 804, and a floating diffusion region 806. The floating diffusion region 806 may be included above and over the photodiode region 804 such that the floating diffusion region 806 and the photodiode region 804 are stacked and/or vertically arranged. The photodiode region 804 may include one or more n-type regions 810 (e.g., an n-type region 810a, an n-type region 810b, and an n-type region 810c). A p-type region is omitted from the photodiode region 804, as described above. A DTI structure 812 may surround the photodiode region 804, and may be lined with a gate oxide layer 814. The DTI structure 812 may be filled with a gate material that also forms a poly gate region 816 around the floating diffusion region 806. The floating diffusion region 806 may include a drain region 818, a p-type region 820, and one or more extension regions 822. The poly gate region 816 and the drain region 818 may be electrically connected with a metallization layer 824 respectively by a contact plug 826 and a contact plug 828. The contact plug 826 and the contact plug 828 may be included in a dielectric layer 830.

A dielectric layer 832 may be included over the back side of the substrate 802. An ARC 834 may be included above and/or on the dielectric layer 832. A color filter layer 836 may be included above and/or on the ARC 834. A micro-lens layer 838 may be included above and/or on the color filter layer 836. An isolation structure 840 and one or more high absorption regions 842 may be included in the back side of the substrate 802 below the dielectric layer 832. An oxide layer 844 may be included above the substrate 802, the isolation structure 840, and the one or more high absorption regions 842. Moreover, the material of the oxide layer 844 may fill the isolation structure 840 and the one or more high absorption regions 842. A grid structure 846 may be included over and/or above the isolation structure 840. The grid structure 846 may include portions of the oxide layer 844 and a metal shielding layer 848 on the portions of the oxide layer 844.

As indicated above, FIG. 8 is provided as an example. Other examples may differ from what is described with regard to FIG. 8.

Figure 9:
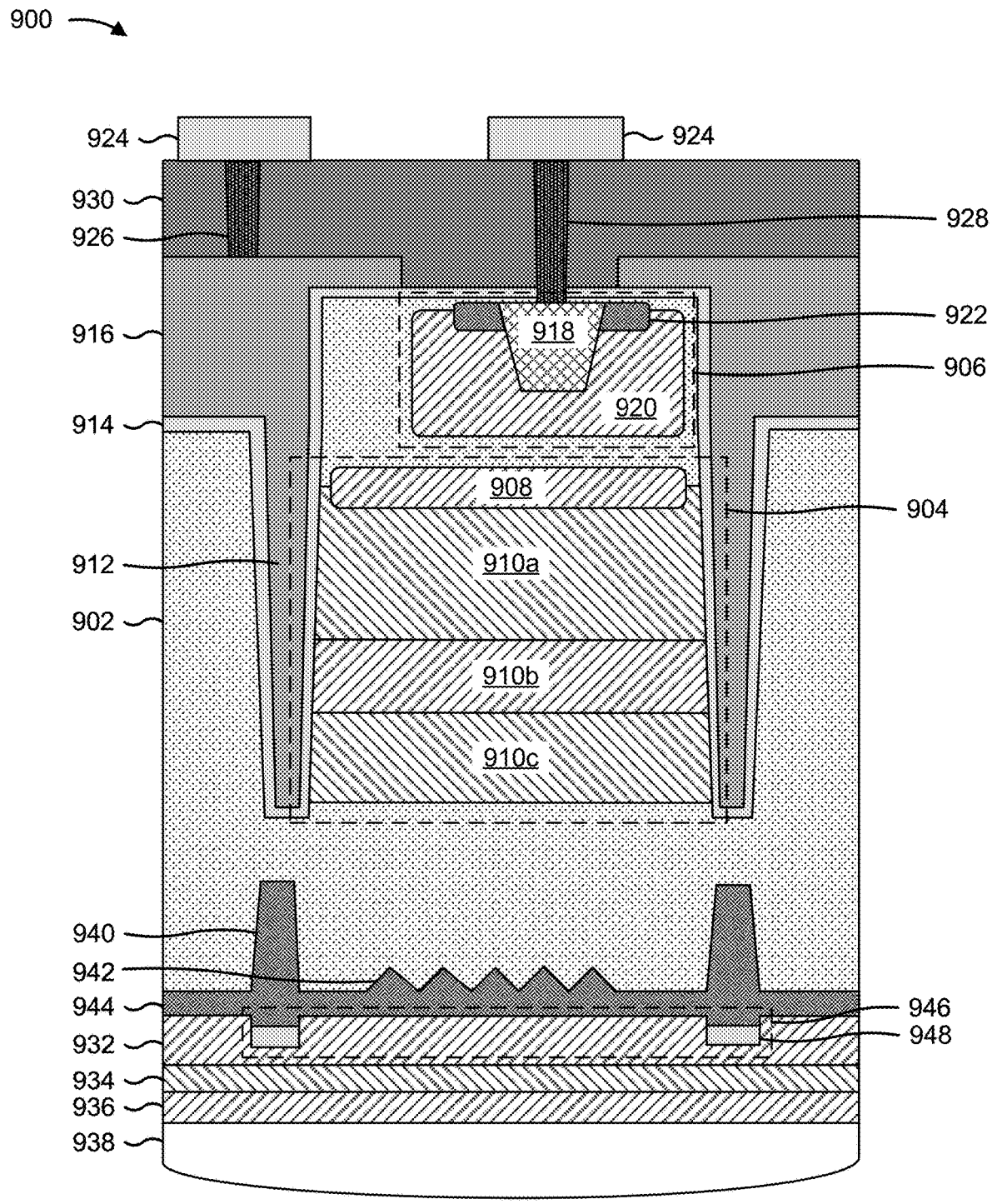

FIG. 9 is a diagram of an example pixel sensor 900 described herein. FIG. 9 may include a cross-section view of the pixel sensor 900. The pixel sensor 900 may include a similar arrangement of components and/or structures as the pixel sensor 600, except that the floating diffusion region is off-centered relative to the photodiode region. The off-centered floating diffusion region may permit flexible placement of the contact plug and/or the metallization layer that connects to the drain region in the floating diffusion region, and/or may provide a larger conductive channel in one or more areas of the substrate surrounding the floating diffusion region. The pixel sensor 900 may be formed by one or more techniques and/or operations described above in connection with FIGS. 5A-5J and/or FIGS. 7A-7F.

In some implementations, the pixel sensor 900 may be configured as a square-shaped pixel sensor 202 and included in the pixel array 200. In some implementations, the pixel sensor 900 may be configured as an octagon-shaped pixel sensor 302 or a square-shaped pixel sensor 304 and included in the pixel array 300. In some implementations, the pixel sensor 900 may be included in an image sensor. The image sensor may be a CMOS image sensor, a BSI CMOS image sensor, or another type of image sensor.

As shown in FIG. 9, the pixel sensor 900 may include a substrate 902, a photodiode region 904, and a floating diffusion region 906. The floating diffusion region 906 may be included above and over the photodiode region 904 such that the floating diffusion region 906 and the photodiode region 904 are stacked and/or vertically arranged. Moreover, the floating diffusion region 906 may be off-centered relative to the photodiode region 904 (e.g., positioned approximately near a side of the photodiode region 904, as shown in the example in FIG. 9). The photodiode region 904 may include a p-type region 908 and one or more n-type regions 910 (e.g., an n-type region 910a, an n-type region 910b, and an n-type region 910c). A DTI structure 912 may surround the photodiode region 904, and may be lined with a gate oxide layer 914. The DTI structure 912 may be filled with a gate material that also forms a poly gate region 916 around the floating diffusion region 906. The floating diffusion region 906 may include a drain region 918, a p-type region 920, and one or more extension regions 922. The poly gate region 916 and the drain region 918 may be electrically connected with a metallization layer 924 respectively by a contact plug 926 and a contact plug 928. The contact plug 926 and the contact plug 928 may be included in a dielectric layer 930.

A dielectric layer 932 may be included over the back side of the substrate 902. An ARC 934 may be included above and/or on the dielectric layer 932. A color filter layer 936 may be included above and/or on the ARC 934. A micro-lens layer 938 may be included above and/or on the color filter layer 936. An isolation structure 940 and one or more high absorption regions 942 may be included in the back side of the substrate 902 below the dielectric layer 932. An oxide layer 944 may be included above the substrate 902, the isolation structure 940, and the one or more high absorption regions 942. Moreover, the material of the oxide layer 944 may fill the isolation structure 940 and the one or more high absorption regions 942. A grid structure 946 may be included over and/or above the isolation structure 940. The grid structure 946 may include portions of the oxide layer 944 and a metal shielding layer 948 on the portions of the oxide layer 944.

As indicated above, FIG. 9 is provided as an example. Other examples may differ from what is described with regard to FIG. 9.

Figure 10:
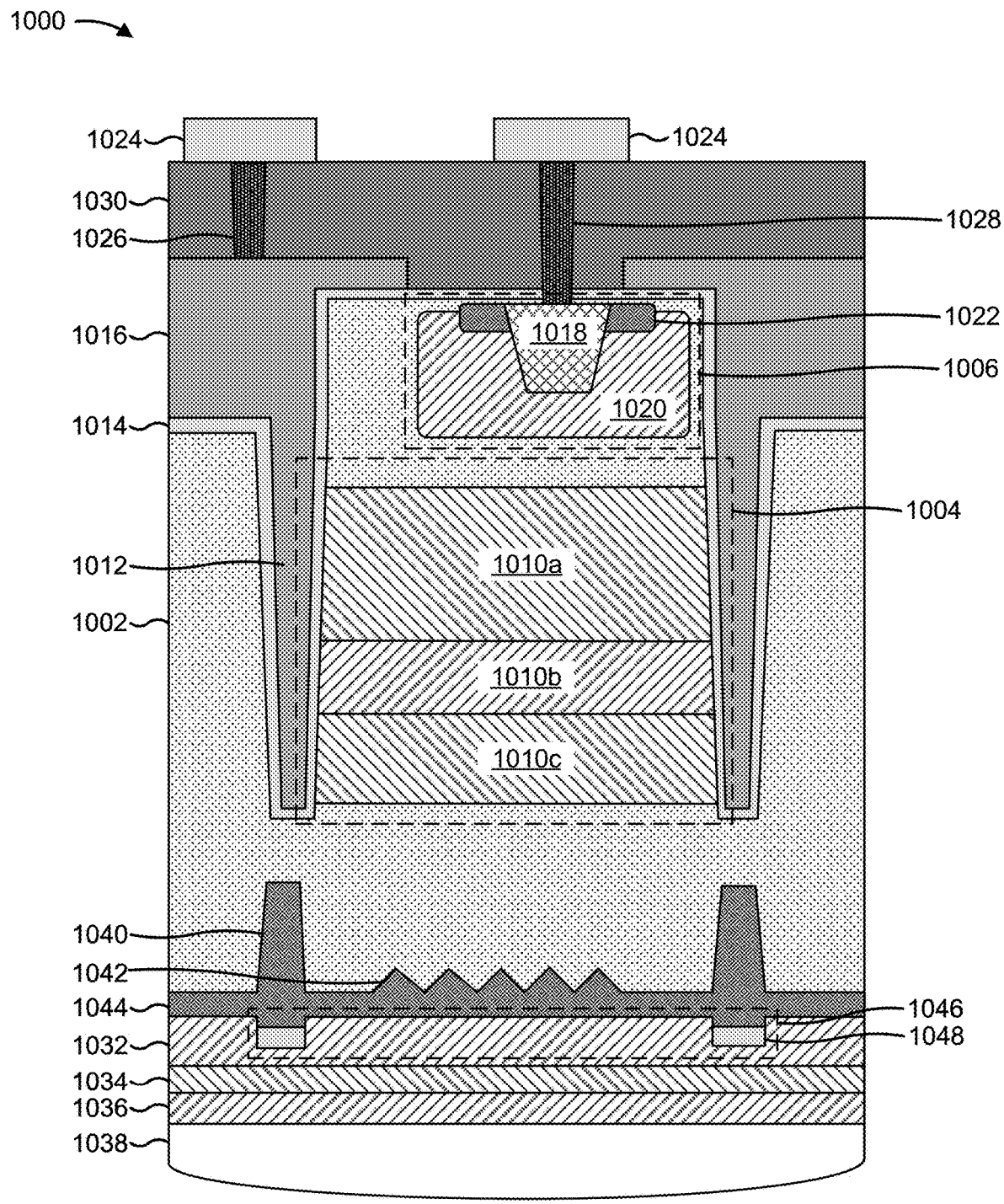

FIG. 10 is a diagram of an example pixel sensor 1000 described herein. FIG. 10 may include a cross-section view of the pixel sensor 1000. The pixel sensor 1000 may include a similar arrangement of components and/or structures as the pixel sensor 900, except that the p-type region is omitted from the photodiode region. Since the floating diffusion region is stacked and/or vertically arranged over the photodiode region, the p-type region in the floating diffusion region may facilitate the generation of photocurrent in the photodiode region and may protect the one or more n-type regions in the photodiode region against noise from the layers above the substrate. Omitting the p-type region from the photodiode region may decrease the manufacturing complexity of the pixel sensor 1000. The pixel sensor 1000 may be formed by one or more techniques and/or operations described above in connection with FIGS. 5A-5J and/or FIGS. 7A-7F.

In some implementations, the pixel sensor 1000 may be configured as a square-shaped pixel sensor 202 and included in the pixel array 200. In some implementations, the pixel sensor 1000 may be configured as an octagon-shaped pixel sensor 302 or a square-shaped pixel sensor 304 and included in the pixel array 300. In some implementations, the pixel sensor 1000 may be included in an image sensor. The image sensor may be a CMOS image sensor, a BSI CMOS image sensor, or another type of image sensor.

As shown in FIG. 10, the pixel sensor 1000 may include a substrate 1002, a photodiode region 1004, and a floating diffusion region 1006. The floating diffusion region 1006 may be included above and over the photodiode region 1004 such that the floating diffusion region 1006 and the photodiode region 1004 are stacked and/or vertically arranged. Moreover, the floating diffusion region 1006 may be off-centered relative to the photodiode region 1004 (e.g., positioned approximately near a side of the photodiode region 1004, as shown in the example in FIG. 10). The photodiode region 1004 may include one or more n-type regions 1010 (e.g., an n-type region 1010*a*, an n-type region 1010*b*, and an n-type region 1010*c*). A p-type region is omitted from the photodiode region 1004, as described above. A DTI structure 1012 may surround the photodiode region 1004, and may be lined with a gate oxide layer 1014. The DTI structure 1012 may be filled with a gate material that also forms a poly gate region 1016 around the floating diffusion region 1006. The floating diffusion region 1006 may include a drain region 1018, a p-type region 1020, and one or more extension regions 1022. The poly gate region 1016 and the drain region 1018 may be electrically connected with a metallization layer 1024 respectively by a contact plug 1026 and a contact plug 1028. The contact plug 1026 and the contact plug 1028 may be included in a dielectric layer 1030.

A dielectric layer 1032 may be included over the back side of the substrate 1002. An ARC 1034 may be included above and/or on the dielectric layer 1032. A color filter layer 1036 may be included above and/or on the ARC 1034. A microlens layer 1038 may be included above and/or on the color filter layer 1036. An isolation structure 1040 and one or more high absorption regions 1042 may be included in the back side of the substrate 1002 below the dielectric layer 1032. An oxide layer 1044 may be included above the substrate 1002, the isolation structure 1040, and the one or more high absorption regions 1042. Moreover, the material of the oxide layer 1044 may fill the isolation structure 1040 and the one or more high absorption regions 1042. A grid structure 1046 may be included over and/or above the isolation structure 1040. The grid structure 1046 may include portions of the oxide layer 1044 and a metal shielding layer 1048 on the portions of the oxide layer 1044.

As indicated above, FIG. 10 is provided as an example. Other examples may differ from what is described with regard to FIG. 10.

Figure 11:
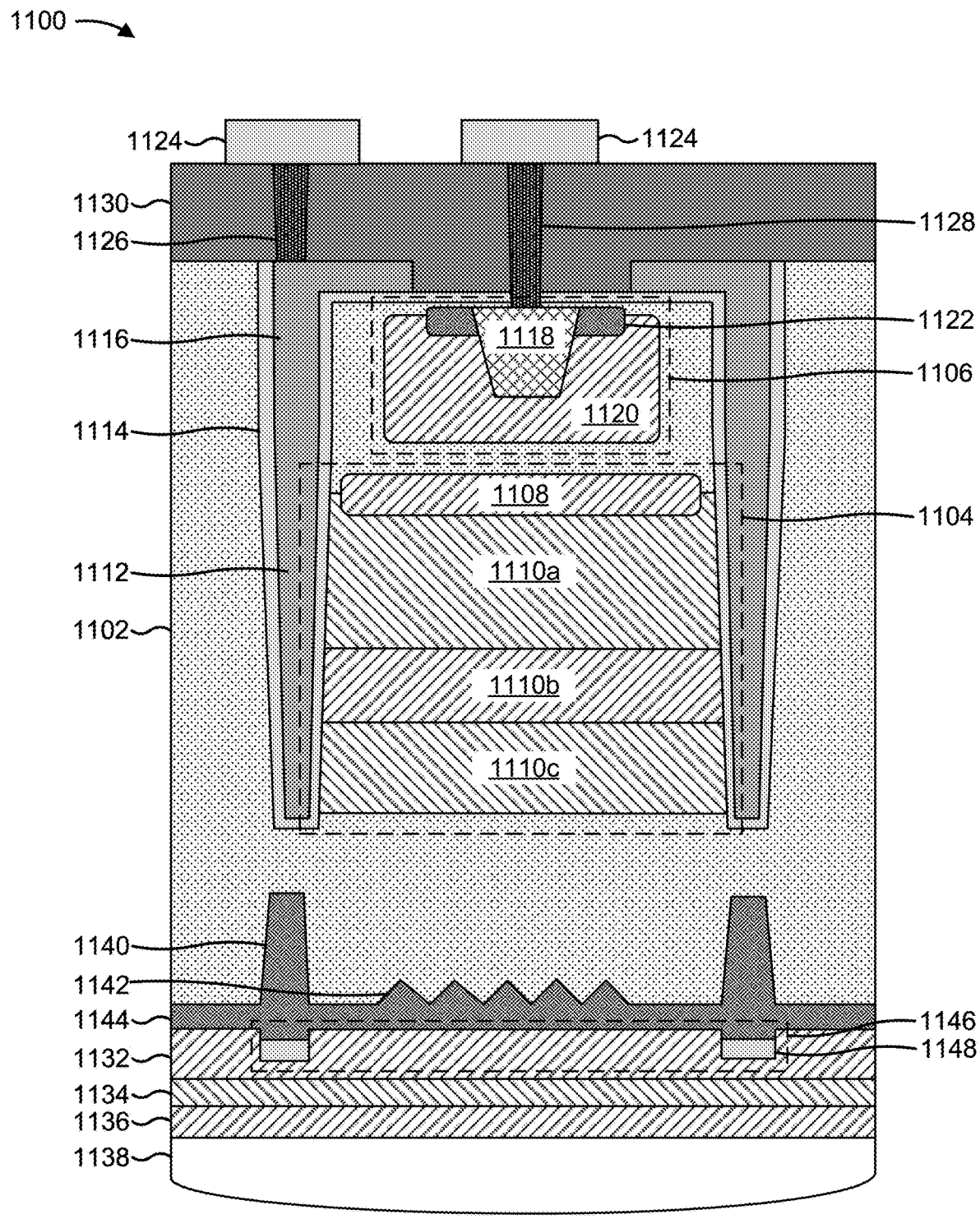

FIG. 11 is a diagram of an example pixel sensor 1100 described herein. FIG. 11 may include a cross-section view of the pixel sensor 1100. The pixel sensor 1100 may include a similar arrangement of components and/or structures as the pixel sensor 600, except that the size (e.g., the width) of the poly gate region is reduced. In particular, the width of the poly gate region may be approximately equal to the width of the DTI structure. The size of the poly gate region may be reduced to reduce the overall size (e.g., the width or diameter) of the pixel sensor 1100 while still providing fast switching speeds and precise control over the transfer of photocurrent between the photodiode region and the floating diffusion region. The pixel sensor 1100 may be formed by one or more techniques and/or operations described above in connection with FIGS. 5A-5J and/or FIGS. 7A-7F.

In some implementations, the pixel sensor 1100 may be configured as a square-shaped pixel sensor 202 and included in the pixel array 200. In some implementations, the pixel sensor 1100 may be configured as an octagon-shaped pixel sensor 302 or a square-shaped pixel sensor 304 and included in the pixel array 300. In some implementations, the pixel sensor 1100 may be included in an image sensor. The image sensor may be a CMOS image sensor, a BSI CMOS image sensor, or another type of image sensor.

As shown in FIG. 11, the pixel sensor 1100 may include a substrate 1102, a photodiode region 1104, and a floating diffusion region 1106. The floating diffusion region 1106 may be included above and over the photodiode region 1104 such that the floating diffusion region 1106 and the photodiode region 1104 are stacked and/or vertically arranged. The photodiode region 1104 may include a p-type region 1108 and one or more n-type regions 1110 (e.g., an n-type region 1110*a*, an n-type region 1110*b*, and an n-type region 1110*c*). A DTI structure 1112 may surround the photodiode region 1104, and may be lined with a gate oxide layer 1114. The DTI structure 1112 may be filled with a gate material that also forms a poly gate region 1116 around the floating diffusion region 1106. The width of the poly gate region 1116 may be approximately the same as the width of the DTI structure 1112 (e.g., the largest width or the width of the opening of the DTI structure 1112). The floating diffusion region 1106 may include a drain region 1118, a p-type region 1120, and one or more extension regions 1122. The poly gate region 1116 and the drain region 1118 may be electrically connected with a metallization layer 1124 respectively by a contact plug 1126 and a contact plug 1128. The contact plug 1126 and the contact plug 1128 may be included in a dielectric layer 1130.

A dielectric layer 1132 may be included over the back side of the substrate 1102. An ARC 1134 may be included above and/or on the dielectric layer 1132. A color filter layer 1136 may be included above and/or on the ARC 1134. A microlens layer 1138 may be included above and/or on the color filter layer 1136. An isolation structure 1140 and one or more high absorption regions 1142 may be included in the back side of the substrate 1102 below the dielectric layer 1132. An oxide layer 1144 may be included above the substrate 1102, the isolation structure 1140, and the one or more high absorption regions 1142. Moreover, the material of the oxide layer 1144 may fill the isolation structure 1140 and the one or more high absorption regions 1142. A grid structure 1146 may be included over and/or above the isolation structure 1140. The grid structure 1146 may include portions of the oxide layer 1144 and a metal shielding layer 1148 on the portions of the oxide layer 1144.

As indicated above, FIG. 11 is provided as an example. Other examples may differ from what is described with regard to FIG. 11.

Figure 12:
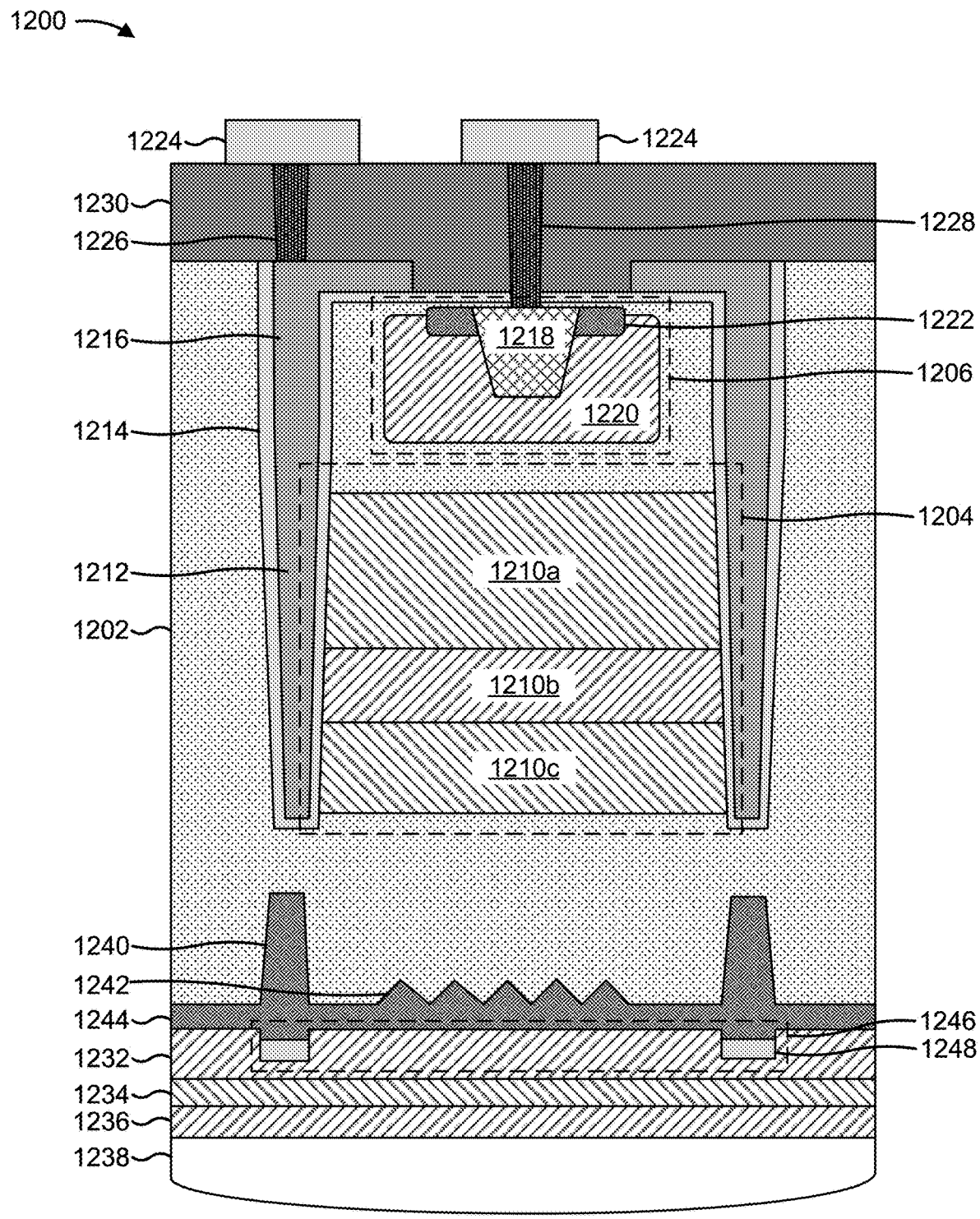

FIG. 12 is a diagram of an example pixel sensor 1200 described herein. FIG. 12 may include a cross-section view of the pixel sensor 1200. The pixel sensor 1200 may include a similar arrangement of components and/or structures as the pixel sensor 1100, except that the p-type region is omitted from the photodiode region. Since the floating diffusion region is stacked and/or vertically arranged over the photodiode region, the p-type region in the floating diffusion region may facilitate the generation of photocurrent in the photodiode region and may protect the one or more n-type regions in the photodiode region against noise from the layers above the substrate. Omitting the p-type region from the photodiode region may decrease the manufacturing complexity of the pixel sensor 1200. The pixel sensor 1200 may be formed by one or more techniques and/or operations described above in connection with FIGS. 5A-5J and/or FIGS. 7A-7F.

In some implementations, the pixel sensor 1200 may be configured as a square-shaped pixel sensor 202 and included in the pixel array 200. In some implementations, the pixel sensor 1200 may be configured as an octagon-shaped pixel sensor 302 or a square-shaped pixel sensor 304 and included in the pixel array 300. In some implementations, the pixel sensor 1200 may be included in an image sensor. The image sensor may be a CMOS image sensor, a BSI CMOS image sensor, or another type of image sensor.

As shown in FIG. 12, the pixel sensor 1200 may include a substrate 1202, a photodiode region 1204, and a floating diffusion region 1206. The floating diffusion region 1206 may be included above and over the photodiode region 1204 such that the floating diffusion region 1206 and the photodiode region 1204 are stacked and/or vertically arranged. The photodiode region 1204 may include one or more n-type regions 1210 (e.g., an n-type region 1210a, an n-type region 1210b, and an n-type region 1210c). A p-type region is omitted from the photodiode region 1204, as described above. A DTI structure 1212 may surround the photodiode region 1204, and may be lined with a gate oxide layer 1214. The DTI structure 1212 may be filled with a gate material that also forms a poly gate region 1216 around the floating diffusion region 1206. The width of the poly gate region 1216 may be approximately the same as the width of the DTI structure 1212 (e.g., the largest width or the width of the opening of the DTI structure 1212). The floating diffusion region 1206 may include a drain region 1218, a p-type region 1220, and one or more extension regions 1222. The poly gate region 1216 and the drain region 1218 may be electrically connected with a metallization layer 1224 respectively by a contact plug 1226 and a contact plug 1228. The contact plug 1226 and the contact plug 1228 may be included in a dielectric layer 1230.

A dielectric layer 1232 may be included over the back side of the substrate 1202. An ARC 1234 may be included above and/or on the dielectric layer 1232. A color filter layer 1236 may be included above and/or on the ARC 1234. A microlens layer 1238 may be included above and/or on the color filter layer 1236. An isolation structure 1240 and one or more high absorption regions 1242 may be included in the back side of the substrate 1202 below the dielectric layer 1232. An oxide layer 1244 may be included above the substrate 1202, the isolation structure 1240, and the one or more high absorption regions 1242. Moreover, the material of the oxide layer 1244 may fill the isolation structure 1240 and the one or more high absorption regions 1242. A grid structure 1246 may be included over and/or above the isolation structure 1240. The grid structure 1246 may include portions of the oxide layer 1244 and a metal shielding layer 1248 on the portions of the oxide layer 1244.

As indicated above, FIG. 12 is provided as an example. Other examples may differ from what is described with regard to FIG. 12.

Figure 13:
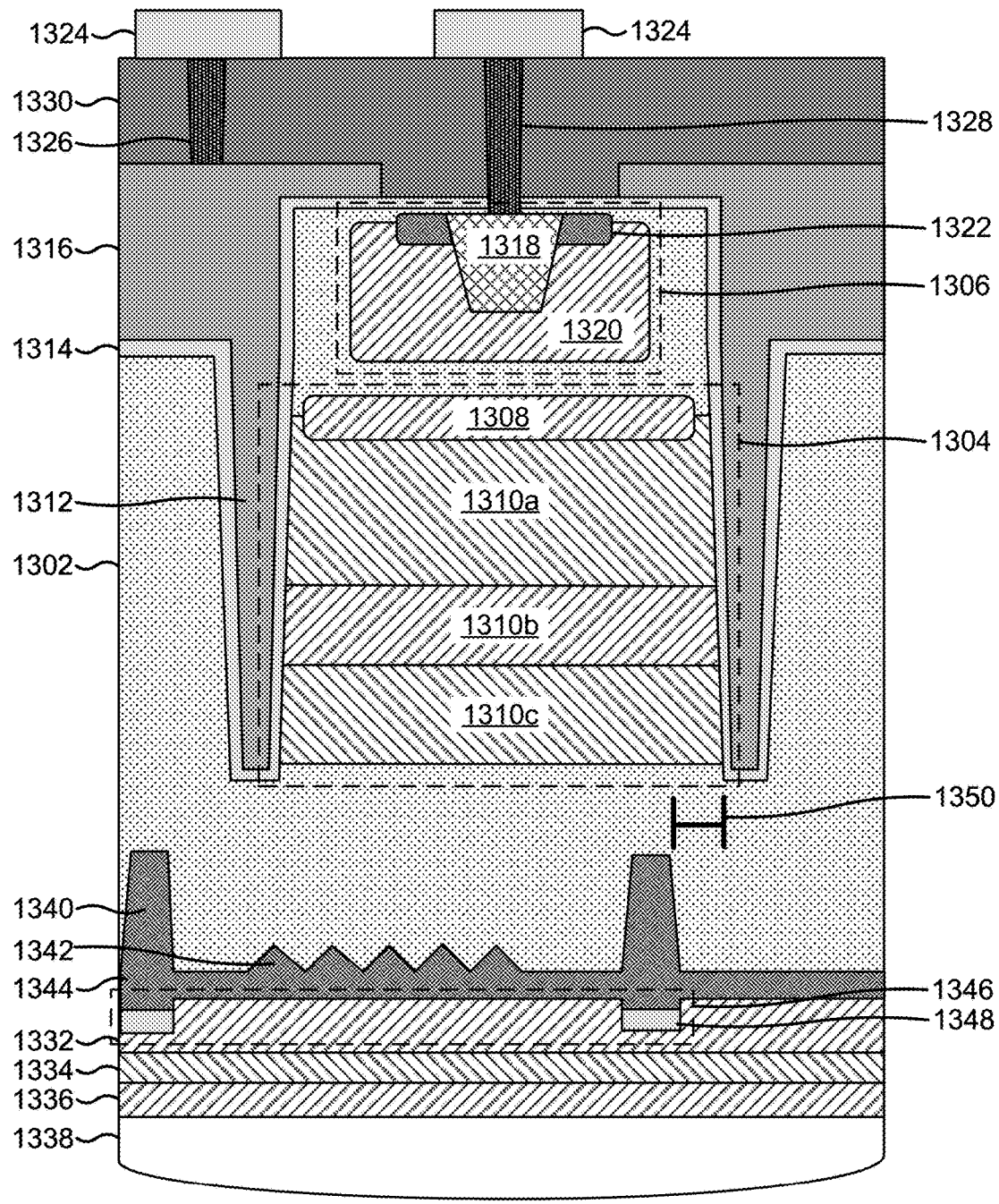

FIG. 13 is a diagram of an example pixel sensor 1300 described herein. FIG. 13 may include a cross-section view of the pixel sensor 1300. The pixel sensor 1300 may include a similar arrangement of components and/or structures as the pixel sensor 600, except that the isolation structure, the one or more high absorption regions, and the grid structure on the back side of the substrate are offset or off-centered relative to the photodiode region and the DTI structure. The offset of the isolation structure, the one or more high absorption regions, and the grid structure may enable the pixel sensor 1300 to more efficiently collect light from a particular angle (or angle range) and/or to collect a greater amount of off-centered light. The pixel sensor 1300 may be formed by one or more techniques and/or operations described above in connection with FIGS. 5A-5J and/or FIGS. 7A-7F.

In some implementations, the pixel sensor 1300 may be configured as a square-shaped pixel sensor 202 and included in the pixel array 200. In some implementations, the pixel sensor 1300 may be configured as an octagon-shaped pixel sensor 302 or a square-shaped pixel sensor 304 and included in the pixel array 300. In some implementations, the pixel sensor 1300 may be included in an image sensor. The image sensor may be a CMOS image sensor, a BSI CMOS image sensor, or another type of image sensor.

As shown in FIG. 13, the pixel sensor 1300 may include a substrate 1302, a photodiode region 1304, and a floating diffusion region 1306. The floating diffusion region 1306 may be included above and over the photodiode region 1304 such that the floating diffusion region 1306 and the photodiode region 1304 are stacked and/or vertically arranged. The photodiode region 1304 may include a p-type region 1308 and one or more n-type regions 1310 (e.g., an n-type region 1310a, an n-type region 1310b, and an n-type region 1310c). A DTI structure 1312 may surround the photodiode region 1304, and may be lined with a gate oxide layer 1314. The DTI structure 1312 may be filled with a gate material that also forms a poly gate region 1316 around the floating diffusion region 1306. The floating diffusion region 1306 may include a drain region 1318, a p-type region 1320, and one or more extension regions 1322. The poly gate region 1316 and the drain region 1318 may be electrically connected with a metallization layer 1324 respectively by a contact plug 1326 and a contact plug 1328. The contact plug 1326 and the contact plug 1328 may be included in a dielectric layer 1330.

A dielectric layer 1332 may be included over the back side of the substrate 1302. An ARC 1334 may be included above and/or on the dielectric layer 1332. A color filter layer 1336 may be included above and/or on the ARC 1334. A microlens layer 1338 may be included above and/or on the color filter layer 1336. An isolation structure 1340 and one or more high absorption regions 1342 may be included in the back side of the substrate 1302 below the dielectric layer 1332. An oxide layer 1344 may be included above the substrate 1302, the isolation structure 1340, and the one or more high absorption regions 1342. Moreover, the material of the oxide layer 1344 may fill the isolation structure 1340 and the one or more high absorption regions 1342. A grid structure 1346 may be included over and/or above the isolation structure 1340. The grid structure 1346 may include portions of the oxide layer 1344 and a metal shielding layer 1348 on the portions of the oxide layer 1344.

As described above, the isolation structure 1340, the one or more high absorption regions 1342, and the grid structure 1346 may be offset or off-centered relative to the photodiode region 1304 enable the photodiode region 1304 to more efficiently collect light from a particular angle (or angle range) and/or to collect a greater amount of off-centered light. The isolation structure 1340, the one or more high absorption regions 1342, and the grid structure 1346 may be offset or off-centered relative to the photodiode region 1304 in implementations in which incident light is expected to originate from an off-centered source to increase the quantum efficiency of the pixel sensor 1300. The isolation structure 1340, the one or more high absorption regions 1342, and the grid structure 1346 may be offset or off-centered relative to the photodiode region 1304 by an offset dimension 1350. The offset dimension 1350 may be equal to or less than approximately 250 nanometers. An offset greater than approximately 250 nanometers may result in the isolation structure 1340, the one or more high absorption regions 1342, and/or the grid structure 1346 occupying a large amount of area adjacent to the pixel sensor 1300, which may result in a large amount of unusable area adjacent to the pixel sensor 1300.

As indicated above, FIG. 13 is provided as an example. Other examples may differ from what is described with regard to FIG. 13.

Figure 14:
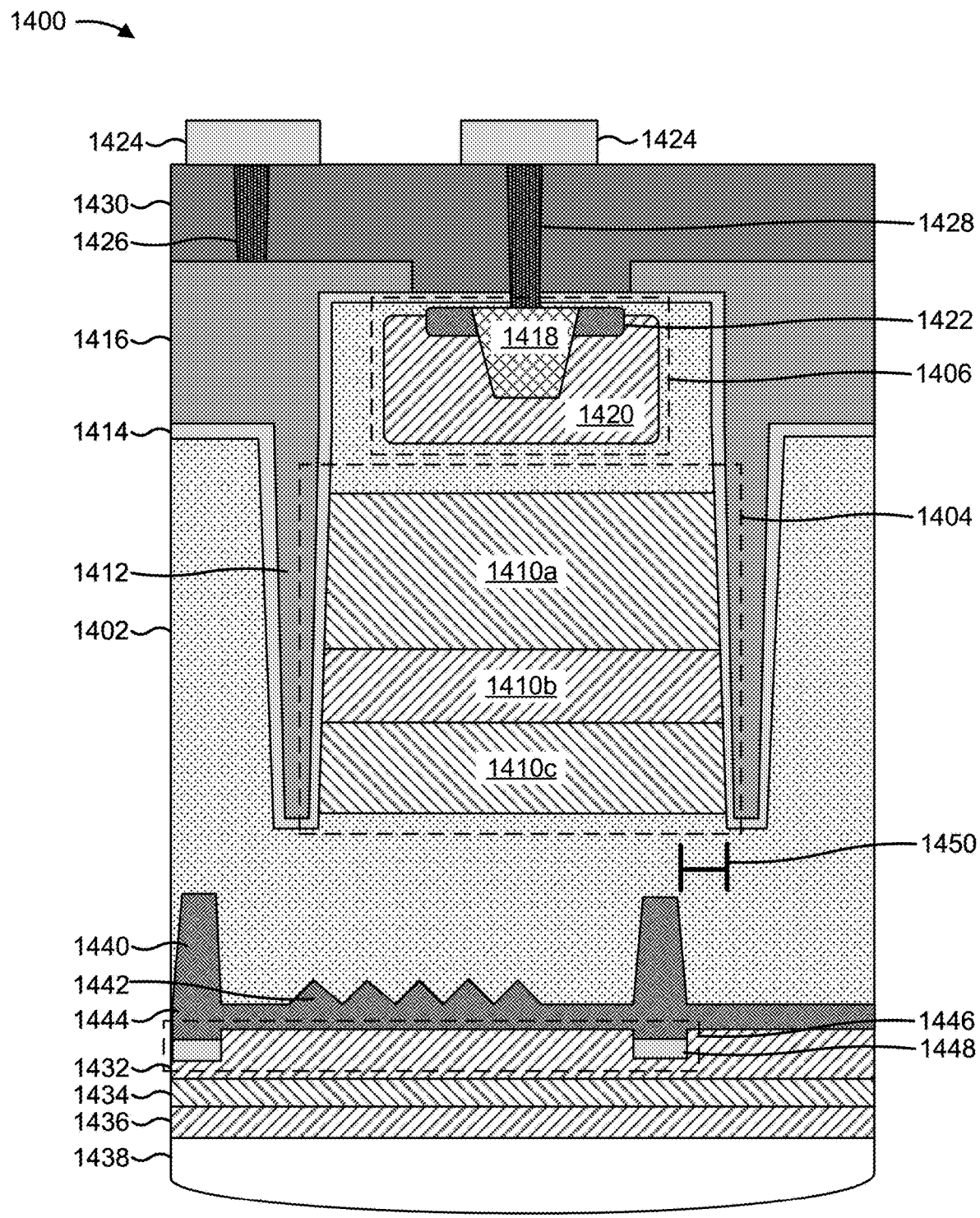

FIG. 14 is a diagram of an example pixel sensor 1400 described herein. FIG. 14 may include a cross-section view of the pixel sensor 1400. The pixel sensor 1400 may include a similar arrangement of components and/or structures as the pixel sensor 1300, except that the p-type region is omitted from the photodiode region. Since the floating diffusion region is stacked and/or vertically arranged over the photodiode region, the p-type region in the floating diffusion region may facilitate the generation of photocurrent in the photodiode region and may protect the one or more n-type regions in the photodiode region against noise from the layers above the substrate. Omitting the p-type region from the photodiode region may decrease the manufacturing complexity of the pixel sensor 1400. The pixel sensor 1400 may be formed by one or more techniques and/or operations described above in connection with FIGS. 5A-5J and/or FIGS. 7A-7F.

In some implementations, the pixel sensor 1400 may be configured as a square-shaped pixel sensor 202 and included in the pixel array 200. In some implementations, the pixel sensor 1400 may be configured as an octagon-shaped pixel sensor 302 or a square-shaped pixel sensor 304 and included in the pixel array 300. In some implementations, the pixel sensor 1400 may be included in an image sensor. The image sensor may be a CMOS image sensor, a BSI CMOS image sensor, or another type of image sensor.

As shown in FIG. 14, the pixel sensor 1400 may include a substrate 1402, a photodiode region 1404, and a floating diffusion region 1406. The floating diffusion region 1406 may be included above and over the photodiode region 1404 such that the floating diffusion region 1406 and the photodiode region 1404 are stacked and/or vertically arranged. The photodiode region 1404 may include one or more n-type regions 1410 (e.g., an n-type region 1410a, an n-type region 1410b, and an n-type region 1410c). A p-type region is omitted from the photodiode region 1404, as described above. A DTI structure 1412 may surround the photodiode region 1404, and may be lined with a gate oxide layer 1414. The DTI structure 1412 may be filled with a gate material that also forms a poly gate region 1416 around the floating diffusion region 1406. The floating diffusion region 1406 may include a drain region 1418, a p-type region 1420, and one or more extension regions 1422. The poly gate region 1416 and the drain region 1418 may be electrically connected with a metallization layer 1424 respectively by a contact plug 1426 and a contact plug 1428. The contact plug 1426 and the contact plug 1428 may be included in a dielectric layer 1430.

A dielectric layer 1432 may be included over the back side of the substrate 1402. An ARC 1434 may be included above and/or on the dielectric layer 1432. A color filter layer 1436 may be included above and/or on the ARC 1434. A microlens layer 1438 may be included above and/or on the color filter layer 1436. An isolation structure 1440 and one or more high absorption regions 1442 may be included in the back side of the substrate 1402 below the dielectric layer 1432. An oxide layer 1444 may be included above the substrate 1402, the isolation structure 1440, and the one or more high absorption regions 1442. Moreover, the material of the oxide layer 1444 may fill the isolation structure 1440 and the one or more high absorption regions 1442. A grid structure 1446 may be included over and/or above the isolation structure 1440. The grid structure 1446 may include portions of the oxide layer 1444 and a metal shielding layer 1448 on the portions of the oxide layer 1444. The isolation structure 1440, the one or more high absorption regions 1442, and the grid structure 1446 may be offset or off-centered relative to the photodiode region 1404 by an offset dimension 1450.

As indicated above, FIG. 14 is provided as an example. Other examples may differ from what is described with regard to FIG. 14.

Figure 15:
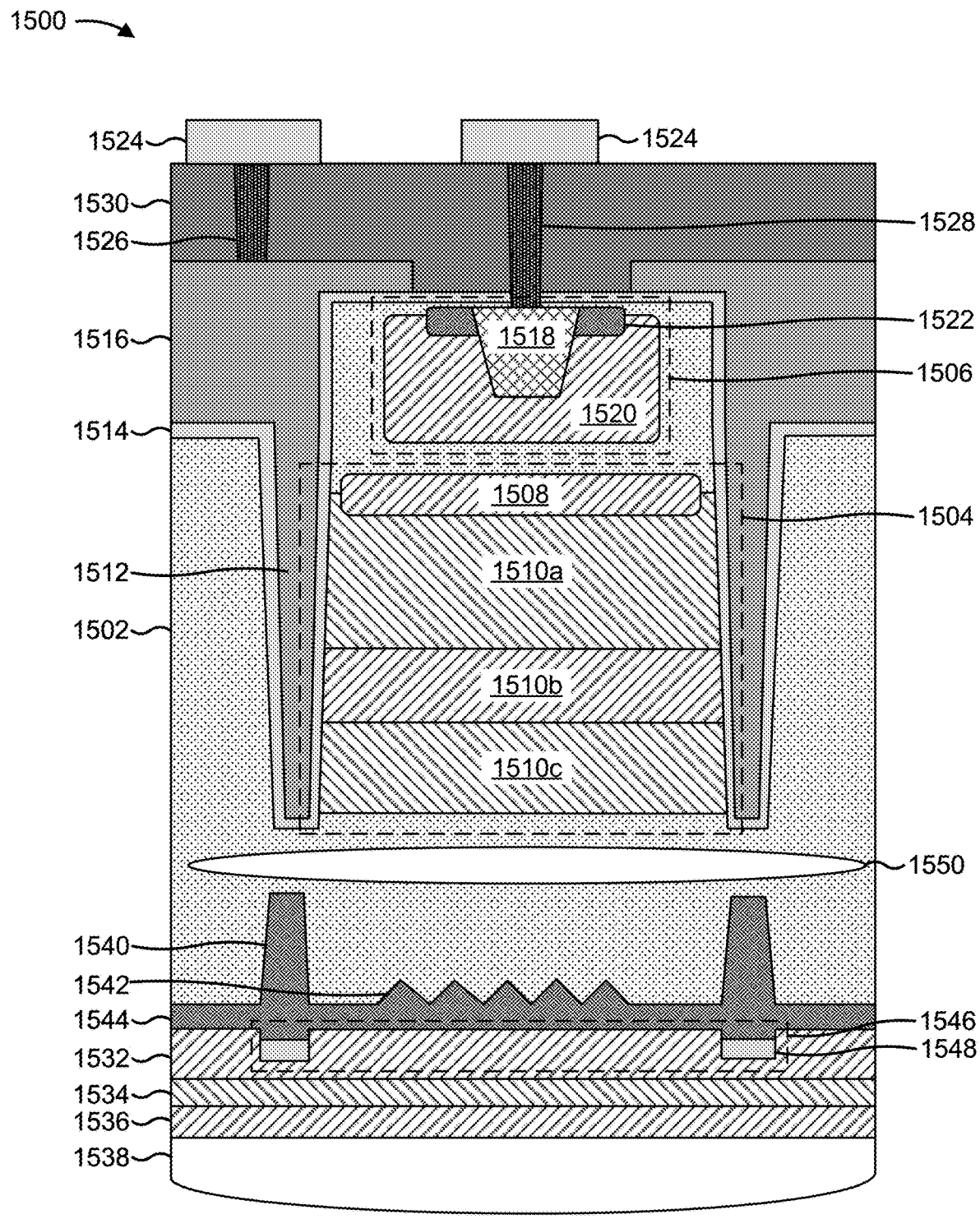

FIG. 15 is a diagram of an example pixel sensor 1500 described herein. FIG. 15 may include a cross-section view of the pixel sensor 1500. The pixel sensor 1500 may include a similar arrangement of components and/or structures as the pixel sensor 600. In addition, the pixel sensor 1500 may further include a deep n-type region, which may be referred to as an axial deep n-well or an array deep n-well (ADNW). The deep n-type region may be included in the substrate between the isolation structure and the DTI structure over the photodiode region. The deep n-type region may further facilitate the absorption of photons and the migration of electrons through the photodiode region. The pixel sensor 1500 may be formed by one or more techniques and/or operations described above in connection with FIGS. 5A-5J and/or FIGS. 7A-7F.

In some implementations, the pixel sensor 1500 may be configured as a square-shaped pixel sensor 202 and included in the pixel array 200. In some implementations, the pixel sensor 1500 may be configured as an octagon-shaped pixel sensor 302 or a square-shaped pixel sensor 304 and included in the pixel array 300. In some implementations, the pixel sensor 1500 may be included in an image sensor. The image sensor may be a CMOS image sensor, a BSI CMOS image sensor, or another type of image sensor.

As shown in FIG. 15, the pixel sensor 1500 may include a substrate 1502, a photodiode region 1504, and a floating diffusion region 1506. The floating diffusion region 1506 may be included above and over the photodiode region 1504 such that the floating diffusion region 1506 and the photodiode region 1504 are stacked and/or vertically arranged. The photodiode region 1504 may include a p-type region 1508 and one or more n-type regions 1510 (e.g., an n-type region 1510a, an n-type region 1510b, and an n-type region 1510c). A DTI structure 1512 may surround the photodiode region 1504, and may be lined with a gate oxide layer 1514. The DTI structure 1512 may be filled with a gate material that also forms a poly gate region 1516 around the floating diffusion region 1506. The floating diffusion region 1506 may include a drain region 1518, a p-type region 1520, and one or more extension regions 1522. The poly gate region 1516 and the drain region 1518 may be electrically connected with a metallization layer 1524 respectively by a contact plug 1526 and a contact plug 1528. The contact plug 1526 and the contact plug 1528 may be included in a dielectric layer 1530.

A dielectric layer 1532 may be included over the back side of the substrate 1502. An ARC 1534 may be included above and/or on the dielectric layer 1532. A color filter layer 1536 may be included above and/or on the ARC 1534. A microlens layer 1538 may be included above and/or on the color filter layer 1536. An isolation structure 1540 and one or more high absorption regions 1542 may be included in the back side of the substrate 1502 below the dielectric layer 1532. An oxide layer 1544 may be included above the substrate 1502, the isolation structure 1540, and the one or more high absorption regions 1542. Moreover, the material of the oxide layer 1544 may fill the isolation structure 1540 and the one or more high absorption regions 1542. A grid structure 1546 may be included over and/or above the isolation structure 1540. The grid structure 1546 may include portions of the oxide layer 1544 and a metal shielding layer 1548 on the portions of the oxide layer 1544.

As described above, the pixel sensor 1500 may further include a deep n-type region 1550 (e.g., an ADNW). The deep n-type region 1550 may be included in the substrate 1502 between the isolation structure 1540 and the DTI structure 1512 over the photodiode region 1504. The deep n-type region 1550 may further facilitate the absorption of photons and the migration of electrons through the photodiode region 1504. In some implementations, the deep n-type region 1550 may span across a plurality of pixel sensors (e.g., an array of pixel sensors) including the pixel sensor 1500.

As indicated above, FIG. 15 is provided as an example. Other examples may differ from what is described with regard to FIG. 15.

Figure 16:
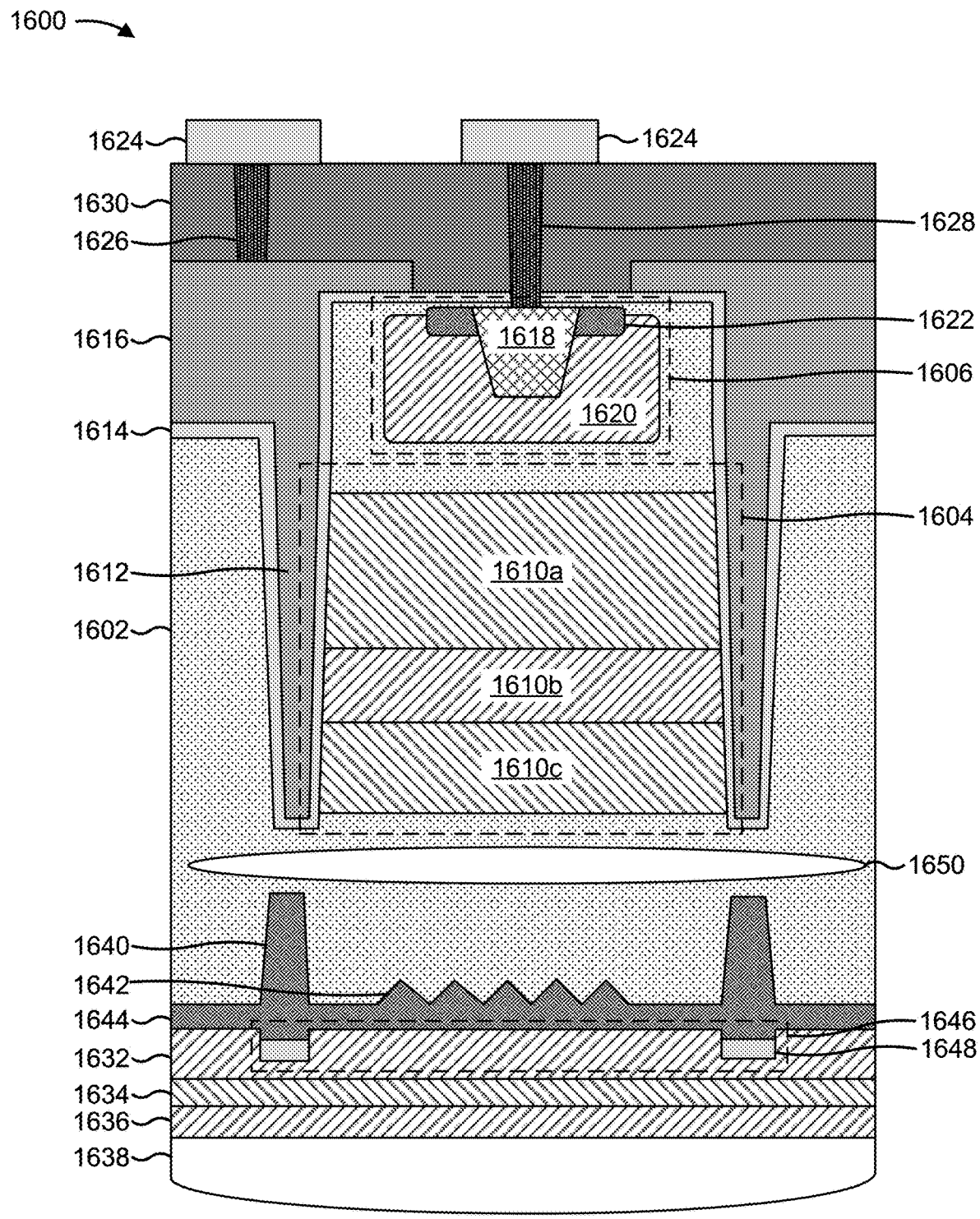

FIG. 16 is a diagram of an example pixel sensor 1600 described herein. FIG. 16 may include a cross-section view of the pixel sensor 1600. The pixel sensor 1600 may include a similar arrangement of components and/or structures as the pixel sensor 1500, except that the p-type region is omitted from the photodiode region. Since the floating diffusion region is stacked and/or vertically arranged over the photodiode region, the p-type region in the floating diffusion region may facilitate the generation of photocurrent in the photodiode region and may protect the one or more n-type regions in the photodiode region against noise from the layers above the substrate. Omitting the p-type region from the photodiode region may decrease the manufacturing complexity of the pixel sensor 1600. The pixel sensor 1600 may be formed by one or more techniques and/or operations described above in connection with FIGS. 5A-5J and/or FIGS. 7A-7F.

In some implementations, the pixel sensor 1600 may be configured as a square-shaped pixel sensor 202 and included in the pixel array 200. In some implementations, the pixel sensor 1600 may be configured as an octagon-shaped pixel sensor 302 or a square-shaped pixel sensor 304 and included in the pixel array 300. In some implementations, the pixel sensor 1600 may be included in an image sensor. The image sensor may be a CMOS image sensor, a BSI CMOS image sensor, or another type of image sensor.

As shown in FIG. 16, the pixel sensor 1600 may include a substrate 1602, a photodiode region 1604, and a floating diffusion region 1606. The floating diffusion region 1606 may be included above and over the photodiode region 1604 such that the floating diffusion region 1606 and the photodiode region 1604 are stacked and/or vertically arranged. The photodiode region 1604 may include one or more n-type regions 1610 (e.g., an n-type region 1610a, an n-type region 1610b, and an n-type region 1610c). A p-type region is omitted from the photodiode region 1604, as described above. A DTI structure 1612 may surround the photodiode region 1604, and may be lined with a gate oxide layer 1614. The DTI structure 1612 may be filled with a gate material that also forms a poly gate region 1616 around the floating diffusion region 1606. The floating diffusion region 1606 may include a drain region 1618, a p-type region 1620, and one or more extension regions 1622. The poly gate region 1616 and the drain region 1618 may be electrically connected with a metallization layer 1624 respectively by a contact plug 1626 and a contact plug 1628. The contact plug 1626 and the contact plug 1628 may be included in a dielectric layer 1630.

A dielectric layer 1632 may be included over the back side of the substrate 1602. An ARC 1634 may be included above and/or on the dielectric layer 1632. A color filter layer 1636 may be included above and/or on the ARC 1634. A microlens layer 1638 may be included above and/or on the color filter layer 1636. An isolation structure 1640 and one or more high absorption regions 1642 may be included in the back side of the substrate 1602 below the dielectric layer 1632. An oxide layer 1644 may be included above the substrate 1602, the isolation structure 1640, and the one or more high absorption regions 1642. Moreover, the material of the oxide layer 1644 may fill the isolation structure 1640 and the one or more high absorption regions 1642. A grid structure 1646 may be included over and/or above the isolation structure 1640. The grid structure 1646 may include portions of the oxide layer 1644 and a metal shielding layer 1648 on the portions of the oxide layer 1644.

The pixel sensor 1600 may further include a deep n-type region 1650 (e.g., an ADNW). The deep n-type region 1650 may be included in the substrate 1602 between the isolation structure 1640 and the DTI structure 1612 over the photodiode region 1604. The deep n-type region 1650 may further facilitate the absorption of photons and the migration of electrons through the photodiode region 1604. In some implementations, the deep n-type region 1650 may span across a plurality of pixel sensors (e.g., an array of pixel sensors) including the pixel sensor 1600.

As indicated above, FIG. 16 is provided as an example. Other examples may differ from what is described with regard to FIG. 16.

Figure 17:
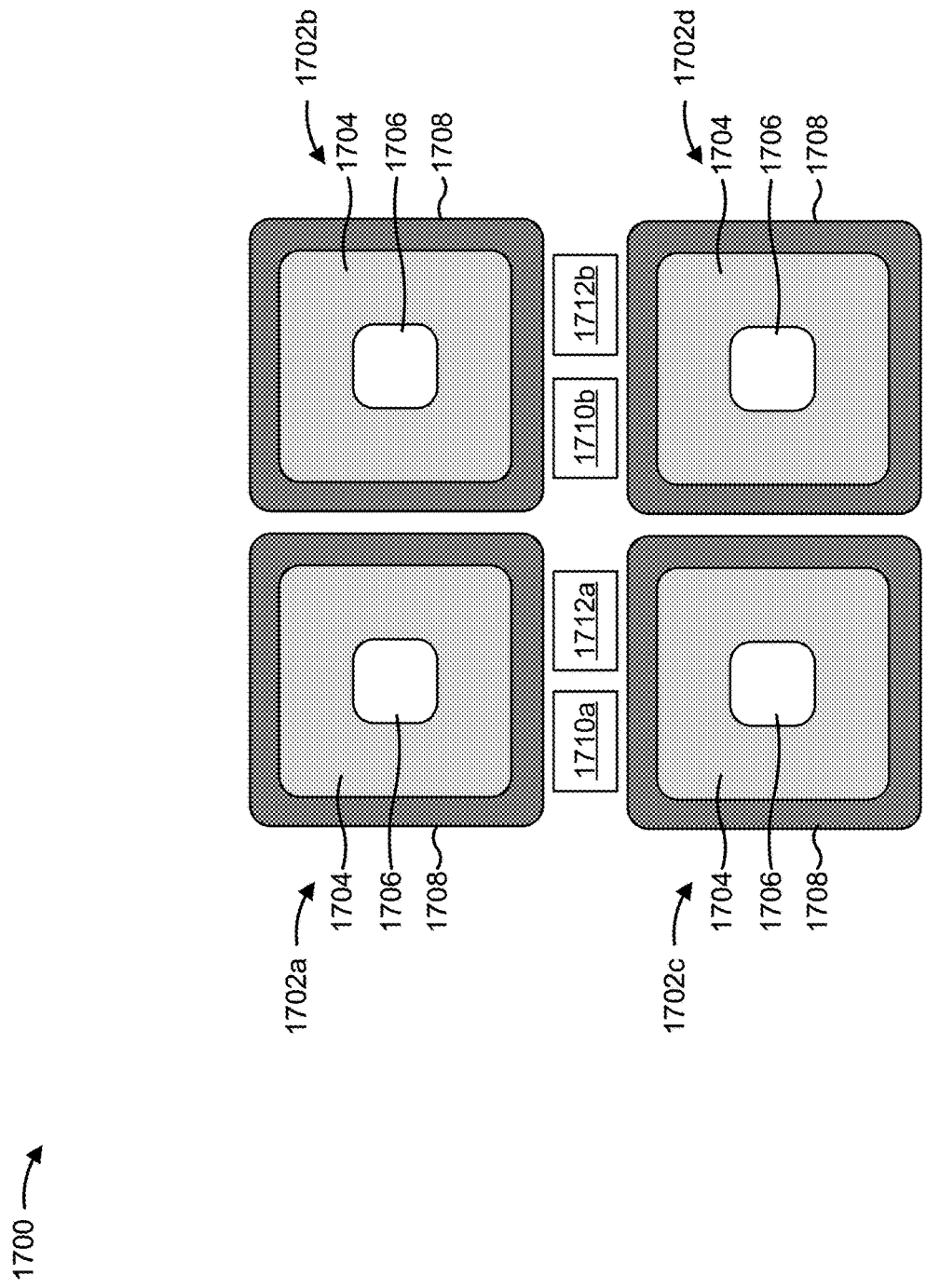
FIGS. 17-21 are diagrams of example pixel sensor configurations described herein.

FIG. 17 is a diagram of example pixel sensor configuration 1700 described herein. FIG. 17 may include a top-down view of the pixel sensor configuration 1700. The pixel sensor configuration 1700 may include a plurality of pixel sensors 1702, such as a pixel sensor 1702*a*, a pixel sensor 1702*b*, a pixel sensor 1702*c*, a pixel sensor 1702*d*, and so on. In some implementations, the pixel sensors 1702 are configured as square-shaped pixel sensors 202 included in the pixel array 200. In some implementations, the pixel sensors 1702 may be included in an image sensor. The image sensor may be a CMOS image sensor, a BSI CMOS image sensor, or another type of image sensor.

As shown in FIG. 17, the pixel sensors 1702 may be arranged in a grid in the pixel sensor configuration 1700. The pixel sensor 1702*a* may be adjacent to the pixel sensor 1702*b* and the pixel sensor 1702*c*, the pixel sensor 1702*b* may be adjacent to the pixel sensor 1702*a* and the pixel sensor 1702*d*, the pixel sensor 1702*c* may be adjacent to the pixel sensor 1702*a* and the pixel sensor 1702*d*, and the pixel sensor 1702*d* may be adjacent to the pixel sensor 1702*b* and the pixel sensor 1702*c*.

Each pixel sensor 1702 may include a photodiode region 1704, a floating diffusion region 1706, and a poly gate region 1708. The floating diffusion region 1706 may be positioned over the photodiode region 1704 such that the floating diffusion region 1706 and the photodiode region 1704 are stacked and/or vertically arranged. The pixel sensors 1702 may include a combination and arrangement of components and/or structures as one or more other pixel sensors described herein, such as the pixel sensor 400, 600, and/or 800-1600.

As shown in FIG. 17, the pixel sensor configuration 1700 may include a plurality of reset transistors 1710 (e.g., a reset transistor 1710*a* and a reset transistor 1710*b*) and a plurality of source-follower transistors 1712 (e.g., a source-follower transistor 1712*a* and a source-follower transistor 1712*b*). A reset transistor 1710 may be activated to set the drain region of a pixel sensor 1702 to a particular voltage prior to transferring a photocurrent from the photodiode region of the pixel sensor 1702. A source-follower transistor 1712 may convert a photocurrent from a drain region of a pixel sensor 1702 to a voltage.

Each reset transistor 1710 may be associated with and may control two or more pixel sensors 1702. This reduces the overall quantity of reset transistors 1710 in the pixel sensor configuration 1700, which permits the pixel sensors 1702 to be more closely spaced and permits a greater quantity of pixel sensors 1702 to be included in the pixel sensor configuration 1700. For example, the reset transistor 1710*a* may be located between, and may control, the pixel sensor 1702*a* and the pixel sensor 1702*c*. As another example, the reset transistor 1710*b* may be located between, and may control, the pixel sensor 1702*b* and the pixel sensor 1702*d*. In some implementations, the reset transistor 1710*a* is located between, and may control, the pixel sensor 1702*a* and the pixel sensor 1702*b*, and the reset transistor 1710*b* is be located between, and may control, the pixel sensor 1702*c* and the pixel sensor 1702*d*.

Each source-follower transistor 1712 may be associated with and may control two or more pixel sensors 1702. This reduces the overall quantity of source-follower transistors 1712 in the pixel sensor configuration 1700, which permits the pixel sensors 1702 to be more closely spaced and permits a greater quantity of pixel sensors 1702 to be included in the pixel sensor configuration 1700. For example, the source-follower transistor 1712*a* may be located between, and may control, the pixel sensor 1702*a* and the pixel sensor 1702*c*. As another example, the source-follower transistor 1712*b* may be located between, and may control, the pixel sensor 1702*b* and the pixel sensor 1702*d*. In some implementations, the source-follower transistor 1712*a* is located between, and may control, the pixel sensor 1702*a* and the pixel sensor 1702*b*, and the source-follower transistor 1712*b* is be located between, and may control, the pixel sensor 1702*c* and the pixel sensor 1702*d*.

As indicated above, FIG. 17 is provided as an example. Other examples may differ from what is described with regard to FIG. 17.

Figure 18:
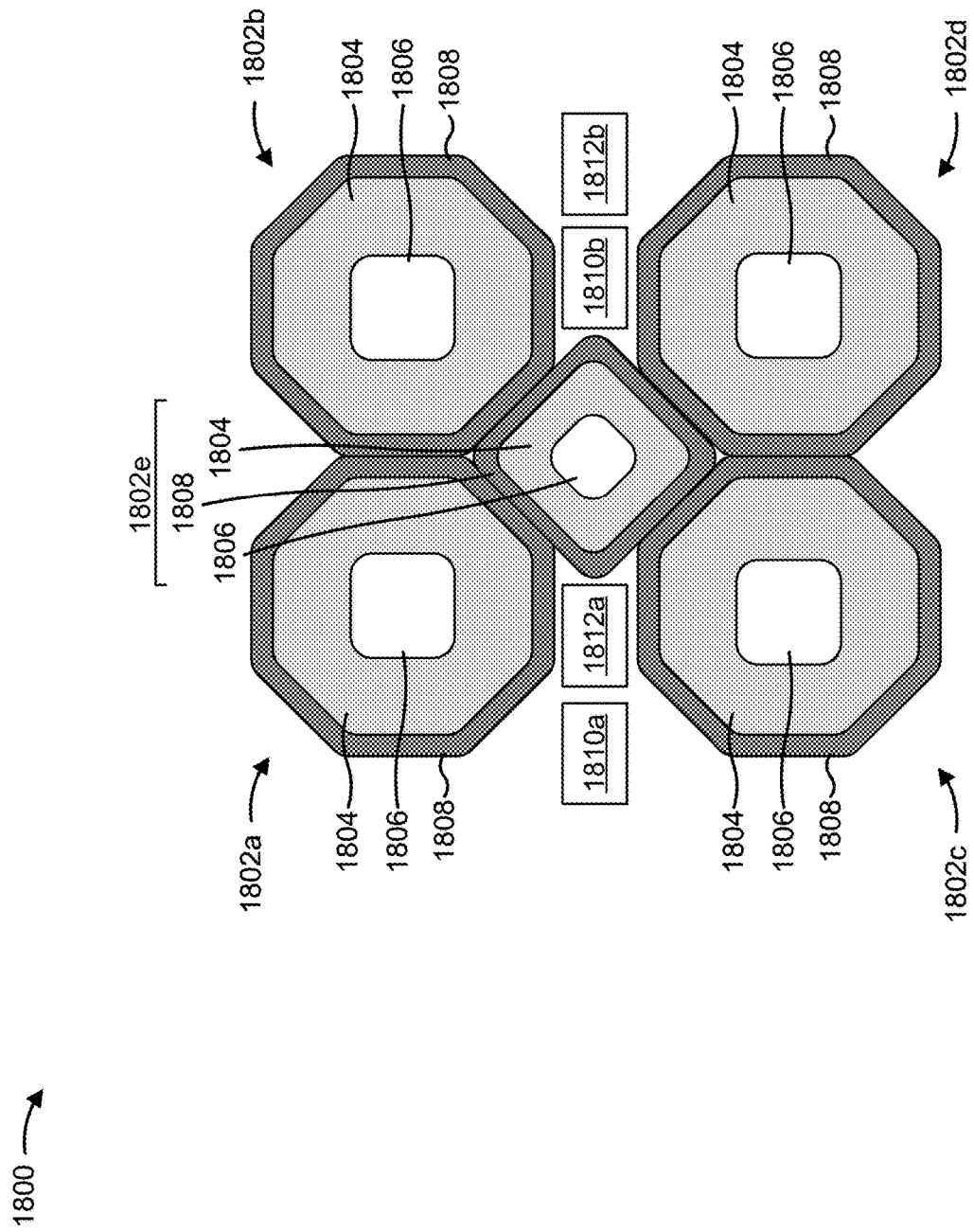

FIG. 18 is a diagram of example pixel sensor configuration 1800 described herein. FIG. 18 may include a top-down view of the pixel sensor configuration 1800. The pixel sensor configuration 1800 may include a plurality of pixel sensors 1802, such as a pixel sensor 1802*a*, a pixel sensor 1802*b*, a pixel sensor 1802*c*, a pixel sensor 1802*d*, a pixel sensor 1802*e*, and so on. In some implementations, a plurality of the pixel sensors 1802 are configured as octagon-shaped pixel sensors 302 included in the pixel array 300, and one or more of the pixel sensors 1802 are configured as square-shaped pixel sensors 304 in the pixel array 300. The combination of octagon-shaped pixel sensors and square shaped-pixel sensors may permit the pixel sensors 1802 to be more densely arranged in the pixel array, for example, by including a square-shaped pixel sensor between a plurality of octagon-shaped pixel sensors. As an example, the pixel sensor 1802*a*, the pixel sensor 1802*b*, the pixel sensor 1802*c*, and the pixel sensor 1802*d* may be configured as octagon-shaped pixel sensors, and the pixel sensor 1802*e* may be configured as a square-shaped pixel sensor between the octagon-shaped pixel sensors. Accordingly, the pixel sensor configuration 1800 may include five (5) pixel sensors relative to the four (4) pixel sensors of the pixel sensor configuration 1700.

As shown in FIG. 18, the pixel sensor 1802*a* may be adjacent to the pixel sensor 1802*b*, the pixel sensor 1802*c*, and the pixel sensor 1802*e*. The pixel sensor 1802*b* may be adjacent to the pixel sensor 1802*a*, the pixel sensor 1802*d*, and the pixel sensor 1802*e*. The pixel sensor 1802*c* may be adjacent to the pixel sensor 1802*a*, the pixel sensor 1802*d*, and the pixel sensor 1802*e*. The pixel sensor 1802*d* may be adjacent to the pixel sensor 1802*b*, the pixel sensor 1802*c*, and the pixel sensor 1802*e*. As described above, the pixel sensor 1802*e* may be located in between the pixel sensors 1802*a*, 1802*b*, 1802*c*, and 1802*d*.

Each pixel sensor 1802 may include a photodiode region 1804, a floating diffusion region 1806, and a poly gate region 1808. The floating diffusion region 1806 may be positioned over the photodiode region 1804 such that the floating diffusion region 1806 and the photodiode region 1804 are stacked and/or vertically arranged. The pixel sensors 1802 may include a combination and arrangement of components and/or structures as one or more other pixel sensors described herein, such as the pixel sensor 400, 600, and/or 800-1600.

As shown in FIG. 18, the pixel sensor configuration 1800 may include a plurality of reset transistors 1810 (e.g., a reset transistor 1810*a* and a reset transistor 1810*b*) and a plurality of source-follower transistors 1812 (e.g., a source-follower transistor 1812*a* and a source-follower transistor 1812*b*). Each reset transistor 1810 may be associated with and may control two or more pixel sensors 1802. This reduces the overall quantity of reset transistors 1810 in the pixel sensor configuration 1800, which permits the pixel sensors 1802 to be more closely spaced and permits a greater quantity of pixel sensors 1802 to be included in the pixel sensor configuration 1800. For example, the reset transistor 1810*a* may be located between, and may control, the pixel sensor 1802*a* and the pixel sensor 1802*c*. As another example, the reset transistor 1810*b* may be located between, and may control, the pixel sensor 1802*b* and the pixel sensor 1802*d*. In some implementations, the reset transistor 1810*a* is located between, and may control, the pixel sensor 1802*a* and the pixel sensor 1802*b*, and the reset transistor 1810*b* is be located between, and may control, the pixel sensor 1802*c* and the pixel sensor 1802*d*.

Each source-follower transistor 1812 may be associated with and may control two or more pixel sensors 1802. This reduces the overall quantity of source-follower transistors 1812 in the pixel sensor configuration 1800, which permits the pixel sensors 1802 to be more closely spaced and permits a greater quantity of pixel sensors 1802 to be included in the pixel sensor configuration 1800. For example, the source-follower transistor 1812*a* may be located between, and may control, the pixel sensor 1802*a* and the pixel sensor 1802*c*. As another example, the source-follower transistor 1812*b* may be located between, and may control, the pixel sensor 1802*b* and the pixel sensor 1802*d*. In some implementations, the source-follower transistor 1812*a* is located between, and may control, the pixel sensor 1802*a* and the pixel sensor 1802*b*, and the source-follower transistor 1812*b* is be located between, and may control, the pixel sensor 1802*c* and the pixel sensor 1802*d*.

In addition, a reset transistor 1810 and a source-follower transistor 1812 may be configured to control the pixel sensor 1802*e*, which further reduces the quantity of reset transistors 1810 and the quantity of source-follower transistors 1812 included in the pixel sensor configuration 1800. As an example, the reset transistor 1810*b* adjacent to the pixel sensor 1802*e* may be configured to control the pixel sensor 1802*e*, and the source-follower transistor 1812*a* adjacent to the pixel sensor 1802*e* may be configured to control the pixel sensor 1802*e*. As another example, the reset transistor 1810*a* and the source-follower transistor 1812*a* may each be configured to control the pixel sensor 1802*e*. As another example, the reset transistor 1810*b* and the source-follower transistor 1812*b* may each be configured to control the pixel sensor 1802*e*. As another example, the reset transistor 1810*a* and the source-follower transistor 1812*b* may each be configured to control the pixel sensor 1802*e*.

As indicated above, FIG. 18 is provided as an example. Other examples may differ from what is described with regard to FIG. 18.

Figure 19:
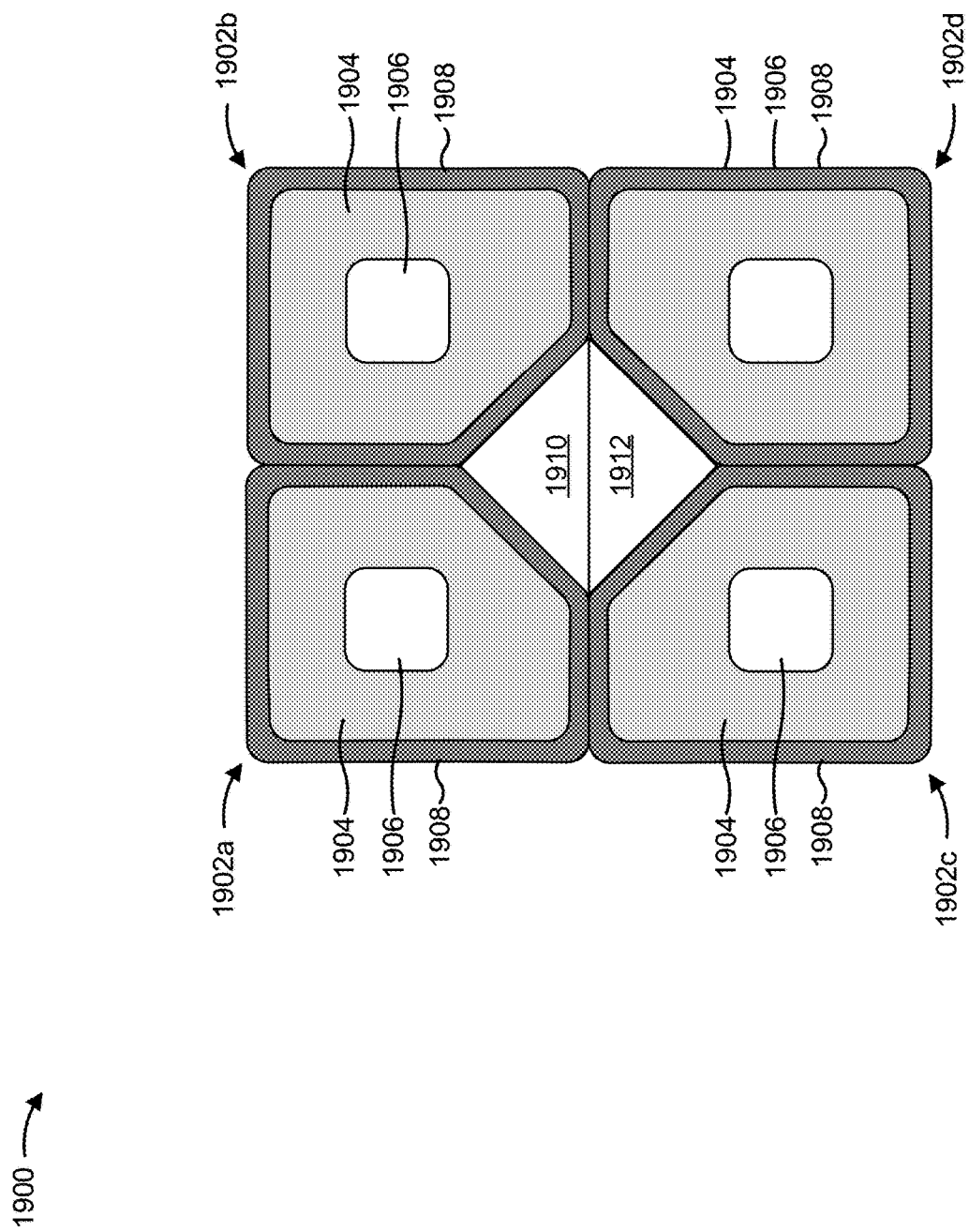

FIG. 19 is a diagram of example pixel sensor configuration 1900 described herein. FIG. 19 may include a top-down view of the pixel sensor configuration 1900. The pixel sensor configuration 1900 may include a plurality of pixel sensors 1902, such as a pixel sensor 1902*a*, a pixel sensor 1902*b*, a pixel sensor 1902*c*, a pixel sensor 1902*d*, and so on. The pixel sensor configuration 1900 may include a single reset transistor and a single source-follower transistor, both located in between the pixel sensors 1902, which further reduces the overall quantity of reset transistors and the overall quantity of source-follower transistors in the pixel sensor configuration 1900. In some implementations, the pixel sensors 1902 are included in a pixel array of an image sensor, such as a CMOS image sensor, a BSI CMOS image sensor, or another type of image sensor.

As shown in FIG. 19, the pixel sensors 1902 may be arranged in a grid in the pixel sensor configuration 1900. The pixel sensor 1902*a* may be adjacent to the pixel sensor 1902*b* and the pixel sensor 1902*c*, the pixel sensor 1902*b* may be adjacent to the pixel sensor 1902*a* and the pixel sensor 1902*d*, the pixel sensor 1902*c* may be adjacent to the pixel sensor 1902*a* and the pixel sensor 1902*d*, and the pixel sensor 1902*d* may be adjacent to the pixel sensor 1902*b* and the pixel sensor 1902*c*.

Each pixel sensor 1902 may include a photodiode region 1904, a floating diffusion region 1906, and a poly gate region 1908. The floating diffusion region 1906 may be positioned over the photodiode region 1904 such that the floating diffusion region 1906 and the photodiode region 1904 are stacked and/or vertically arranged. The pixel sensors 1902 may include a combination and arrangement of components and/or structures as one or more other pixel sensors described herein, such as the pixel sensor 400, 600, and/or 800-1600.

The pixel sensors 1902 may include non-symmetrical shaped (or irregular shaped) pixel sensors to permit a reset transistor 1910 and a source-follower transistor 1912 to be included in between the pixel sensors 1902. In this way, the reset transistor 1910 and the source-follower transistor 1912 may be tightly arranged in between the pixel sensors 1902, and other pixel sensors may be positioned adjacent to the pixel sensors 1902 without affecting the size and/or shape of the other pixel sensors. As shown in FIG. 19, the pixel sensors 1902 may each be pseudo-square-shaped or square-shaped except that an inner corner of each pixel sensor 1902 is reduced to provide an area in which the reset transistor 1910 or the source-follower transistor 1912 may be included. Each of the reset transistor 1910 and the source-follower transistor 1912 are illustrated as including a triangle shape, however, the reset transistor 1910 and the source-follower transistor 1912 may be configured as other shapes. Each of the reset transistor 1910 and the source-follower transistor 1912 may control the pixel sensors 1902.

As indicated above, FIG. 19 is provided as an example. Other examples may differ from what is described with regard to FIG. 19.

Figure 20:
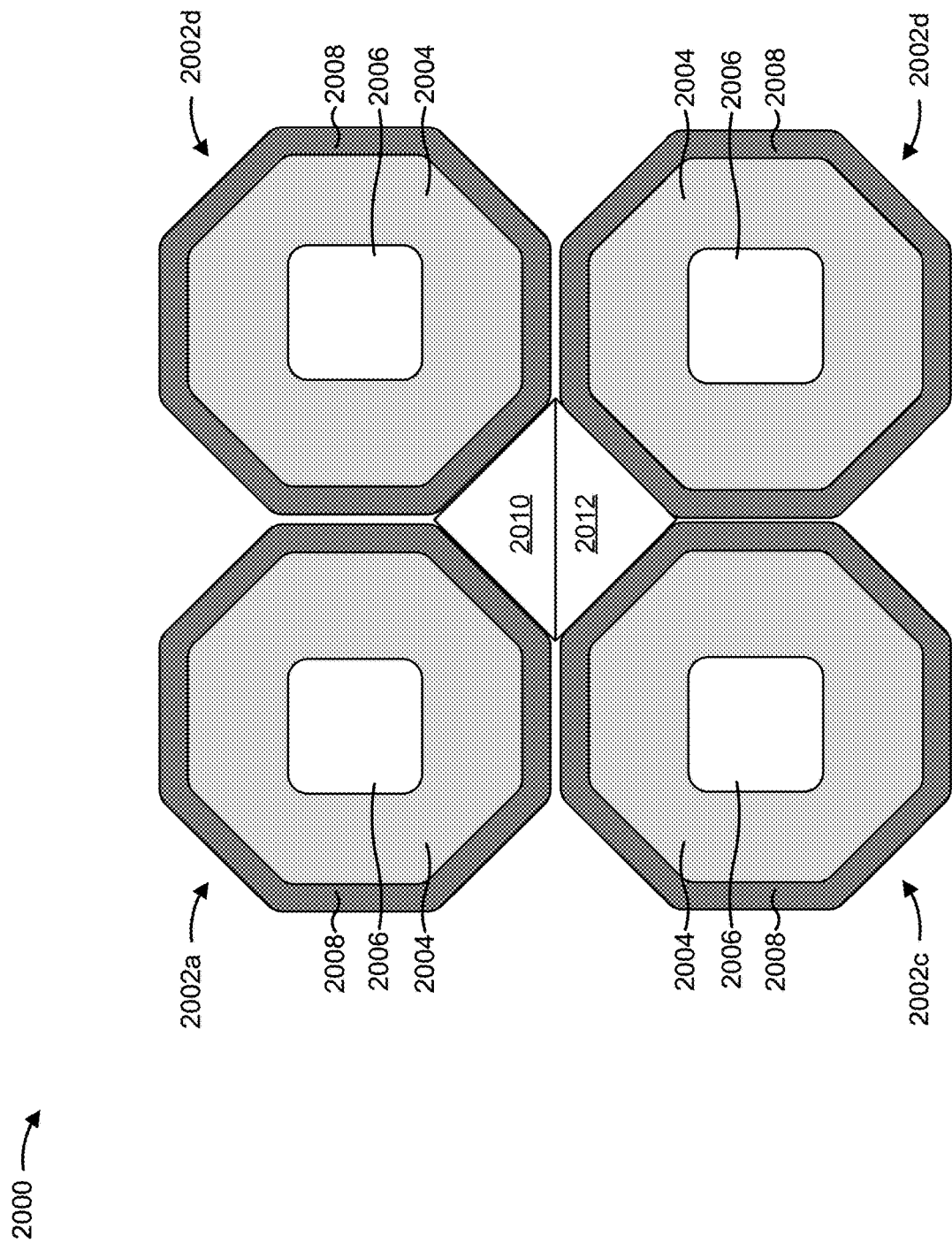

FIG. 20 is a diagram of example pixel sensor configuration 2000 described herein. FIG. 20 may include a top-down view of the pixel sensor configuration 2000. The pixel sensor configuration 2000 may include a plurality of pixel sensors 2002, such as a pixel sensor 2002*a*, a pixel sensor 2002*b*, a pixel sensor 2002*c*, a pixel sensor 2002*d*, and so on. In some implementations, the pixel sensors 2002 are configured as octagon-shaped pixel sensors 302 included in the pixel array 300. Moreover, the pixel sensor configuration 2000 may include a single reset transistor and a single source-follower transistor, both located in between the pixel sensors 2002, which further reduces the overall quantity of reset transistors and the overall quantity of source-follower transistors in the pixel sensor configuration 2000. The octagon shape of the pixel sensors 2002 permits the reset transistor and the source-follower transistor to be included between the pixel sensors 2002 without affecting the size or shape of the pixel sensors 2002. The octagon shape of the pixel sensors 2002 permit the reset transistor and the source-follower transistor to be included between additional pixel sensors in the pixel sensor configuration 2000.

As shown in FIG. 20, the pixel sensor 2002*a* may be adjacent to the pixel sensor 2002*b* and the pixel sensor 2002*c*. The pixel sensor 2002*b* may be adjacent to the pixel sensor 2002*a* and the pixel sensor 2002*d*. The pixel sensor 2002*c* may be adjacent to the pixel sensor 2002*a* and the pixel sensor 2002*d*. The pixel sensor 2002*d* may be adjacent to the pixel sensor 2002*b* and the pixel sensor 2002*c*.

Each pixel sensor 2002 may include a photodiode region 2004, a floating diffusion region 2006, and a poly gate region 2008. The floating diffusion region 2006 may be positioned over the photodiode region 2004 such that the floating diffusion region 2006 and the photodiode region 2004 are stacked and/or vertically arranged. The pixel sensors 2002 may include a combination and arrangement of components and/or structures as one or more other pixel sensors described herein, such as the pixel sensor 400, 600, and/or 800-1600.

As shown in FIG. 20, the pixel sensor configuration 2000 may include a single reset transistor 2010 and single source-follower transistor 2012 between the pixel sensors 2002. The reset transistor 2010 and the source-follower transistor 2012 may each be configured to control the pixel sensors 2002. This reduces the overall quantity of reset transistors 2010 and source-follower transistors 2012 in the pixel sensor configuration 2000, which permits the pixel sensors 2002 to be more closely spaced and permits a greater quantity of pixel sensors 2002 to be included in the pixel sensor configuration 2000.

As indicated above, FIG. 20 is provided as an example. Other examples may differ from what is described with regard to FIG. 20.

Figure 21:
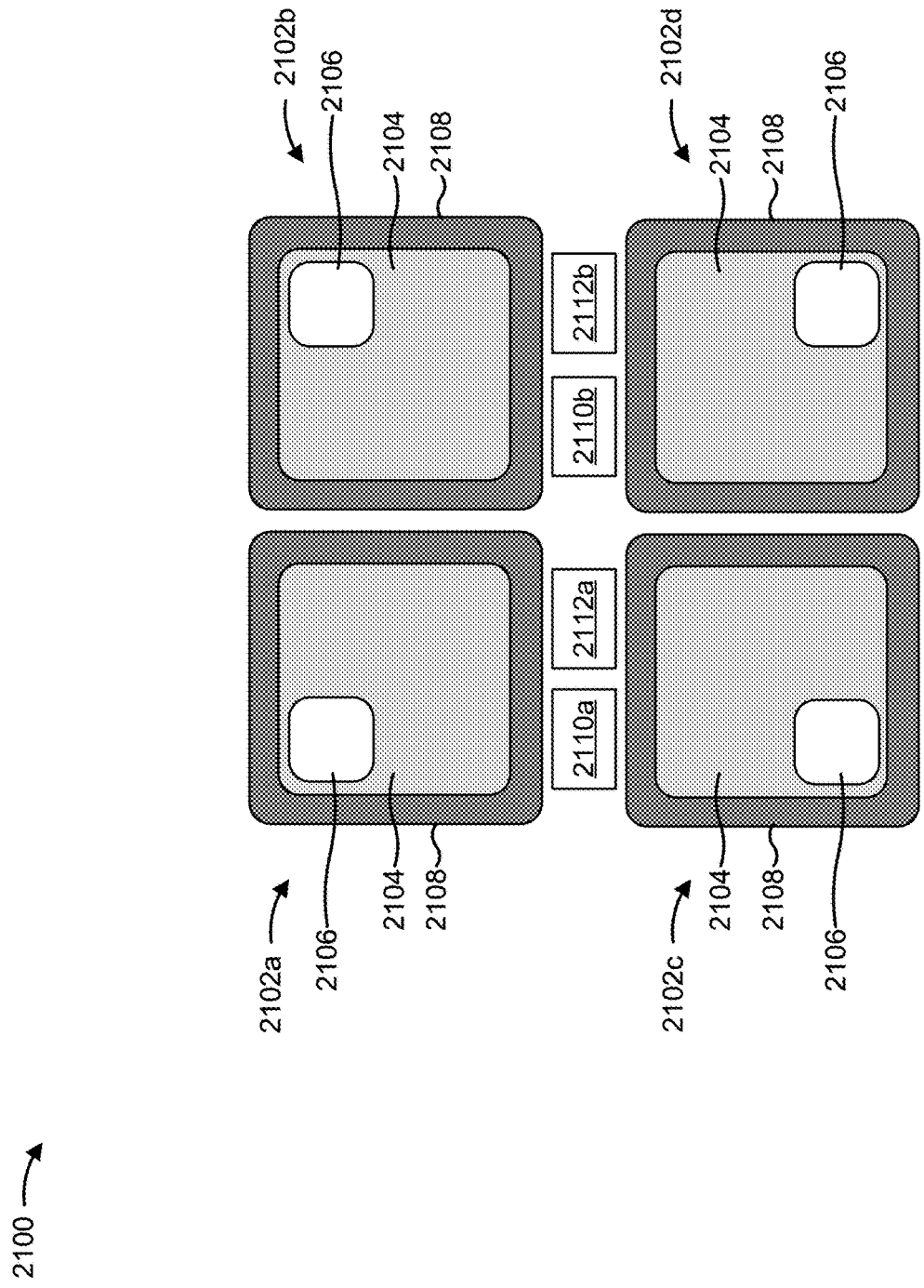

FIG. 21 is a diagram of example pixel sensor configuration 2100 described herein. FIG. 21 may include a top-down view of the pixel sensor configuration 2100. The pixel sensor configuration 2100 may include a similar arrangement of pixel sensors as the pixel sensor configuration 1700, except that the floating diffusion regions of the pixel sensors included in the pixel sensor configuration 2100 are offset or off-centered relative to the photodiode regions of the pixel sensors included in the pixel sensor configuration 2100. In some implementations, the floating diffusion regions may be off-centered relative to the photodiode regions in implementations where an obstruction or another structure is located over the center of the photodiode regions. In this way, the floating diffusion regions may be positioned such that the floating diffusion regions do not interfere with other structures located over the center of the photodiode regions.

The pixel sensor configuration 2100 may include a plurality of pixel sensors 2102, such as a pixel sensor 2102a, a pixel sensor 2102b, a pixel sensor 2102c, a pixel sensor 2102d, and so on. In some implementations, the more of the pixel sensors 2102 are configured as square-shaped pixel sensors 202 included in the pixel array 200. In some implementations, the pixel sensors 2102 may be included in an image sensor. The image sensor may be a CMOS image sensor, a BSI CMOS image sensor, or another type of image sensor.

As shown in FIG. 21, the pixel sensors 2102 may be arranged in a grid in the pixel sensor configuration 2100. The pixel sensor 2102a may be adjacent to the pixel sensor 2102b and the pixel sensor 2102c, the pixel sensor 2102b may be adjacent to the pixel sensor 2102a and the pixel sensor 2102d, the pixel sensor 2102c may be adjacent to the pixel sensor 2102a and the pixel sensor 2102d, and the pixel sensor 2102d may be adjacent to the pixel sensor 2102b and the pixel sensor 2102c.

Each pixel sensor 2102 may include a photodiode region 2104, a floating diffusion region 2106, and a poly gate region 2108. The floating diffusion region 2106 may be positioned over the photodiode region 2104 such that the floating diffusion region 2106 and the photodiode region 2104 are stacked and/or vertically arranged. Moreover, the floating diffusion region 2106 may be positioned off-center relative to the center of the photodiode region 2104, as described above and/or in other ways. The pixel sensors 2102 may include a combination and arrangement of components and/or structures as one or more other pixel sensors described herein, such as the pixel sensor 400, 600, and/or 800-1600.

As shown in FIG. 21, the pixel sensor configuration 2100 may include a plurality of reset transistors 2110 (e.g., a reset transistor 2110a and a reset transistor 2110b) and a plurality of source-follower transistors 2112 (e.g., a source-follower transistor 2112a and a source-follower transistor 2112b). A reset transistor 2110 may be activated to set the drain region of a pixel sensor 2102 to a particular voltage prior to transferring a photocurrent from the photodiode region of the pixel sensor 2102. A source-follower transistor 2112 may convert a photocurrent from a drain region of a pixel sensor 2102 to a voltage.

Each reset transistor 2110 may be associated with and may control two or more pixel sensors 2102. This reduces the overall quantity of reset transistors 2110 in the pixel sensor configuration 2100, which permits the pixel sensors 2102 to be more closely spaced and permits a greater quantity of pixel sensors 2102 to be included in the pixel sensor configuration 2100. For example, the reset transistor 2110a may be located between, and may control, the pixel sensor 2102a and the pixel sensor 2102c. As another example, the reset transistor 2110b may be located between, and may control, the pixel sensor 2102b and the pixel sensor 2102d. In some implementations, the reset transistor 2110a is located between, and may control, the pixel sensor 2102a and the pixel sensor 2102b, and the reset transistor 2110b is be located between, and may control, the pixel sensor 2102c and the pixel sensor 2102d.

Each source-follower transistor 2112 may be associated with and may control two or more pixel sensors 2102. This reduces the overall quantity of source-follower transistors 2112 in the pixel sensor configuration 2100, which permits the pixel sensors 2102 to be more closely spaced and permits a greater quantity of pixel sensors 2102 to be included in the pixel sensor configuration 2100. For example, the source-follower transistor 2112a may be located between, and may control, the pixel sensor 2102a and the pixel sensor 2102c. As another example, the source-follower transistor 2112b may be located between, and may control, the pixel sensor 2102b and the pixel sensor 2102d. In some implementations, the source-follower transistor 2112a is located between, and may control, the pixel sensor 2102a and the pixel sensor 2102b, and the source-follower transistor 2112b is be located between, and may control, the pixel sensor 2102c and the pixel sensor 2102d.

As indicated above, FIG. 21 is provided as an example. Other examples may differ from what is described with regard to FIG. 21.

Figure 22:
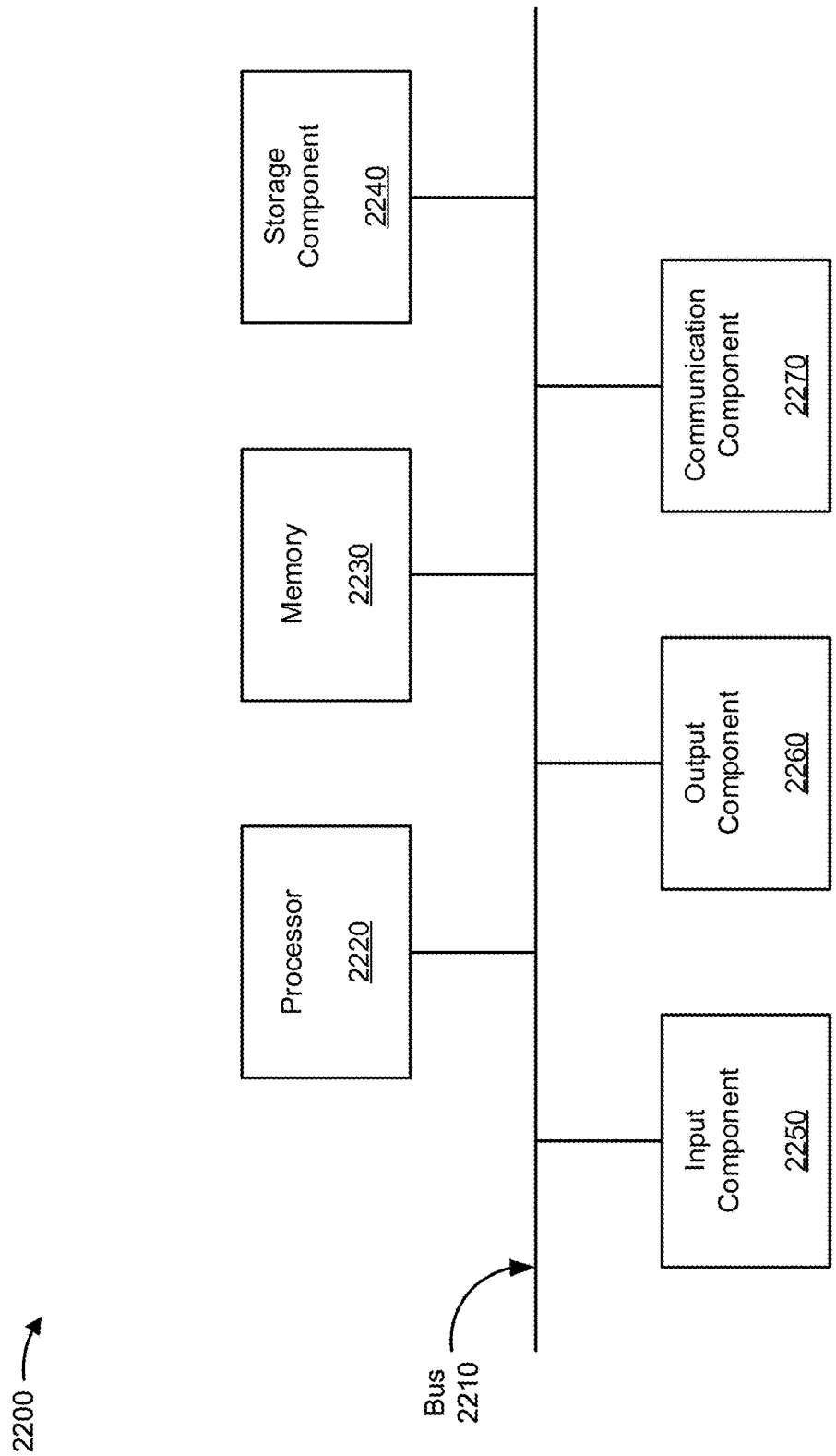
FIG. 22 is a diagram of example components of one or more devices of FIG. 1.

FIG. 22 is a diagram of example components of a device 2200. In some implementations, one or more of the semiconductor processing tools 102-114 and/or wafer/die transport tool 116 may include one or more devices 2200 and/or one or more components of device 2200. As shown in FIG. 22, device 2200 may include a bus 2210, a processor 2220, a memory 2230, a storage component 2240, an input component 2250, an output component 2260, and a communication component 2270.

Bus 2210 includes a component that enables wired and/or wireless communication among the components of device 2200. Processor 2220 includes a central processing unit, a graphics processing unit, a microprocessor, a controller, a microcontroller, a digital signal processor, a field-programmable gate array, an application-specific integrated circuit, and/or another type of processing component. Processor 2220 is implemented in hardware, firmware, or a combination of hardware and software. In some implementations, processor 2220 includes one or more processors capable of being programmed to perform a function. Memory 2230 includes a random access memory, a read only memory, and/or another type of memory (e.g., a flash memory, a magnetic memory, and/or an optical memory).

Storage component 2240 stores information and/or software related to the operation of device 2200. For example, storage component 2240 may include a hard disk drive, a magnetic disk drive, an optical disk drive, a solid state disk drive, a compact disc, a digital versatile disc, and/or another type of non-transitory computer-readable medium. Input component 2250 enables device 2200 to receive input, such as user input and/or sensed inputs. For example, input component 2250 may include a touch screen, a keyboard, a keypad, a mouse, a button, a microphone, a switch, a sensor, a global positioning system component, an accelerometer, a gyroscope, and/or an actuator. Output component 2260 enables device 2200 to provide output, such as via a display, a speaker, and/or one or more light-emitting diodes. Communication component 2270 enables device 2200 to communicate with other devices, such as via a wired connection and/or a wireless connection. For example, communication component 2270 may include a receiver, a transmitter, a transceiver, a modem, a network interface card, and/or an antenna.

Device 2200 may perform one or more processes described herein. For example, a non-transitory computer-readable medium (e.g., memory 2230 and/or storage component 2240) may store a set of instructions (e.g., one or more instructions, code, software code, and/or program code) for execution by processor 2220. Processor 2220 may execute the set of instructions to perform one or more processes described herein. In some implementations, execution of the set of instructions, by one or more processors 2220, causes the one or more processors 2220 and/or the device 2200 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 22 are provided as an example. Device 2200 may include additional components, fewer components, different components, or differently arranged components than those shown in FIG. 22. Additionally, or alternatively, a set of components (e.g., one or more components) of device 2200 may perform one or more functions described as being performed by another set of components of device 2200.

Figure 23:
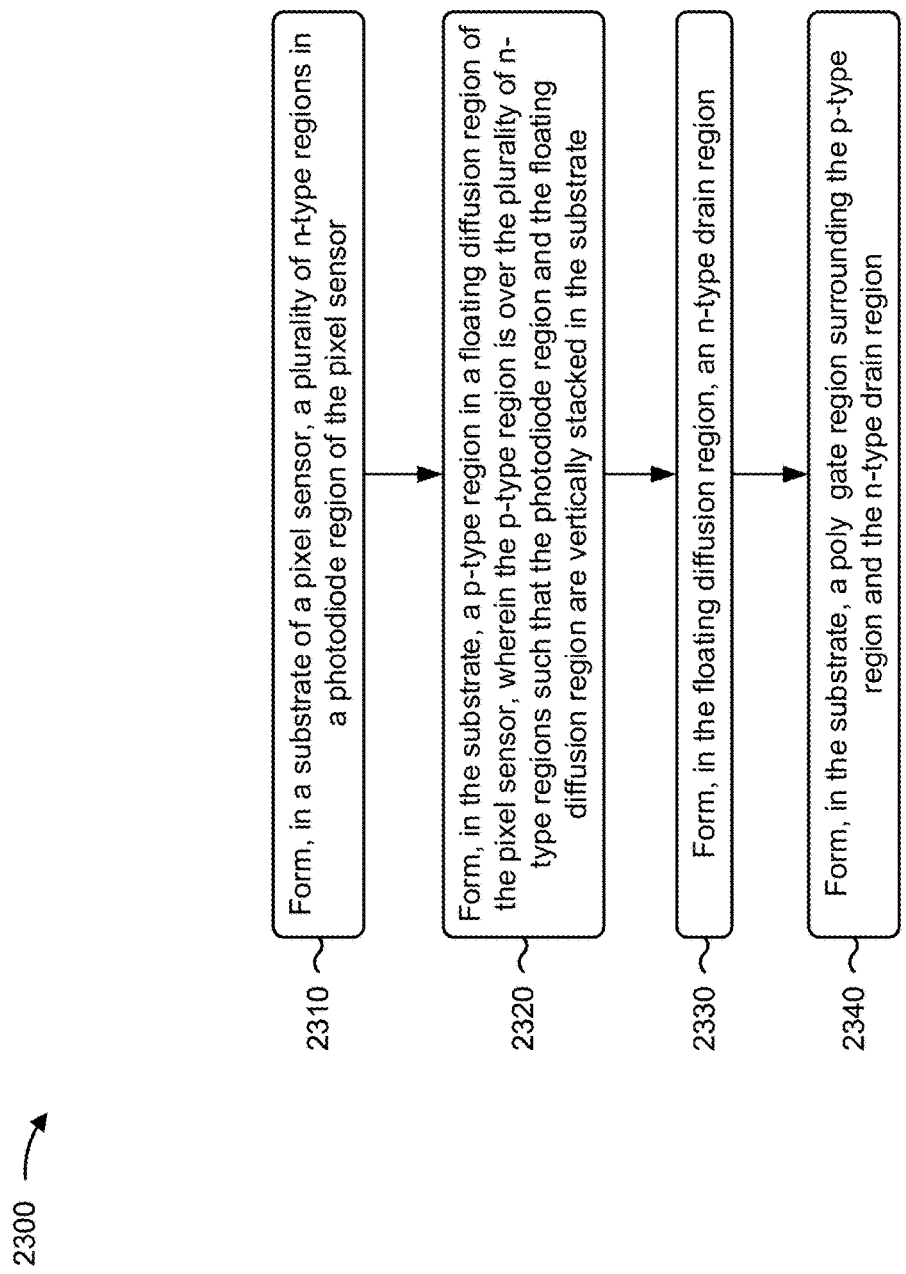
FIG. 23 is a flowchart of an example process relating to forming a pixel sensor.

FIG. 23 is a flowchart of an example process 2300 associated with forming a pixel sensor. In some implementations, one or more process blocks of FIG. 23 may be performed by one or more semiconductor processing tools (e.g., one or more of the semiconductor processing tools 102-114). Additionally, or alternatively, one or more process blocks of FIG. 23 may be performed by one or more components of device 2200, such as processor 2220, memory 2230, storage component 2240, input component 2250, output component 2260, and/or communication component 2270.

As shown in FIG. 23, process 2300 may include forming, in a substrate of a pixel sensor, a plurality of n-type regions in a photodiode region of the pixel sensor (block 2310). For example, the one or more semiconductor processing tools 102-114 may form, in a substrate (e.g., substrate 402, 602, and/or 802-1602) of a pixel sensor (e.g., pixel sensor 202, 302, 304, 400, 600, 800-1600, and/or 1702-2102), a plurality of n-type regions (e.g., n-type regions 410, 610, and/or 810-1610) in a photodiode region (e.g., photodiode region 404, 604, and/or 804-2104) of the pixel sensor, as described above.

As further shown in FIG. 23, process 2300 may include forming, in the substrate, a p-type region in a floating diffusion region of the pixel sensor, where the p-type region is over the plurality of n-type regions such that the photodiode region and the floating diffusion region are vertically stacked in the substrate (block 2320). For example, the one or more semiconductor processing tools 102-114 may form, in the substrate, a p-type region (e.g., p-type region 420, 620, and/or 820-1620) in a floating diffusion region (e.g., floating diffusion region 406, 606, and/or 806-2106) of the pixel sensor, as described above. In some implementations, the p-type region is over the plurality of n-type regions such that the photodiode region and the floating diffusion region are vertically stacked in the substrate.

As further shown in FIG. 23, process 2300 may include forming, in the floating diffusion region, an n-type drain region (block 2330). For example, the one or more semiconductor processing tool may form, in the floating diffusion region, an n-type drain region (e.g., drain region 418, 618, and/or 818-1618), as described above.

As further shown in FIG. 23, process 2300 may include forming, in the substrate, a poly gate region surrounding the p-type region and the n-type drain region (block 2340). For example, the one or more semiconductor processing tool may form, in the substrate, a poly gate region (e.g., the poly gate region 416, 616, 816-1616, and/or 1708-2108) surrounding the p-type region and the n-type drain region, as described above.

Process 2300 may include additional implementations, such as any single implementation or any combination of implementations described below and/or in connection with one or more other processes described elsewhere herein.

In a first implementation, process 2300 includes forming one or more extension regions (e.g., extension regions 422, 622, and/or 822-1622) adjacent to the drain region in the floating diffusion region. In a second implementation, alone or in combination with the first implementation, process 2300 includes forming, in the substrate, a DTI structure (e.g., DTI structure 412, 612, and/or 812-1612) around the photodiode region. In a third implementation, alone or in combination with one or more of the first and second implementations, process 2300 includes filling the DTI structure with material from the poly gate region. In a fourth implementation, alone or in combination with one or more of the first through third implementations, process 2300 includes forming a dielectric layer (e.g., dielectric layer 430, 630, and/or 830-1630) over the poly gate region and over the floating diffusion region, forming a first contact plug (e.g., contact plug 426, 626, and/or 826-1626) in the dielectric layer over the poly gate region, and forming a second contact plug (e.g., contact plug 428, 628, and/or 828-1628) in the dielectric layer over the floating diffusion region and over the photodiode region.

In a fifth implementation, alone or in combination with one or more of the first through fourth implementations, forming the plurality of n-type regions includes forming a first n-type region (e.g., n-type region 410c, 610c, and/or 810c-1610c) of the plurality of n-type regions, forming a second n-type region (e.g., n-type region 410b, 610b, and/or 810b-1610b) of the plurality of n-type regions above the first n-type region, and forming a third n-type region (e.g., n-type region 410a, 610a, and/or 810a-1610a) of the plurality of n-type regions above the second n-type region, where the first n-type region, the second n-type region, and the third n-type region each includes a different n-type doping concentration. In a sixth implementation, alone or in combination with one or more of the first through fifth implementations, process 2300 includes forming an isolation structure (e.g., isolation structure 640 and/or 840-1640) in the substrate below the photodiode region, forming a plurality of high absorption regions (e.g., high absorption regions 642 and/or 842-1642) in the substrate between the isolation structure, and filling the isolation structure and the plurality of high absorption regions with an oxide layer (e.g., oxide layer 644 and/or 844-1644).

Although FIG. 23 shows example blocks of process 2300, in some implementations, process 2300 may include additional blocks, fewer blocks, different blocks, or differently arranged blocks than those depicted in FIG. 23. Additionally, or alternatively, two or more of the blocks of process 2300 may be performed in parallel.

In this way, a pixel sensor may include a vertically arranged (or vertically stacked) photodiode region and floating diffusion region. The vertical arrangement permits the photodiode region to occupy a larger area of a pixel sensor of a given size relative to a horizontal arrangement, which increases the area in which the photodiode region can collect photons. This increases performance of the pixel sensor and permits the overall size of the pixel sensor to be reduced. Moreover, the transfer gate may surround at least a portion of the floating diffusion region and the photodiode region, which provides a larger gate switching area relative to a horizontal arrangement. The increased gate switching area may provide greater control over the transfer of the photocurrent and/or may reduce switching delay for the pixel sensor.

As described in greater detail above, some implementations described herein provide a pixel sensor. The pixel sensor includes a photodiode region. The pixel sensor includes a floating diffusion region over the photodiode region. The pixel sensor includes a poly gate region surrounding the floating diffusion region.

As described in greater detail above, some implementations described herein provide a method. The method includes forming, in a substrate of a pixel sensor, a plurality of n-type regions in a photodiode region of the pixel sensor. The method includes forming, in the substrate, a p-type region in a floating diffusion region of the pixel sensor, where the p-type region is over the plurality of n-type regions such that the photodiode region and the floating diffusion region are vertically stacked in the substrate. The method includes forming, in the floating diffusion region, an n-type drain region. The method includes forming, in the substrate, a poly gate region surrounding the p-type region and the n-type drain region.

As described in greater detail above, some implementations described herein provide a pixel array. The pixel array includes a plurality of pixel sensors, each including, a photodiode region a floating diffusion region over the photodiode region a poly gate region surrounding the floating diffusion region. The pixel array includes a reset transistor adjacent to at least one pair of the plurality of pixel sensors. The pixel array includes a source-follower transistor adjacent to the at least one pair of the plurality of pixel sensors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pixel sensor, comprising:
a photodiode region comprising a plurality of n-type regions;
a floating diffusion region in a first portion of a substrate over the photodiode region,
wherein the floating diffusion region is physically separated from the photodiode region by a second portion of the substrate, and
wherein the floating diffusion region comprises:
a p-type region over the plurality of n-type regions such that the photodiode region and the floating diffusion region are vertically stacked in the substrate, and
an n-type drain region in the p-type region in the floating diffusion region such that that the p-type region and the n-type region in the floating diffusion region are vertically stacked; and
a poly gate region surrounding the p-type region and the n-type drain region in the floating diffusion region.

2. The pixel sensor of claim 1, further comprising:
a deep trench isolation (DTI) structure surrounding the photodiode region.

3. The pixel sensor of claim 2, wherein a width of the poly gate region is approximately equal to a width of the DTI structure.

4. The pixel sensor of claim 1, wherein the photodiode region further comprises:
a p-type region above the plurality of n-type regions.

5. The pixel sensor of claim 1, wherein the photodiode region consists of the plurality of n-type regions.

6. The pixel sensor of claim 1, further comprising:
an isolation grid, below the photodiode region, configured to prevent optical crosstalk.

7. The pixel sensor of claim 6, wherein the isolation grid is offset relative to a deep trench isolation (DTI) structure surrounding the photodiode region; and
wherein the offset is equal to or less than approximately 250 nanometers.

8. A method, comprising:
forming, in a substrate of a pixel sensor, a plurality of n-type regions in a photodiode region of the pixel sensor;
forming, in a first portion of the substrate, a p-type region in a floating diffusion region of the pixel sensor,
wherein the p-type region, in the floating diffusion region, is formed over the plurality of n-type regions such that the photodiode region and the floating diffusion region are vertically stacked in the substrate, and
wherein the floating diffusion region is physically separated from the photodiode region by a second portion of the substrate;
forming, in the p-type region in the floating diffusion region, an n-type drain region such that the p-type region and the n-type region in the floating diffusion region are vertically stacked; and forming, in the substrate, a poly gate region surrounding the p-type region and the n-type drain region in the floating diffusion region.

9. The method of claim 8, further comprising:
forming one or more extension regions adjacent to the n-type drain region in the floating diffusion region.

10. The method of claim 8, further comprising:
forming, in the substrate, a deep trench isolation (DTI) structure around the photodiode region.

11. The method of claim 10, further comprising:
filling the DTI structure with material from the poly gate region.

12. The method of claim 8, further comprising:
forming a dielectric layer over the poly gate region and over the floating diffusion region;
forming a first contact plug in the dielectric layer over the poly gate region; and
forming a second contact plug in the dielectric layer over the floating diffusion region and over the photodiode region.

13. The method of claim 8, wherein forming the plurality of n-type regions comprises:
forming a first n-type region of the plurality of n-type regions;
forming a second n-type region of the plurality of n-type regions above the first n-type region; and
forming a third n-type region of the plurality of n-type regions above the second n-type region,
wherein the first n-type region, the second n-type region, and the third n-type region each includes a different n-type doping concentration.

14. The method of claim 8, further comprising:
forming an isolation structure in the substrate below the photodiode region;
forming a plurality of high absorption regions in the substrate between the isolation structure; and
filling the isolation structure and the plurality of high absorption regions with an oxide layer.

15. A pixel array, comprising:
a plurality of pixel sensors, each comprising:
a photodiode region comprising a plurality of n-type regions;
a floating diffusion region in a first portion of a substrate over the photodiode region,
wherein the floating diffusion region is physically separated from the photodiode region by a second portion of the substrate, and
wherein the floating diffusion region comprises:
a p-type region over the plurality of n-type regions such that the photodiode region and the floating diffusion region are vertically stacked in the substrate, and
an n-type drain region in the p-type region in the floating diffusion region such that that the p-type region and the n-type region in the floating diffusion region are vertically stacked; and
a poly gate region surrounding the p-type region and the n-type drain region in the floating diffusion region;
a reset transistor adjacent to at least one pair of the plurality of pixel sensors; and
a source-follower transistor adjacent to the at least one pair of the plurality of pixel sensors.

16. The pixel array of claim 15, wherein the reset transistor and the source-follower transistor are between a first pair of the plurality of pixel sensors; and
wherein another reset transistor and another source-follower transistor are between a second pair of the plurality of pixel sensors adjacent to the first pair.

17. The pixel array of claim 16, wherein the plurality of pixel sensors comprise a plurality of octagon-shaped pixel sensors; and
wherein the pixel array further comprises:
a square-shaped pixel sensor between the plurality of octagon-shaped pixel sensors.

18. The pixel array of claim 15, wherein the reset transistor and the source-follower transistor are between four of the plurality of pixel sensors, and
wherein the plurality of pixel sensors comprise non-symmetrical shaped pixel sensors or octagon-shaped pixel sensors.

19. The pixel array of claim 15, wherein a respective floating diffusion region of a pixel sensor, of the plurality of pixel sensors, is off-centered relative to a center of a respective photodiode region included in the pixel sensor.

20. The method of claim 8, wherein the n-type drain region in the floating diffusion region is formed to be vertically above the p-type region in the floating diffusion region.

* * * * *